(12) United States Patent
Shuto

(10) Patent No.: US 11,309,025 B2
(45) Date of Patent: Apr. 19, 2022

(54) SEMICONDUCTOR CIRCUIT AND SEMICONDUCTOR CIRCUIT SYSTEM TO SUPPRESS DISTURBANCE IN THE SEMICONDUCTOR CIRCUIT

(71) Applicant: SONY SEMICONDUCTOR SOLUTIONS CORPORATION, Kanagawa (JP)

(72) Inventor: Yusuke Shuto, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/768,880

(22) PCT Filed: Nov. 29, 2018

(86) PCT No.: PCT/JP2018/044033
§ 371 (c)(1),
(2) Date: Jun. 1, 2020

(87) PCT Pub. No.: WO2019/116915
PCT Pub. Date: Jun. 20, 2019

(65) Prior Publication Data
US 2021/0166760 A1  Jun. 3, 2021

(30) Foreign Application Priority Data

Dec. 12, 2017 (JP) .............................. JP2017-237980

(51) Int. Cl.
*G11C 14/00* (2006.01)
(52) U.S. Cl.
CPC ........ *G11C 14/0081* (2013.01); *G11C 14/009* (2013.01); *G11C 14/0072* (2013.01)

(58) Field of Classification Search
CPC ... G11C 11/41; G11C 11/412; G11C 11/4125; G11C 14/0054; G11C 14/0081
See application file for complete search history.

(56) References Cited

U.S. PATENT DOCUMENTS 8,295,079 B2 * 10/2012 Yamamoto ......... G11C 14/0081
365/154
2004/0125660 A1 * 7/2004 Ooishi ............. H03K 19/17752
365/189.05

(Continued)

FOREIGN PATENT DOCUMENTS

CN        108701477 A    10/2018
JP       2013-030240 A    2/2013

(Continued)

OTHER PUBLICATIONS

International Search Report and Written Opinion of PCT Application No. PCT/JP2018/044033, dated Feb. 5, 2019, 06 pages of ISRWO.

*Primary Examiner* — Alfredo Bermudez Lozada
(74) *Attorney, Agent, or Firm* — Chip Law Group

(57) ABSTRACT

A semiconductor circuit includes a first circuit that applies an inverted voltage of a voltage at a first node to a second node, a second circuit that applies an inverted voltage of a voltage at the second node to the first node, a first transistor that couples the first node to a third node, and a first memory element having a first terminal coupled to the third node and a second terminal to which a control voltage is to be applied. The semiconductor circuit further includes a second transistor having a drain coupled to the third node and a gate coupled to one of the first node or the second node, a third transistor having a drain coupled to the third node and a gate coupled to the other of the first node or the second node, and a driver.

30 Claims, 55 Drawing Sheets

(56) References Cited

U.S. PATENT DOCUMENTS

| | | | | |
|---|---|---|---|---|
| 2014/0003177 A1* | 1/2014 | In Chul | ............... | G11C 11/4091 |
| | | | | 365/207 |
| 2014/0013036 A1* | 1/2014 | Kwon | ................... | G06F 9/4401 |
| | | | | 711/103 |

FOREIGN PATENT DOCUMENTS

| | | |
|---|---|---|
| JP | 2013-030249 A | 2/2013 |
| JP | 2013-125567 A | 6/2013 |
| JP | 2014-194834 A | 10/2014 |
| JP | 2016-018573 A | 2/2016 |
| JP | 2017-208146 A | 11/2017 |
| KR | 10-2018-0115268 A | 10/2018 |
| TW | 201812772 A | 4/2018 |
| WO | 2009/028298 A1 | 3/2009 |
| WO | 2017/150028 A1 | 9/2017 |
| WO | 2017/199677 A1 | 11/2017 |

\* cited by examiner

[FIG. 1]
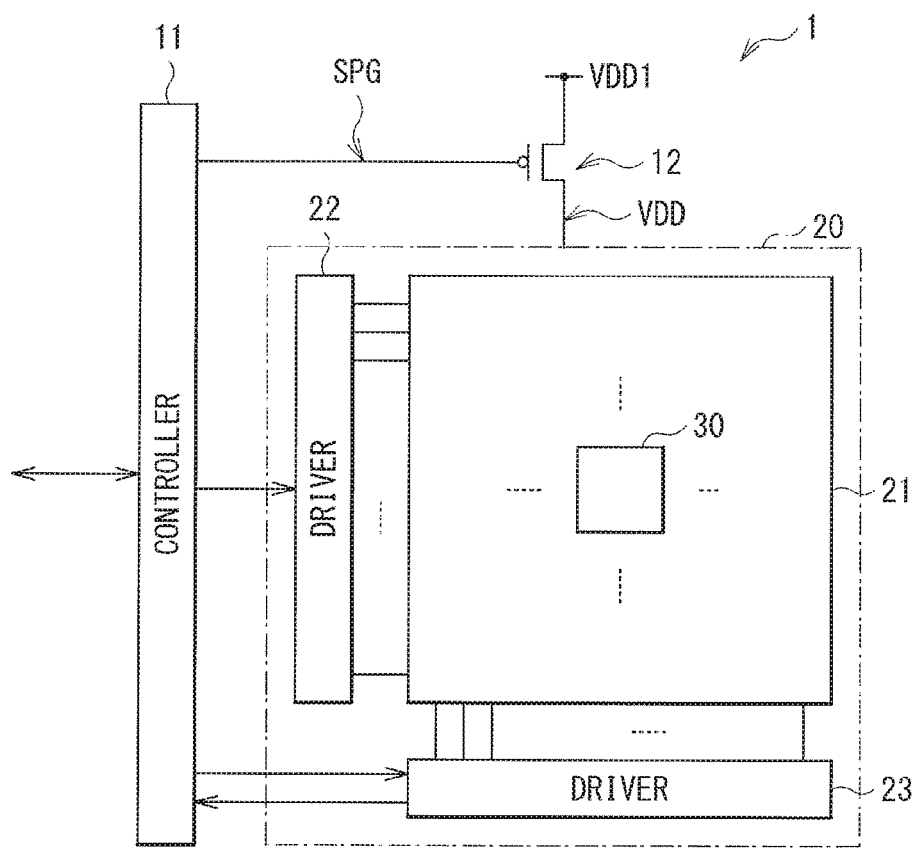

[FIG. 2]
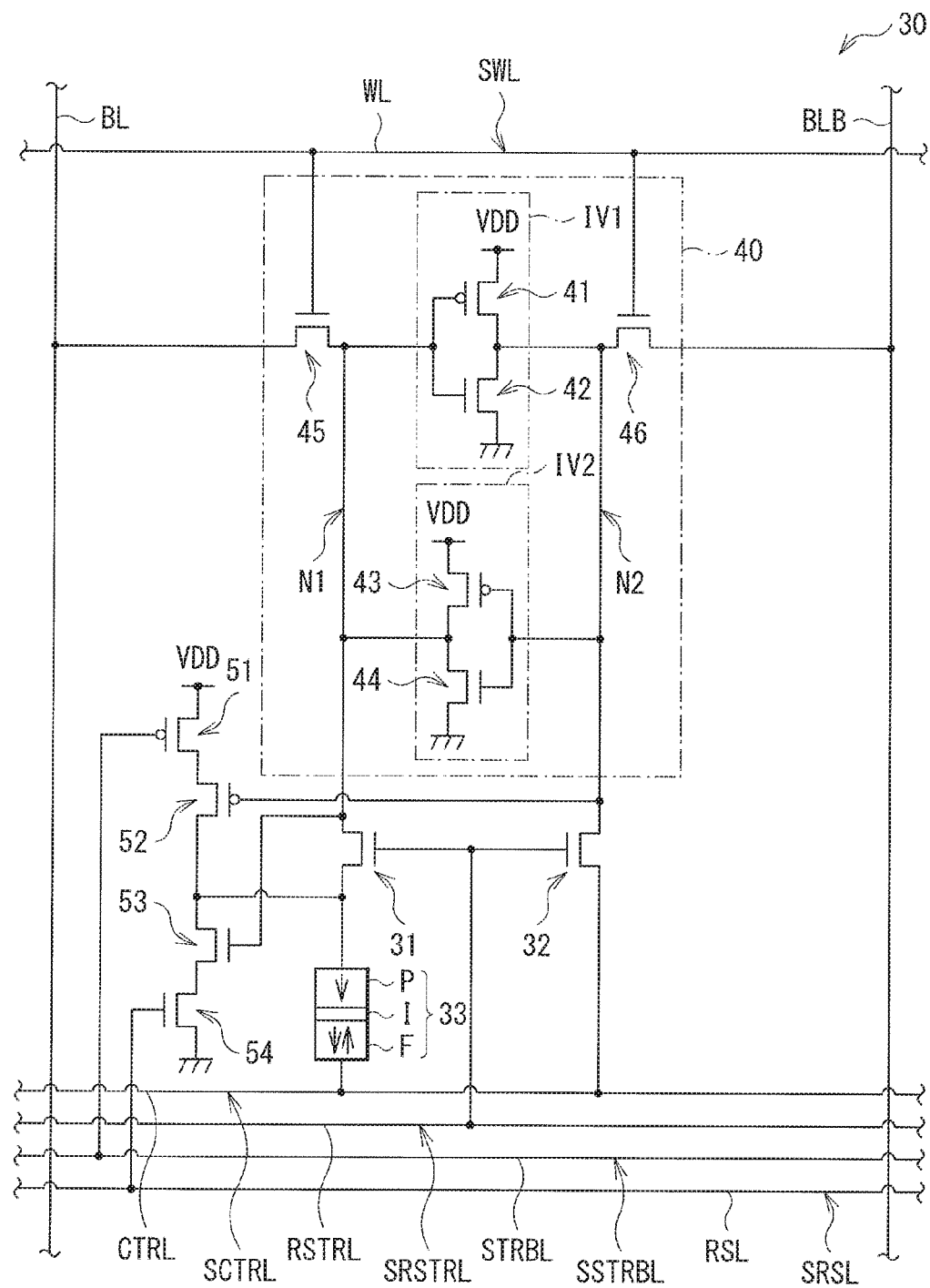

[FIG. 3]
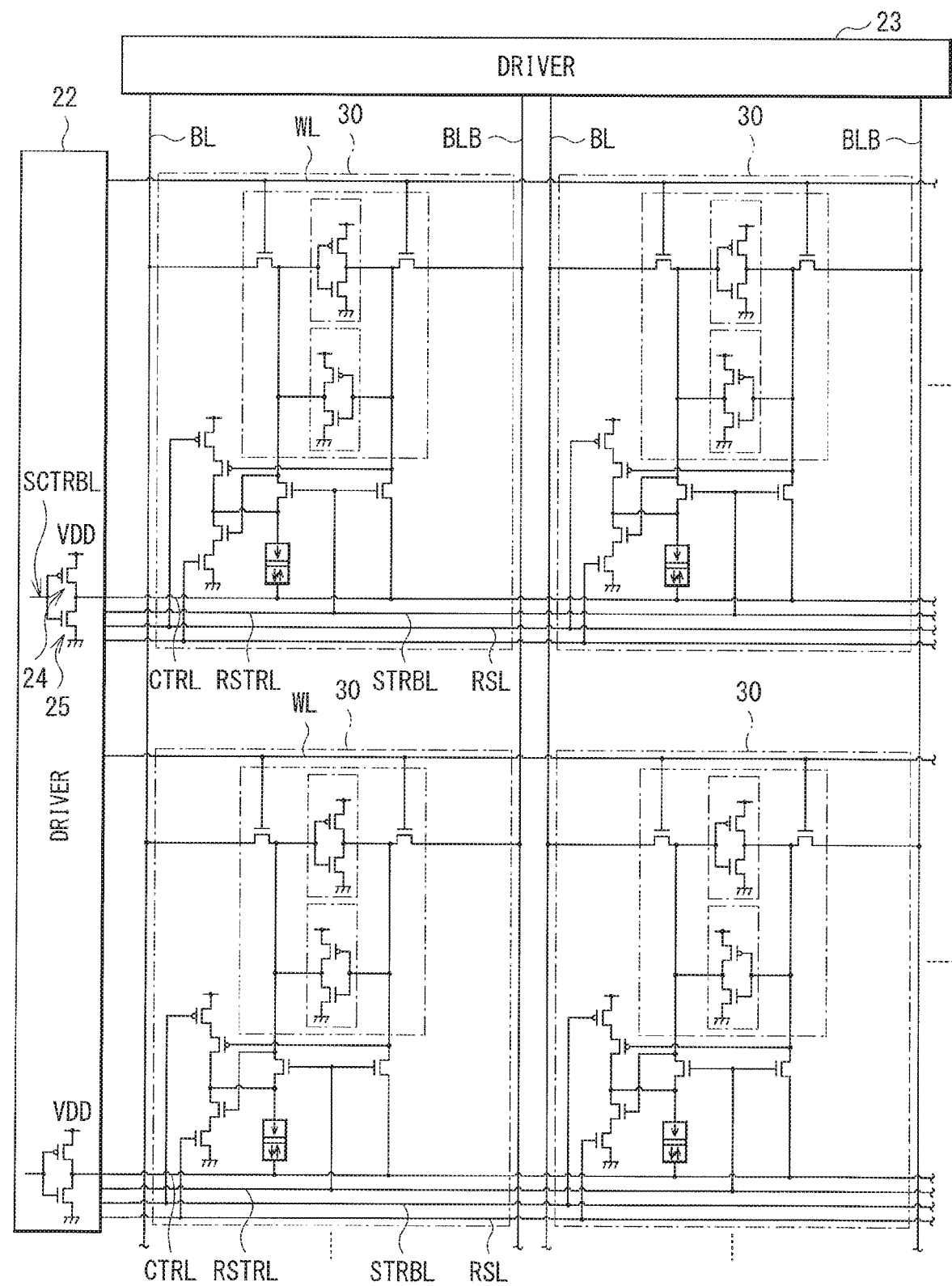

[FIG. 4]
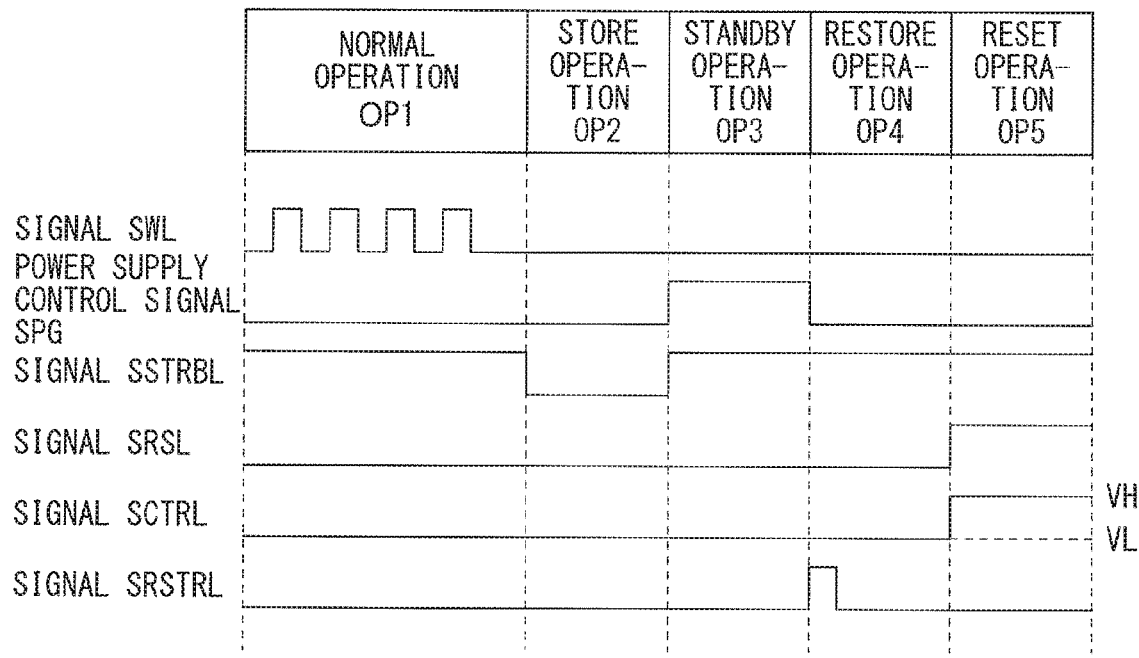
[FIG. 5]
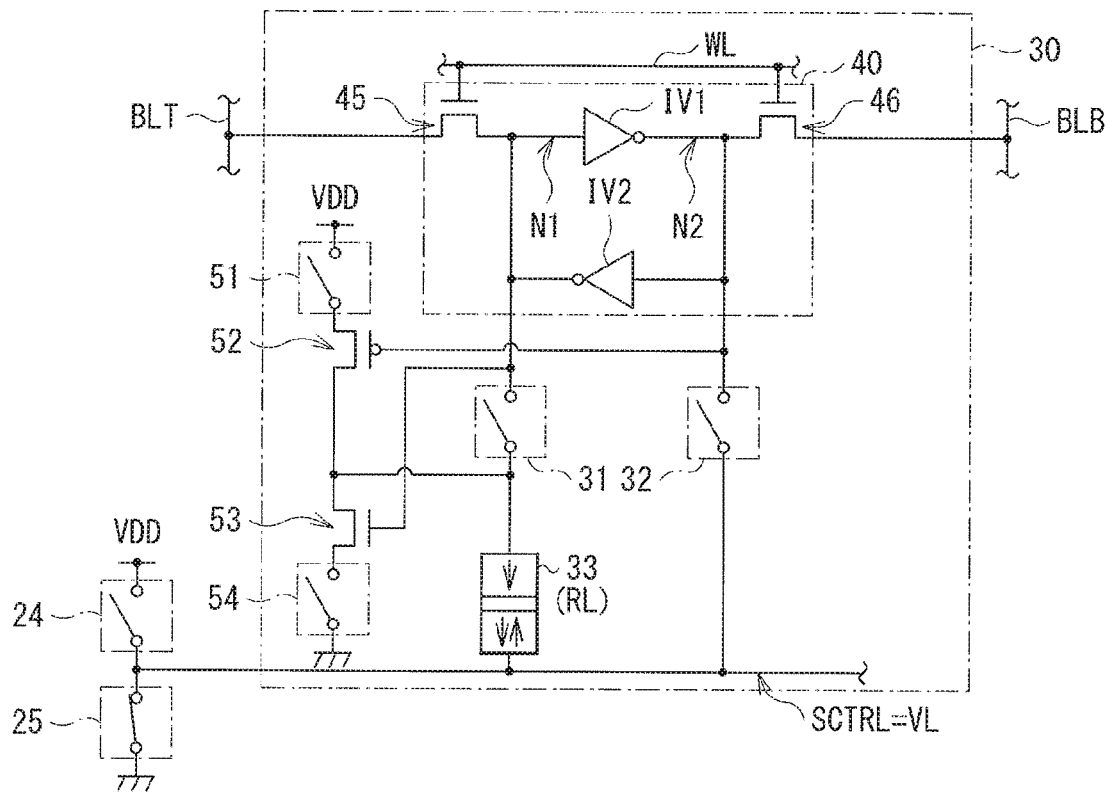

[FIG. 6A]
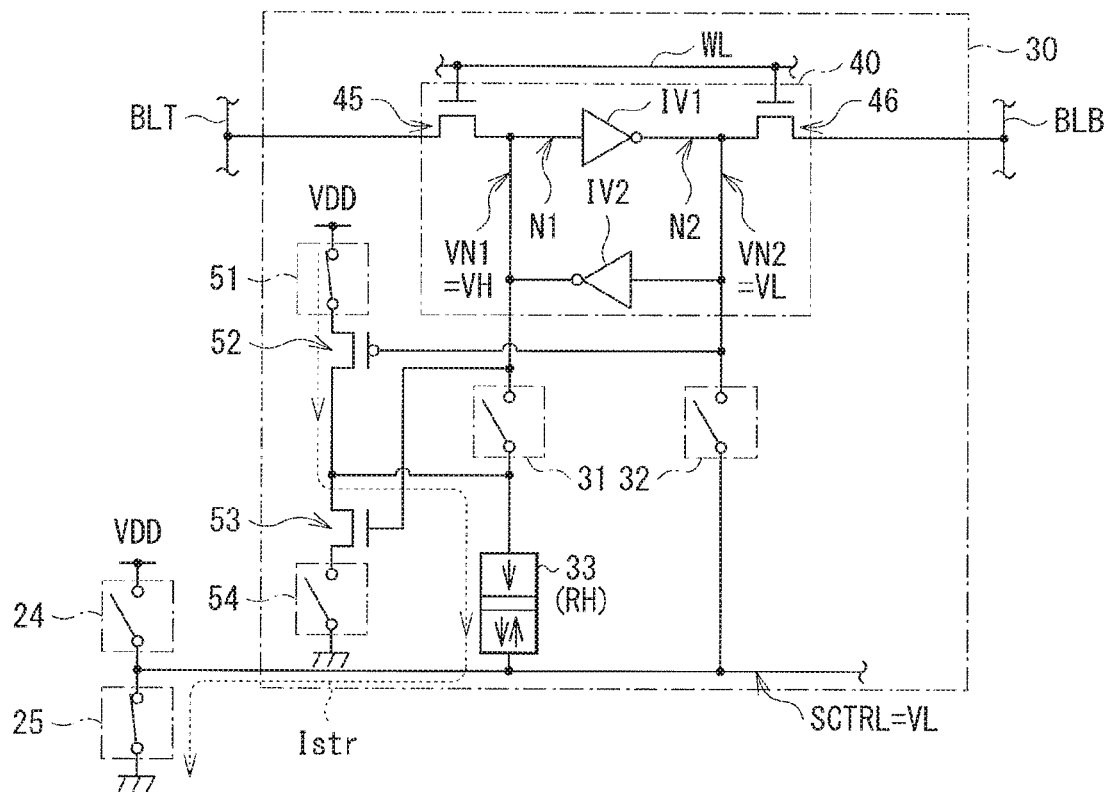
[FIG. 6B]
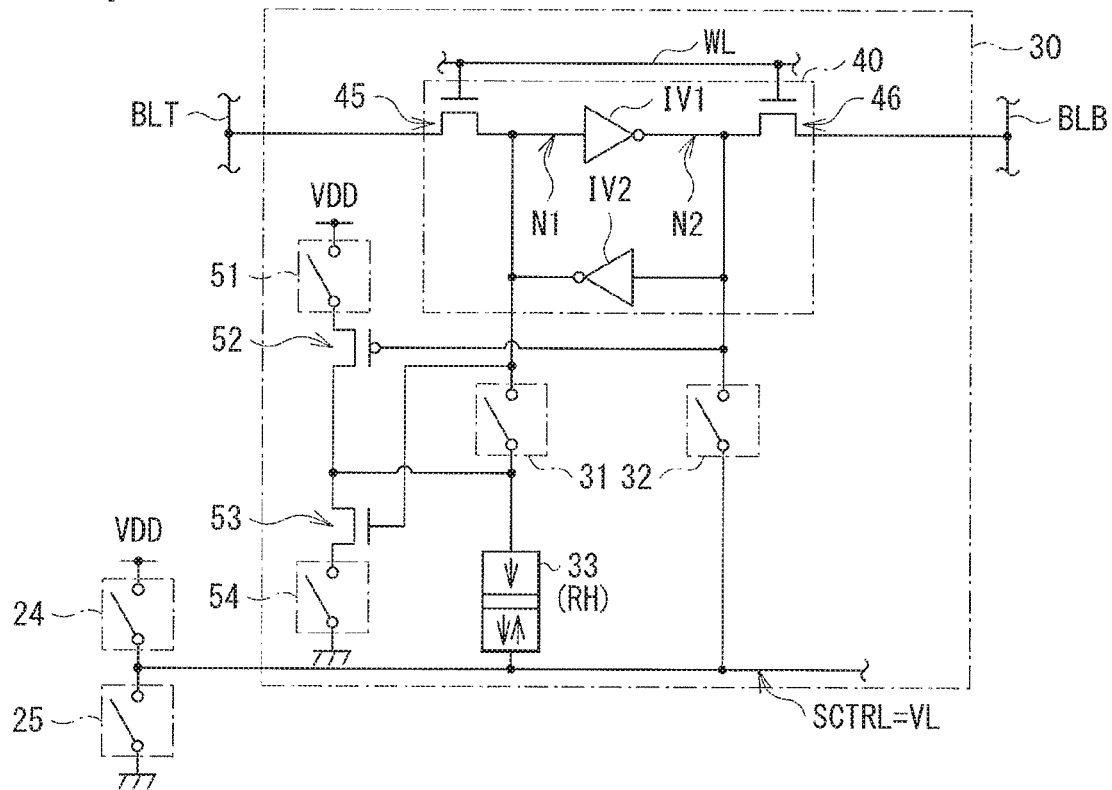

[FIG. 6C]
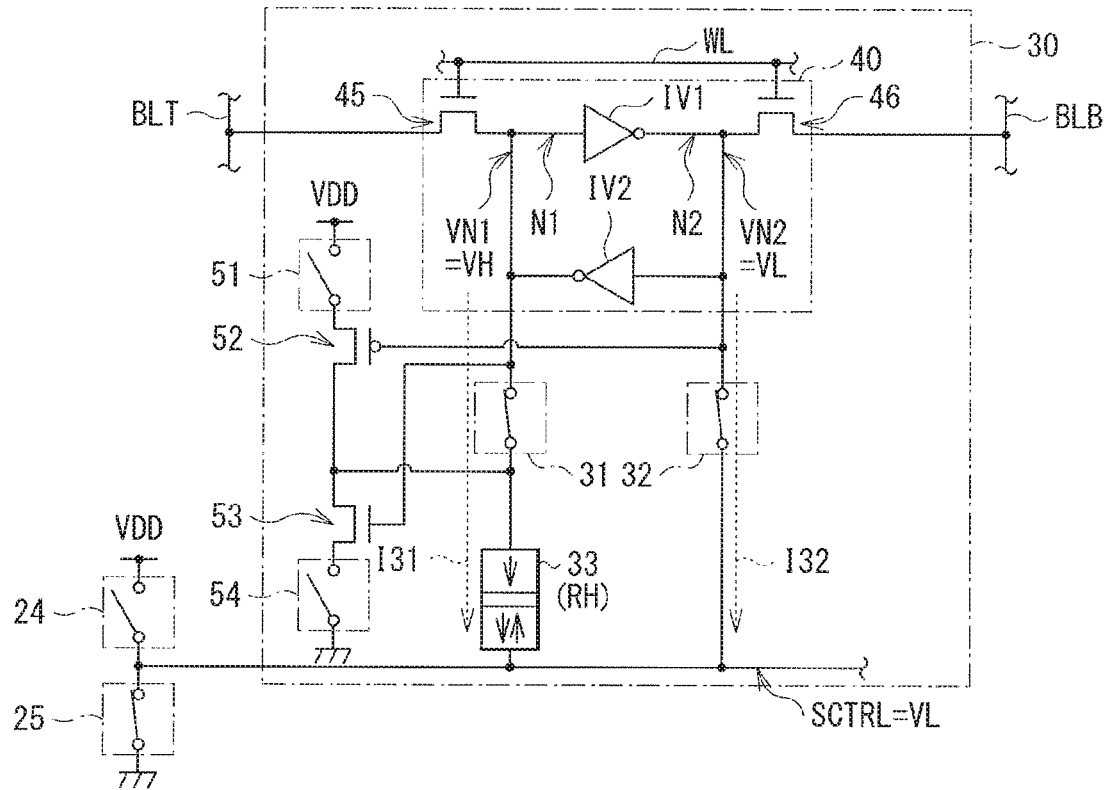
[FIG. 6D]
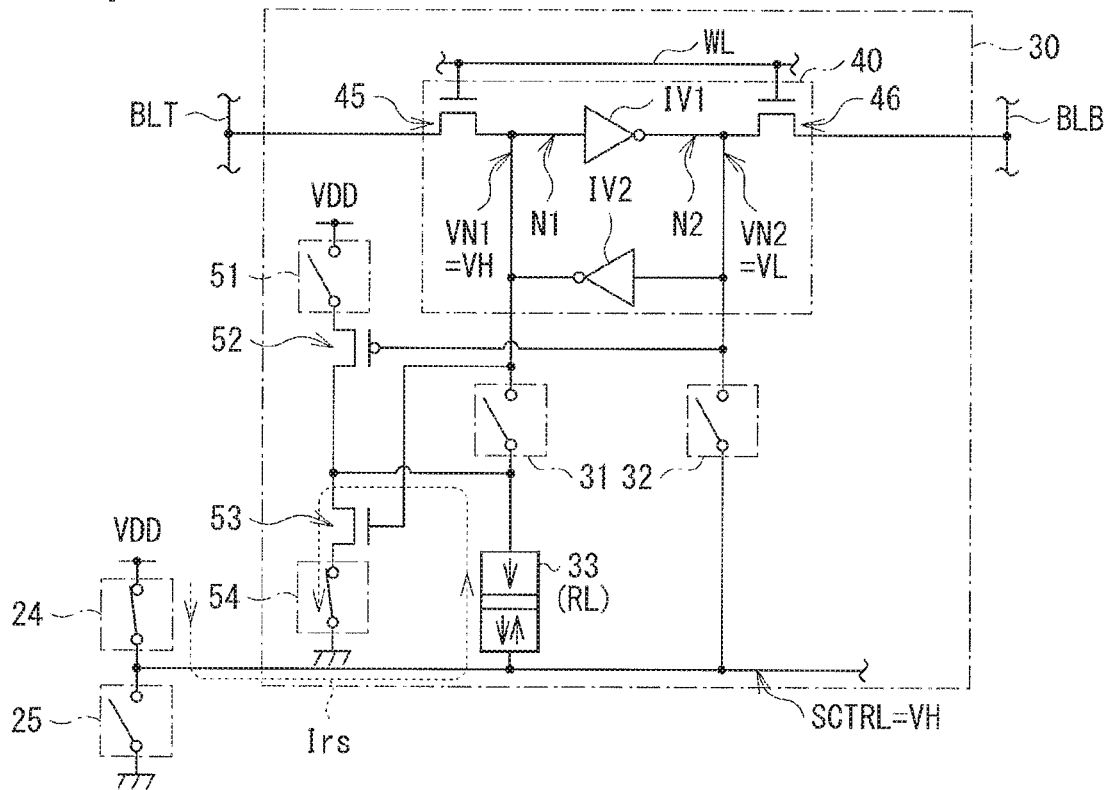

[FIG. 7A]
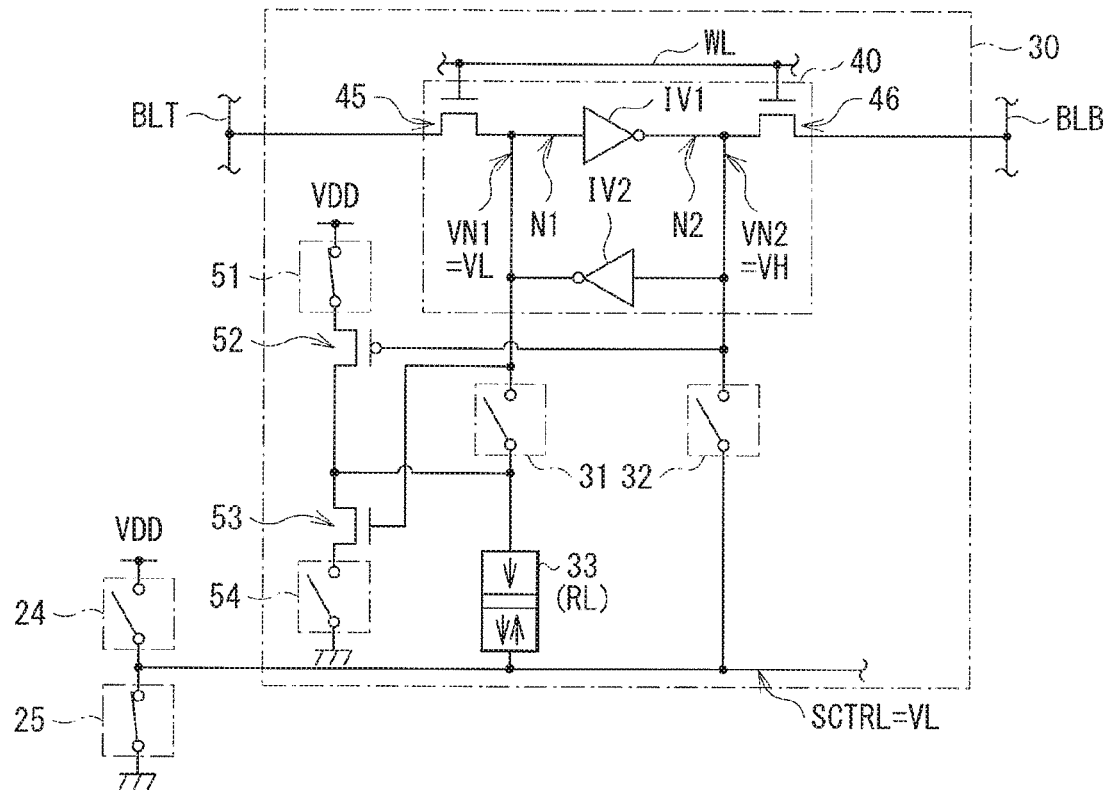
[FIG. 7B]
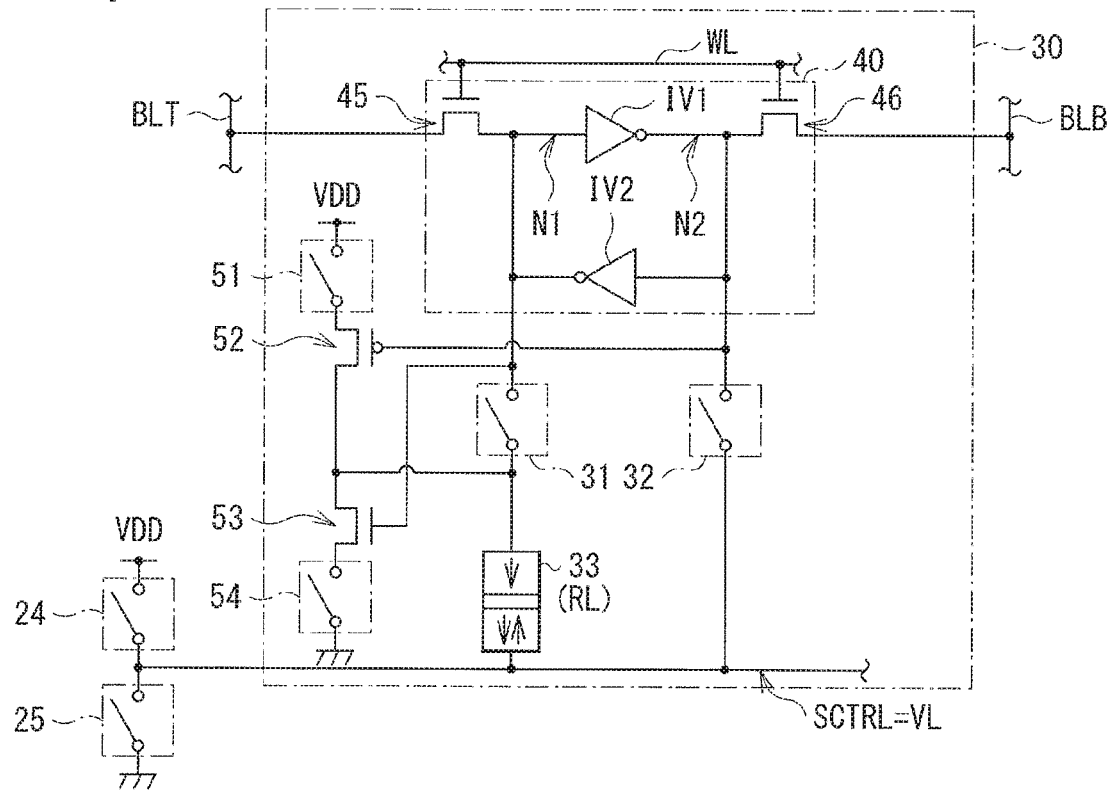

[FIG. 7C]
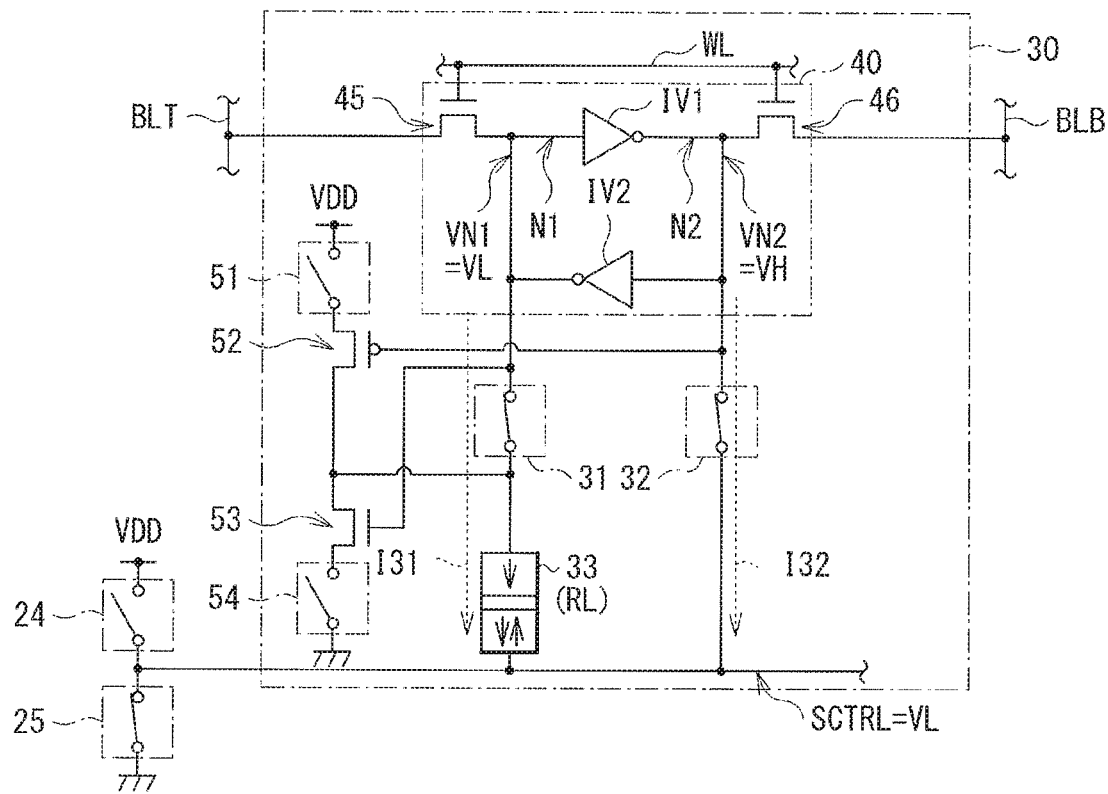
[FIG. 7D]
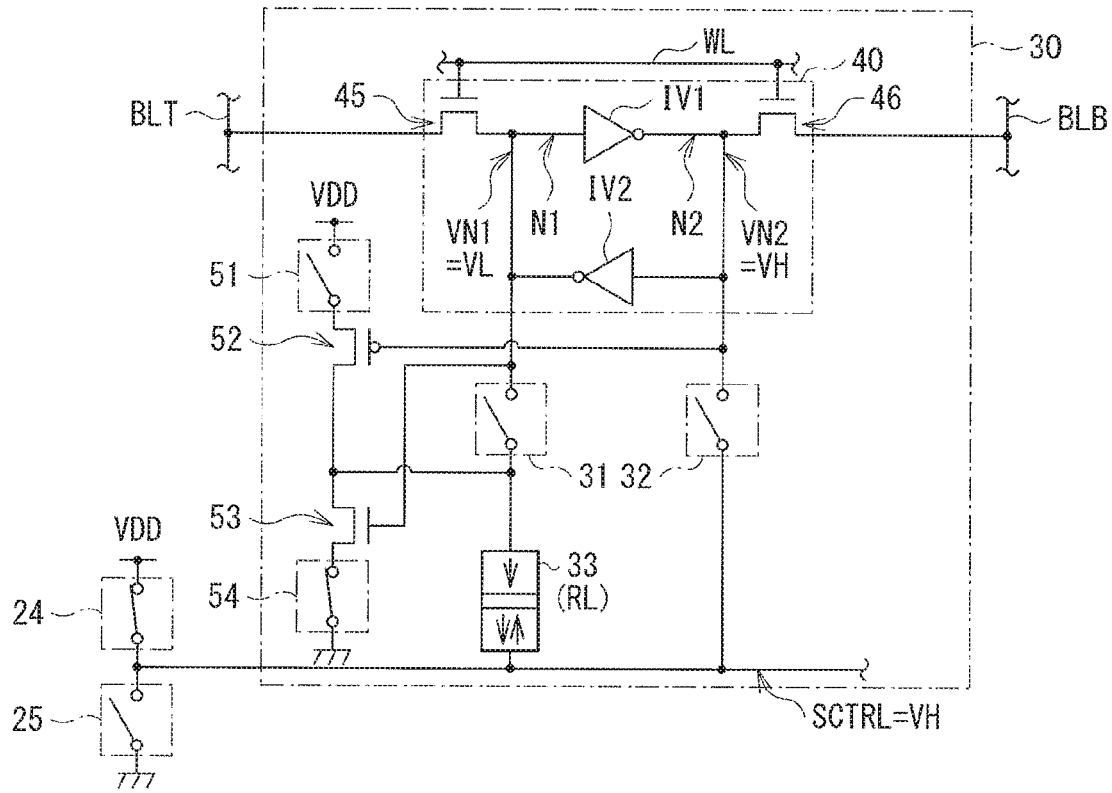

[FIG. 8]
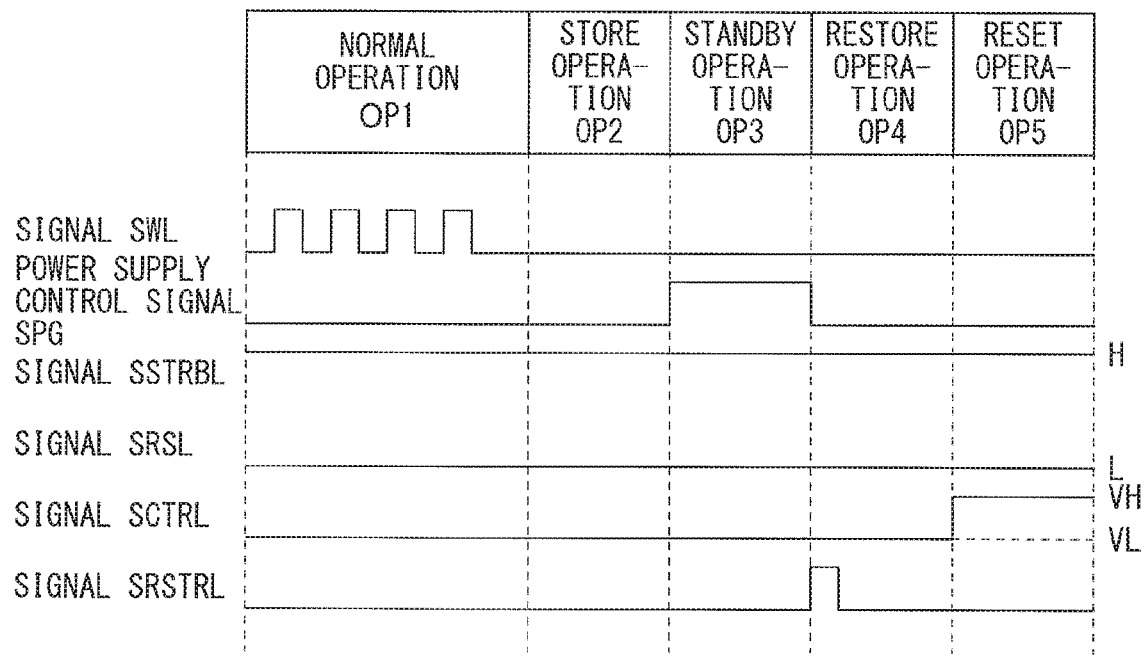

[FIG. 9]
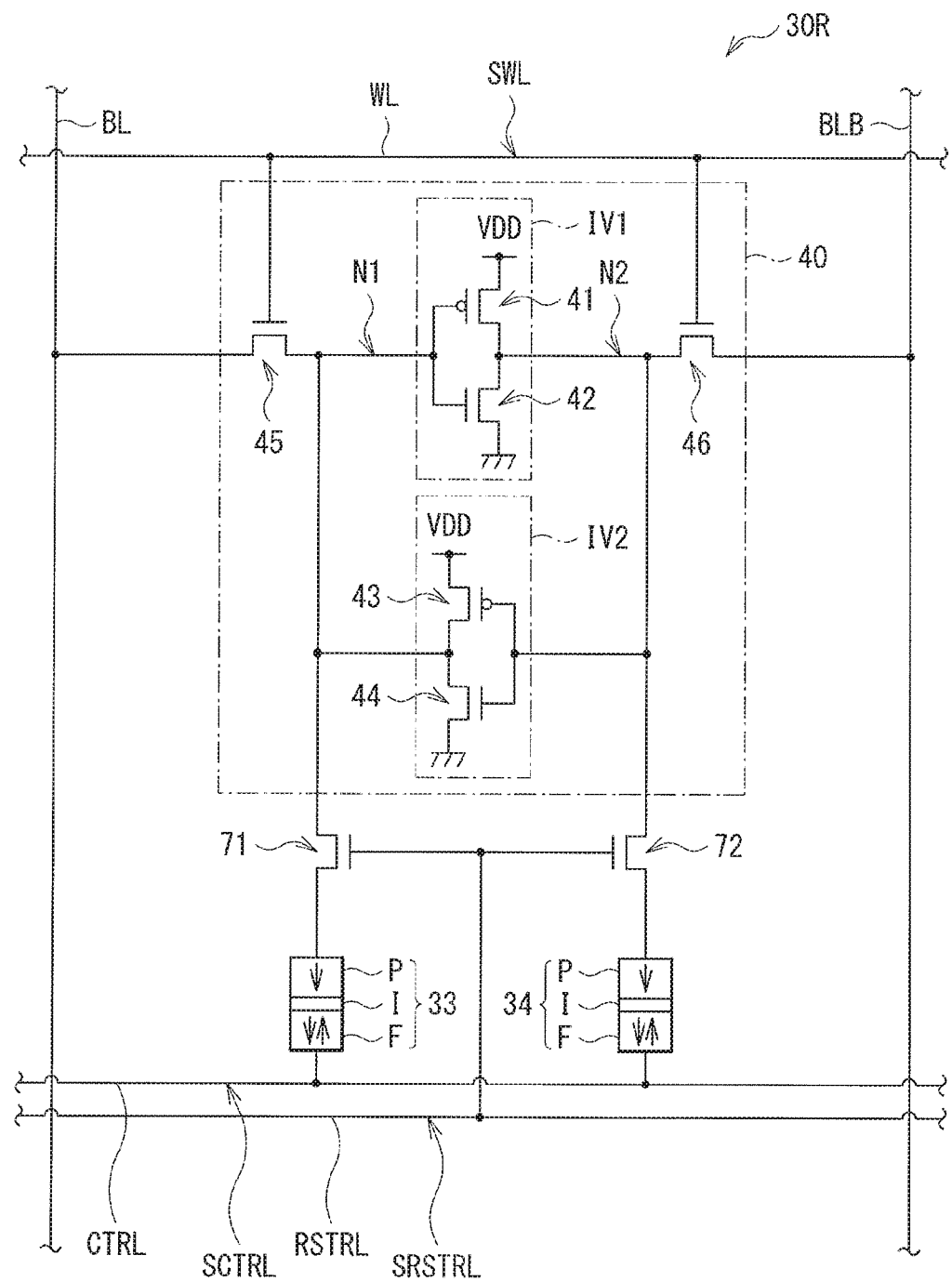

[ FIG. 10 ]
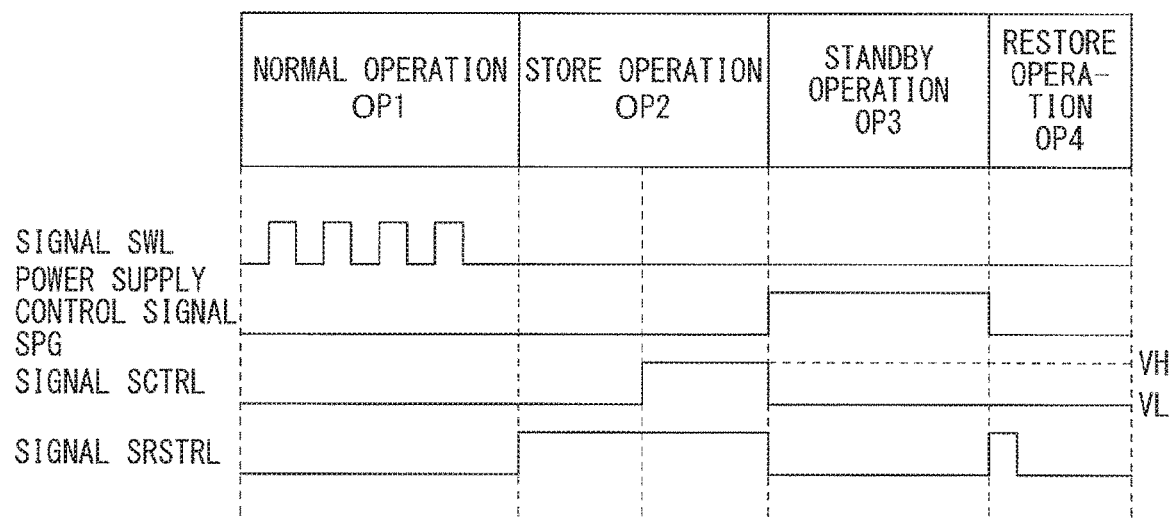

[FIG. 11A]
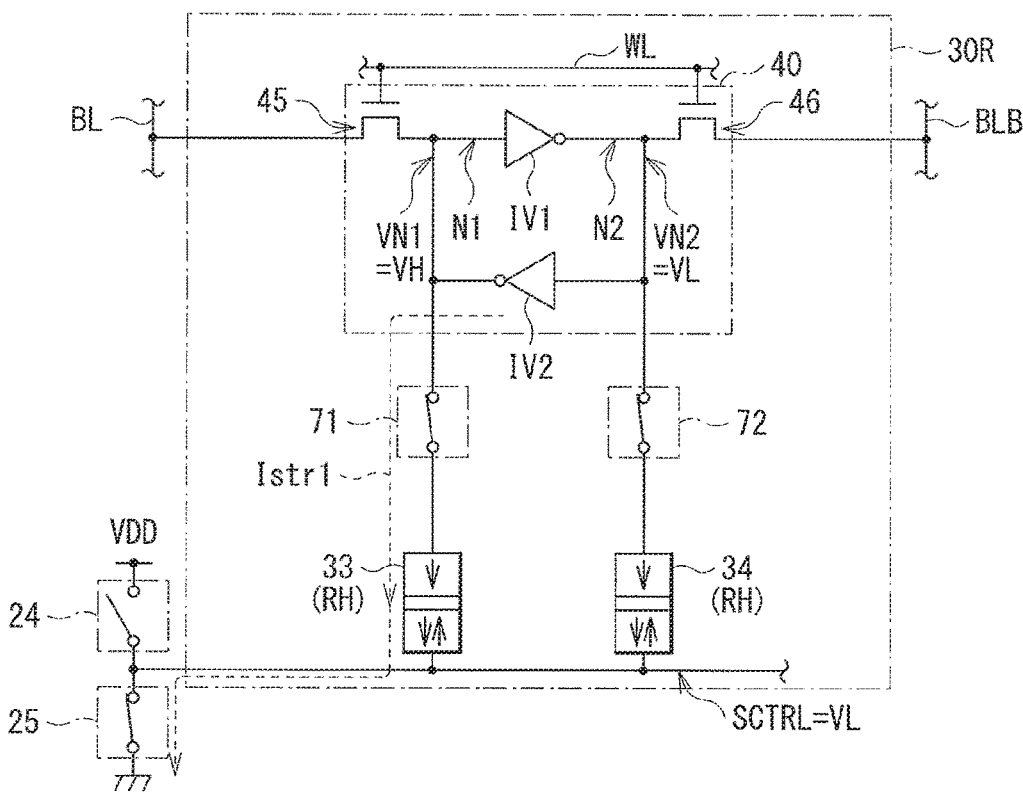
[FIG. 11B]
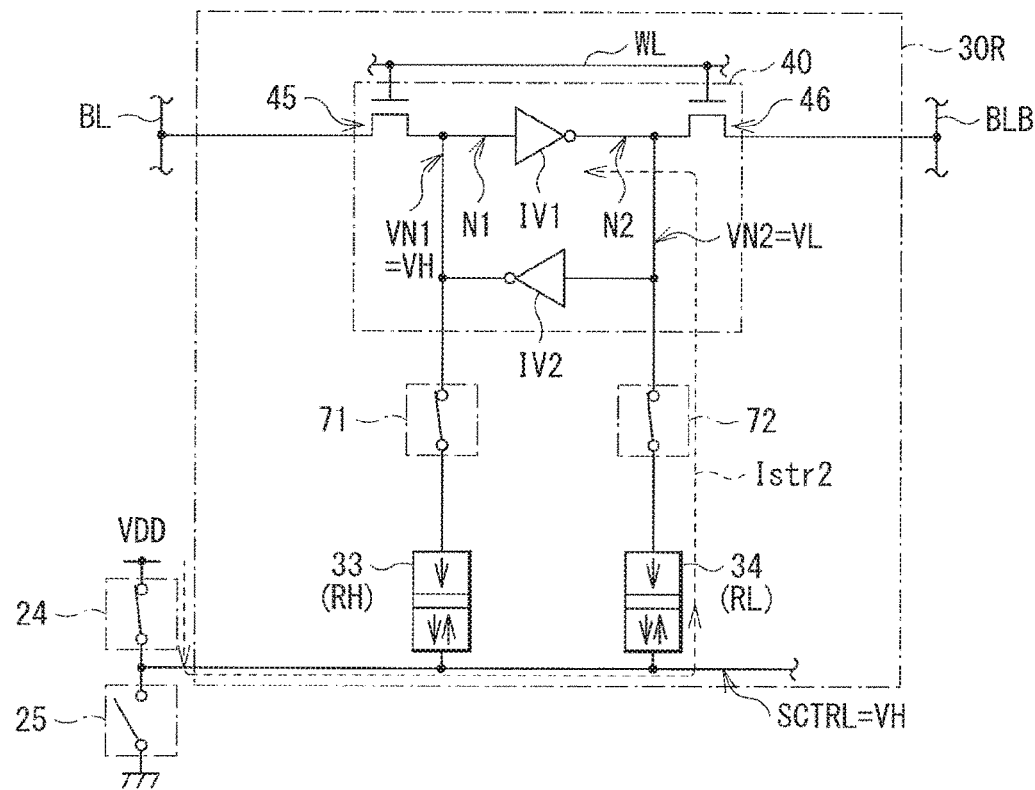

[FIG. 12]
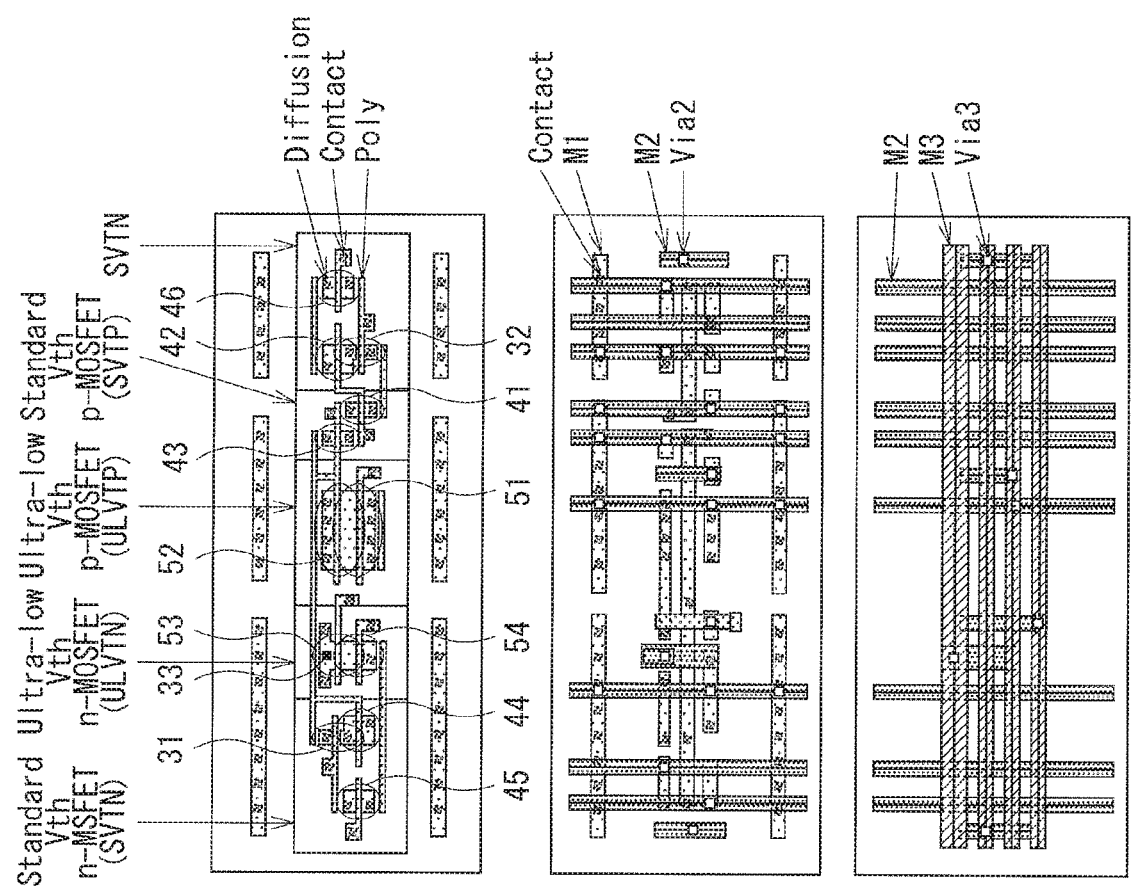

[FIG. 13]
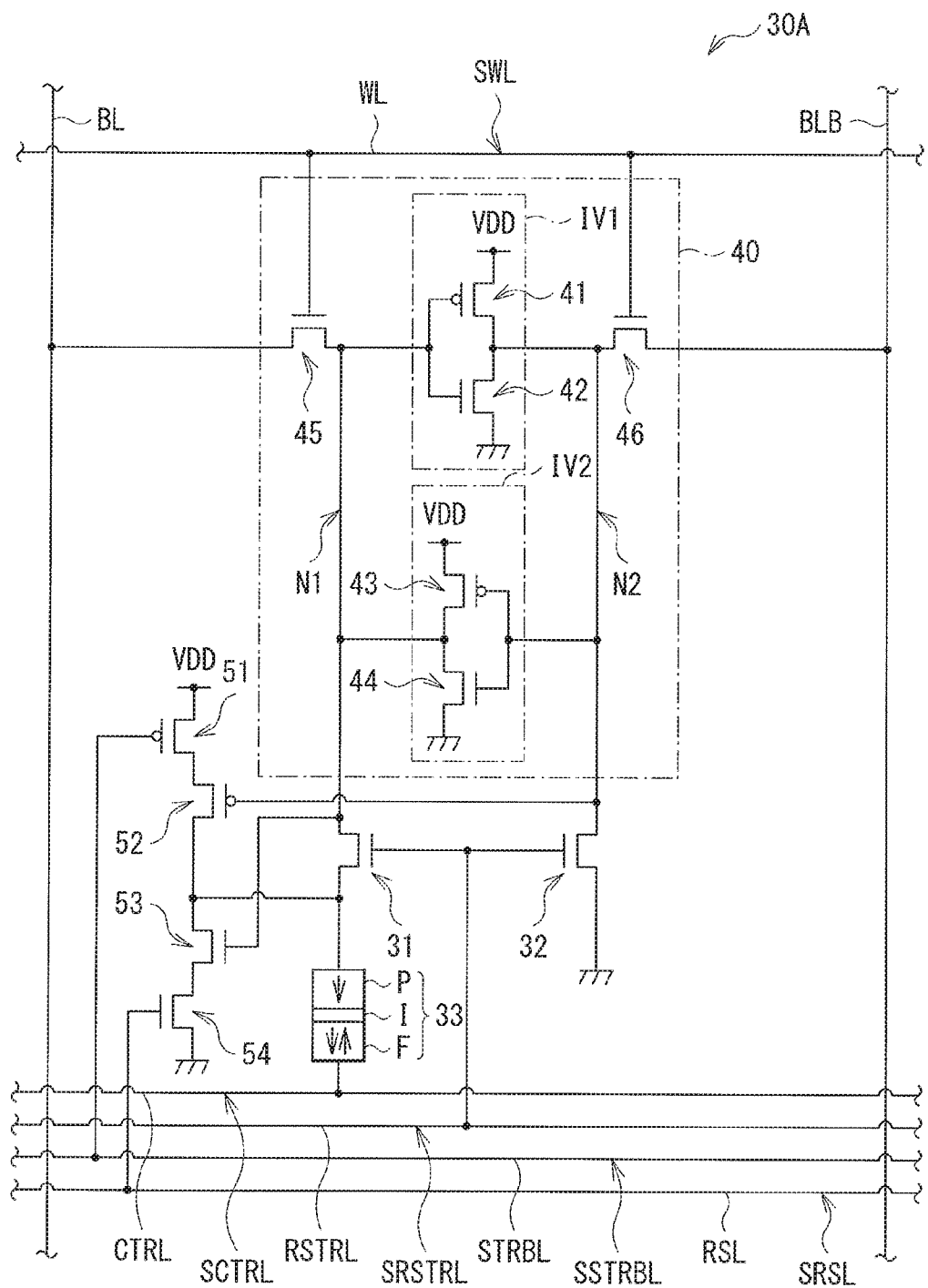

[FIG. 14]
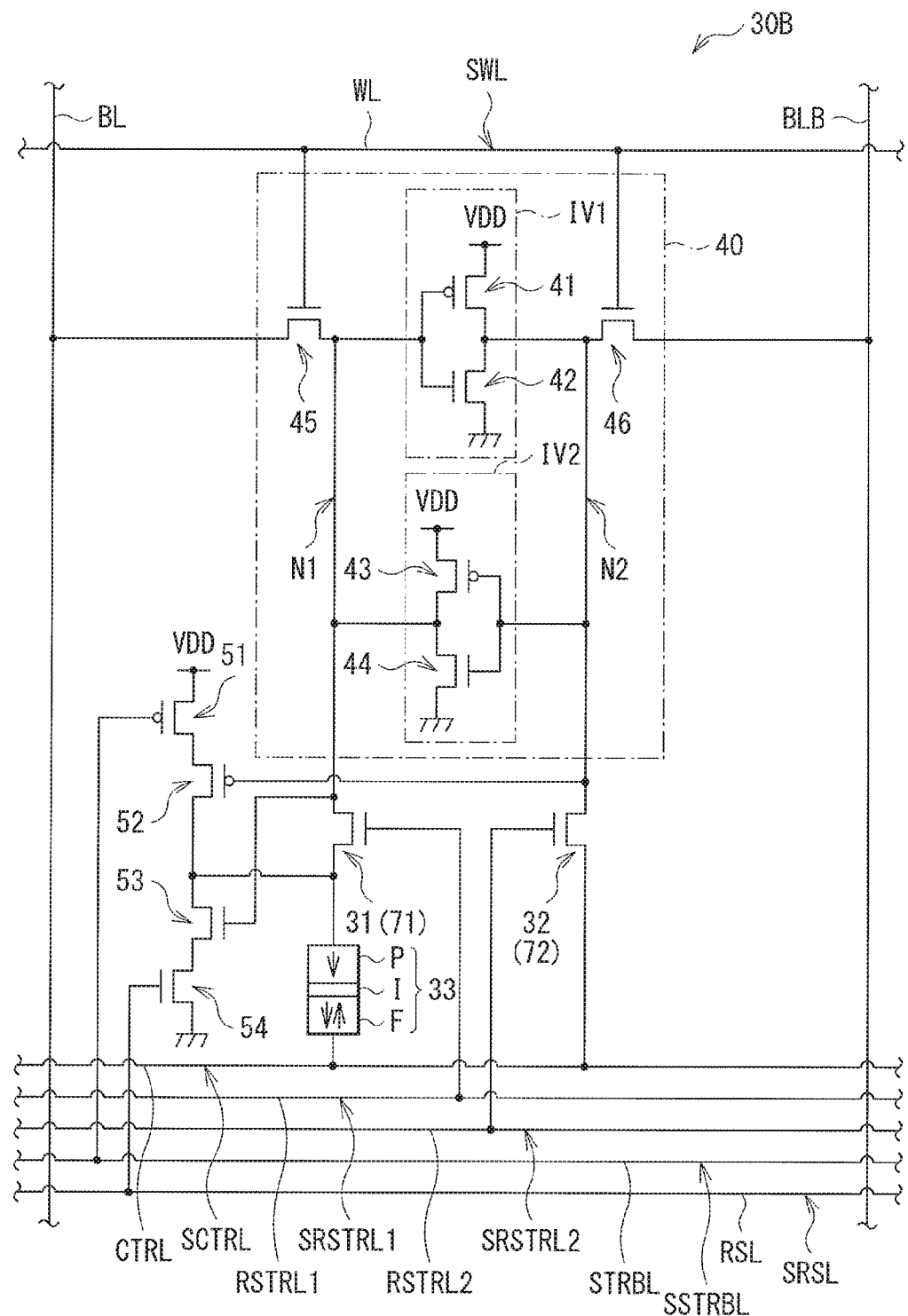

[FIG. 15]
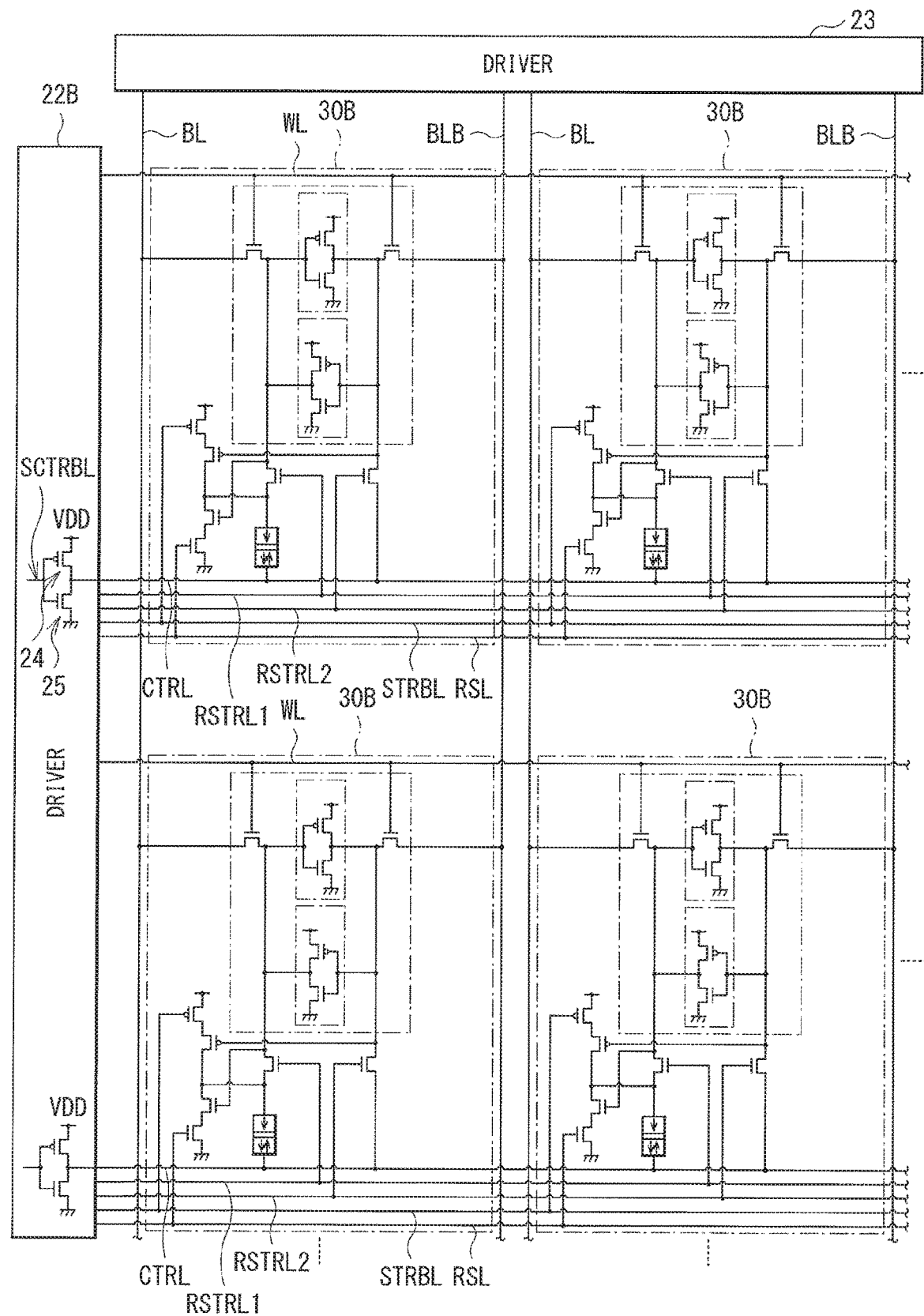

[FIG. 16]
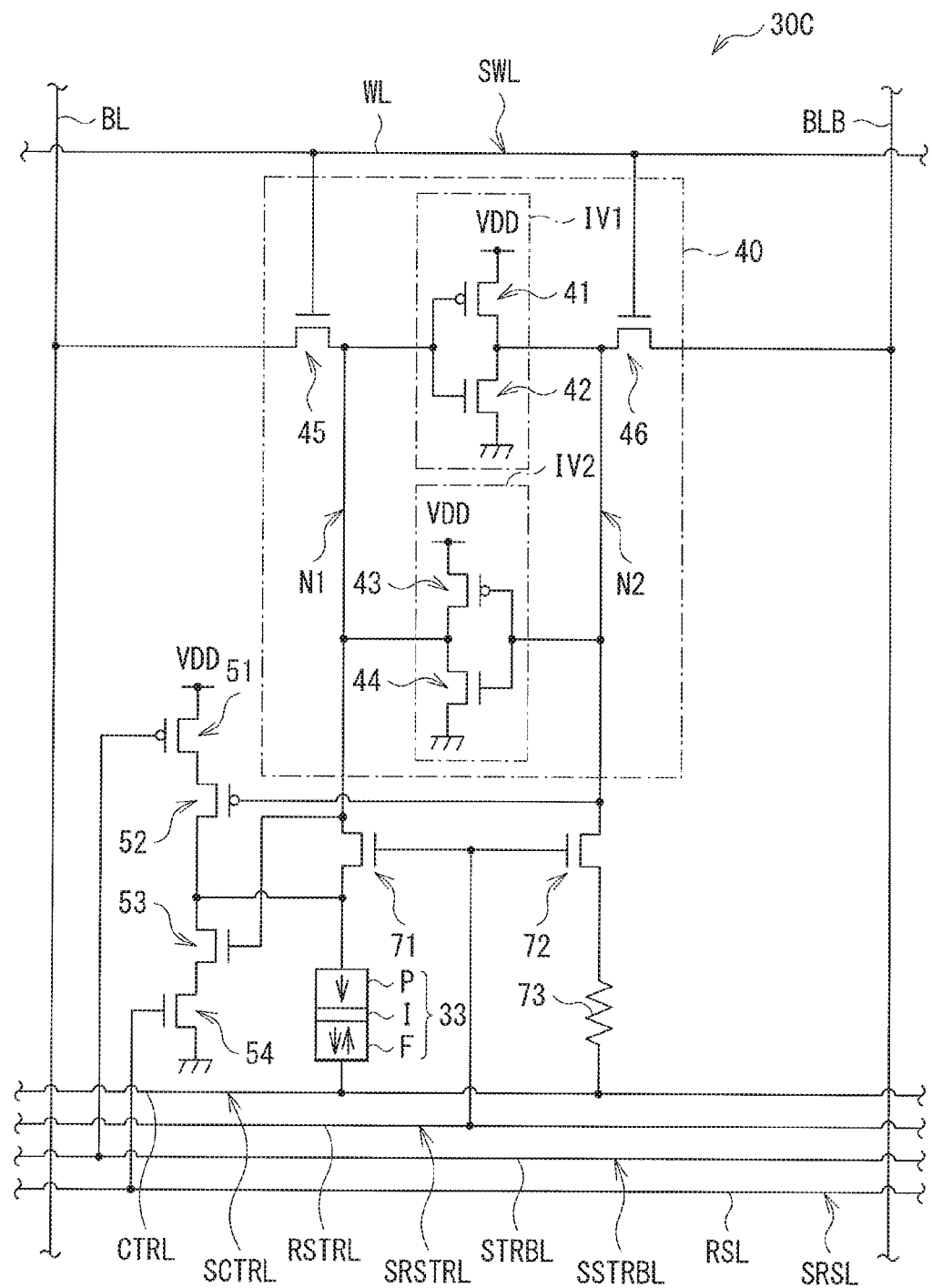

[ FIG. 17 ]
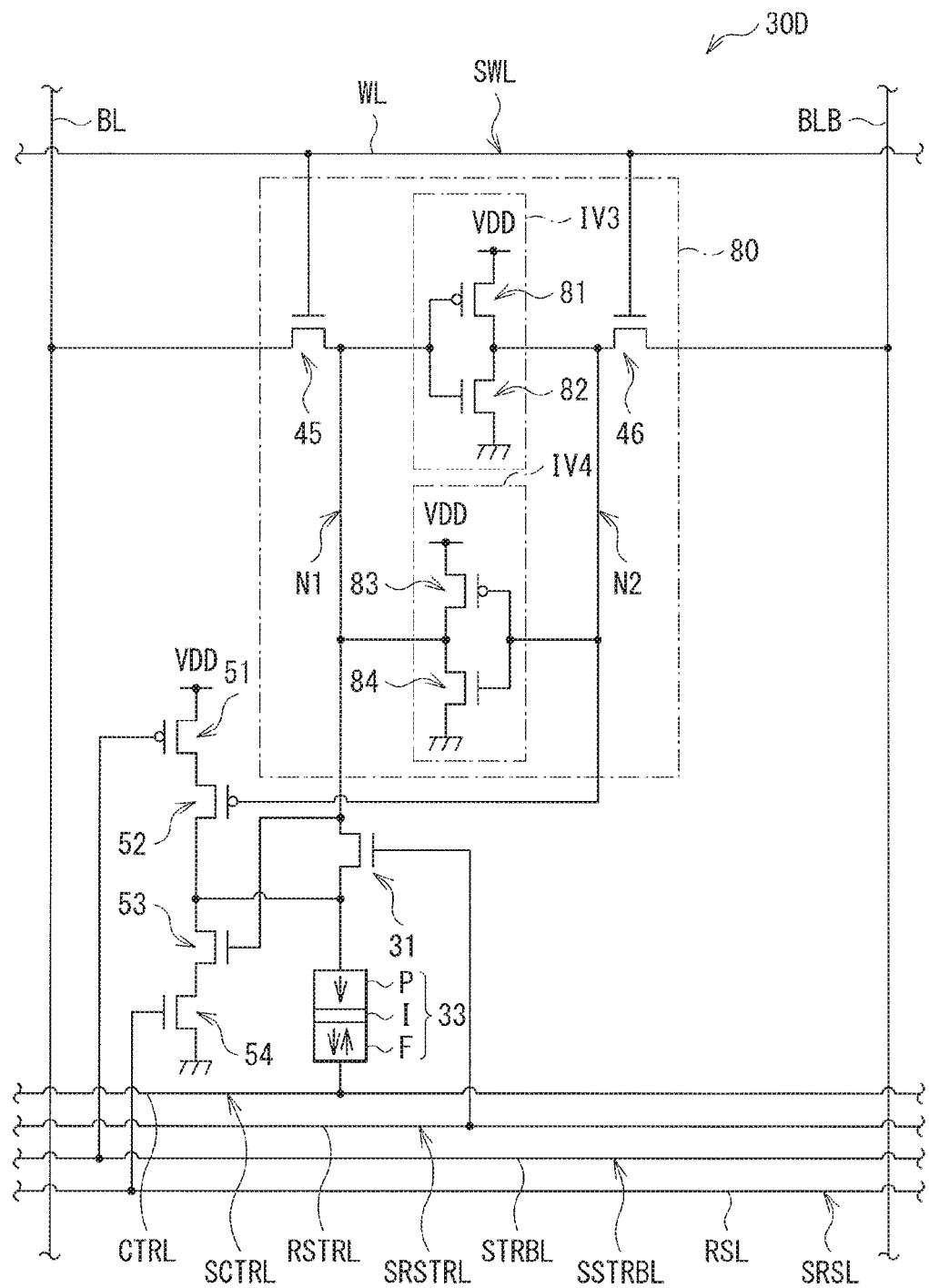

[FIG. 18]
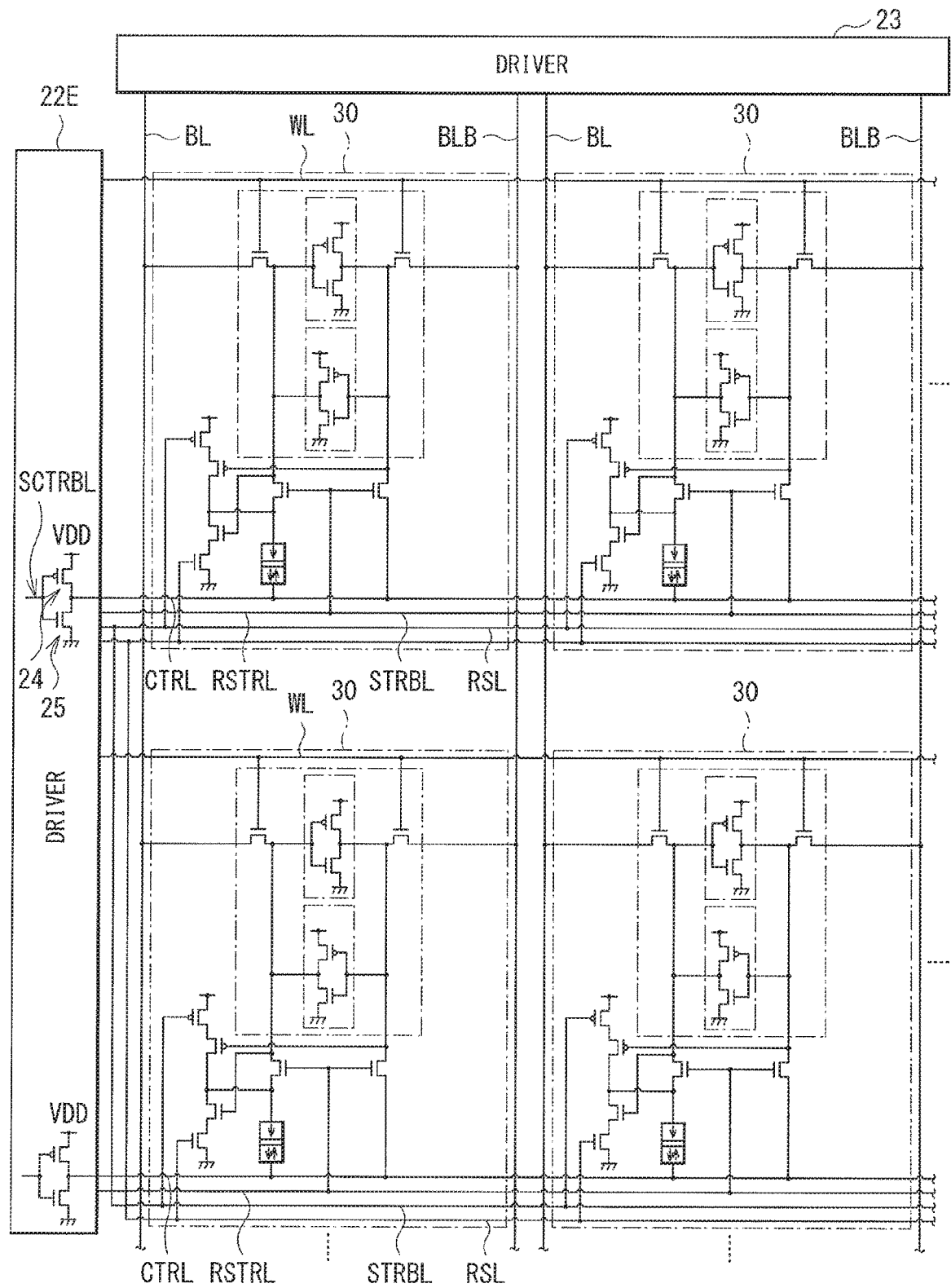

[FIG. 19]
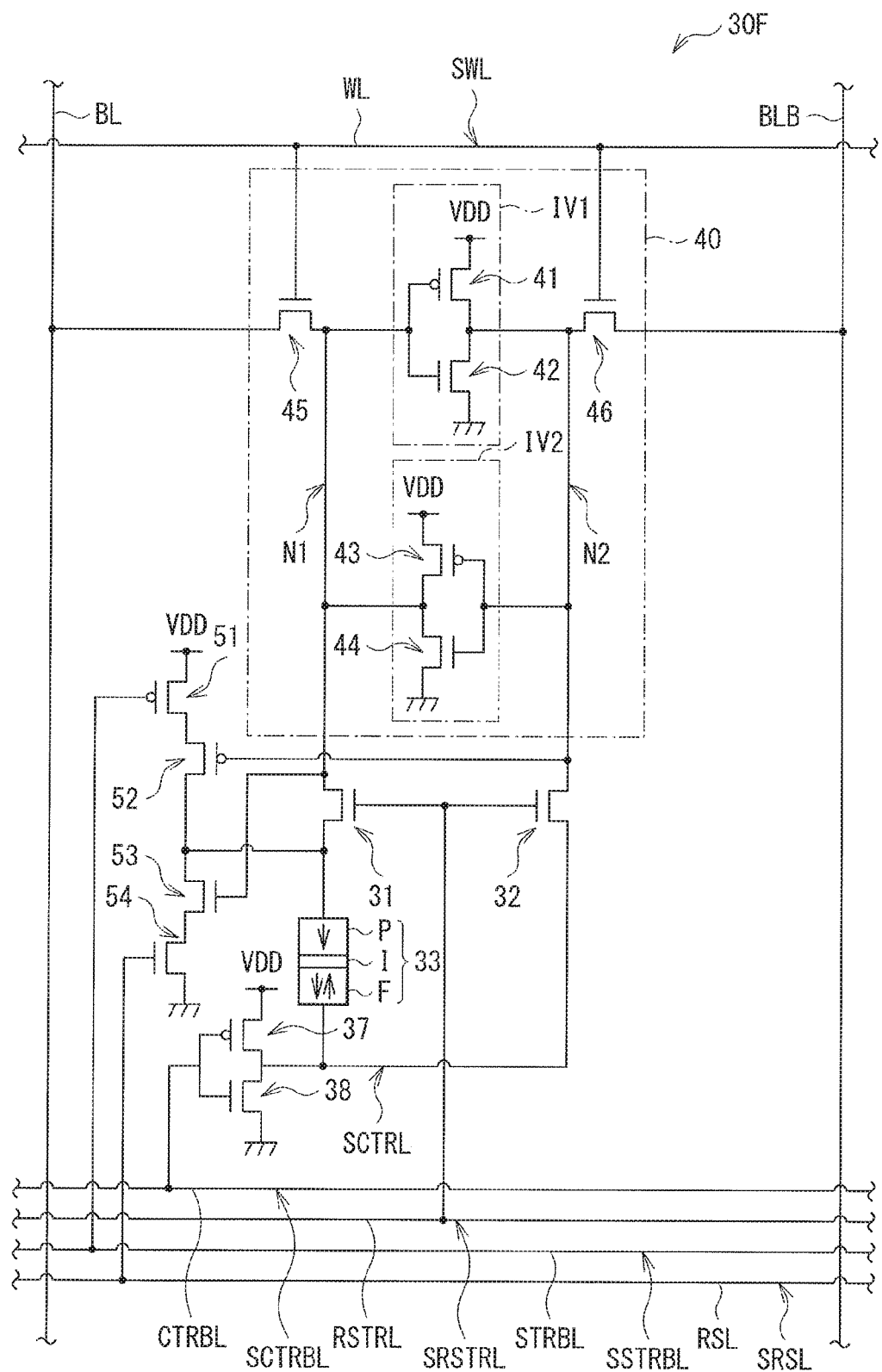

[FIG. 20]
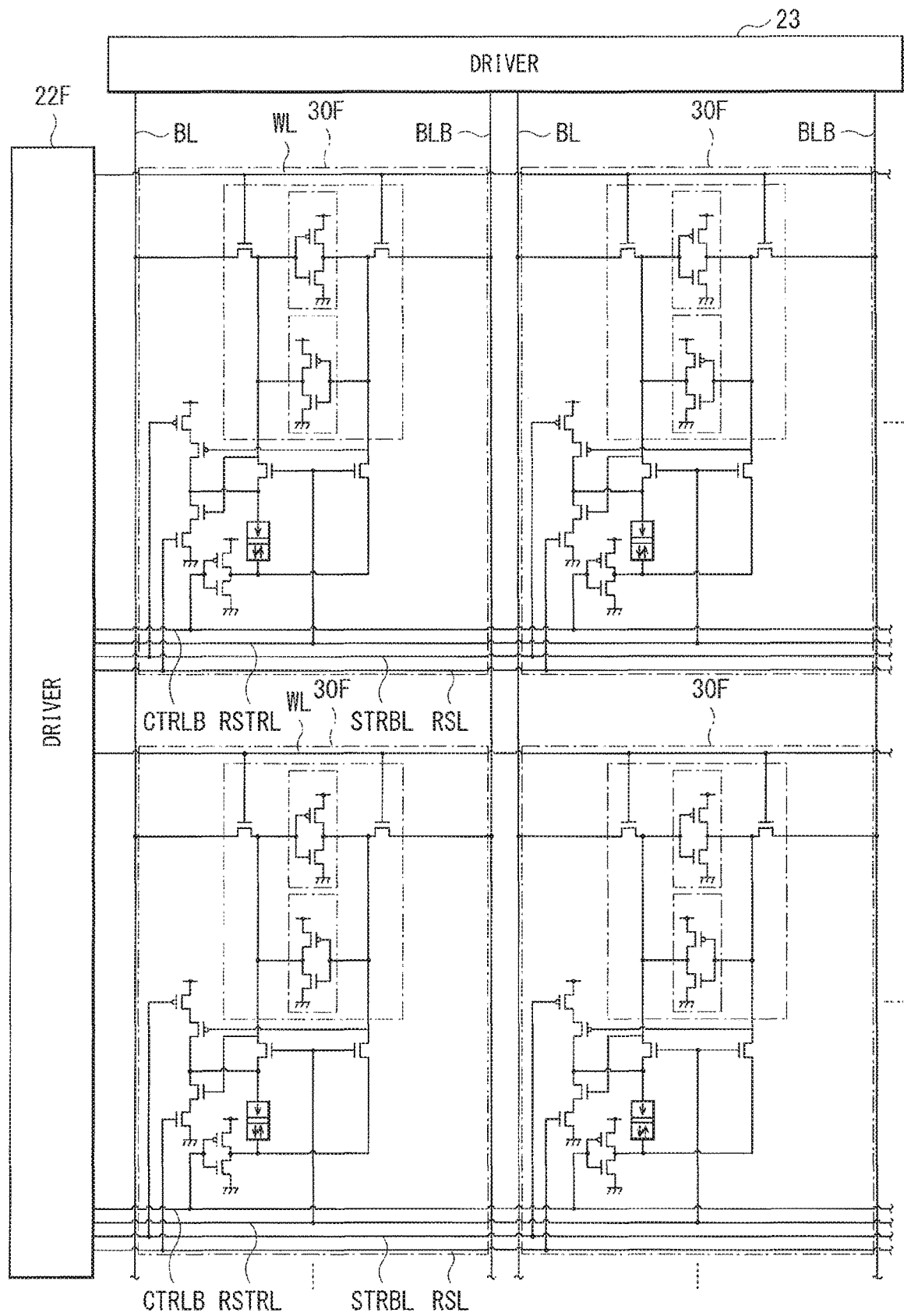

[FIG. 21]
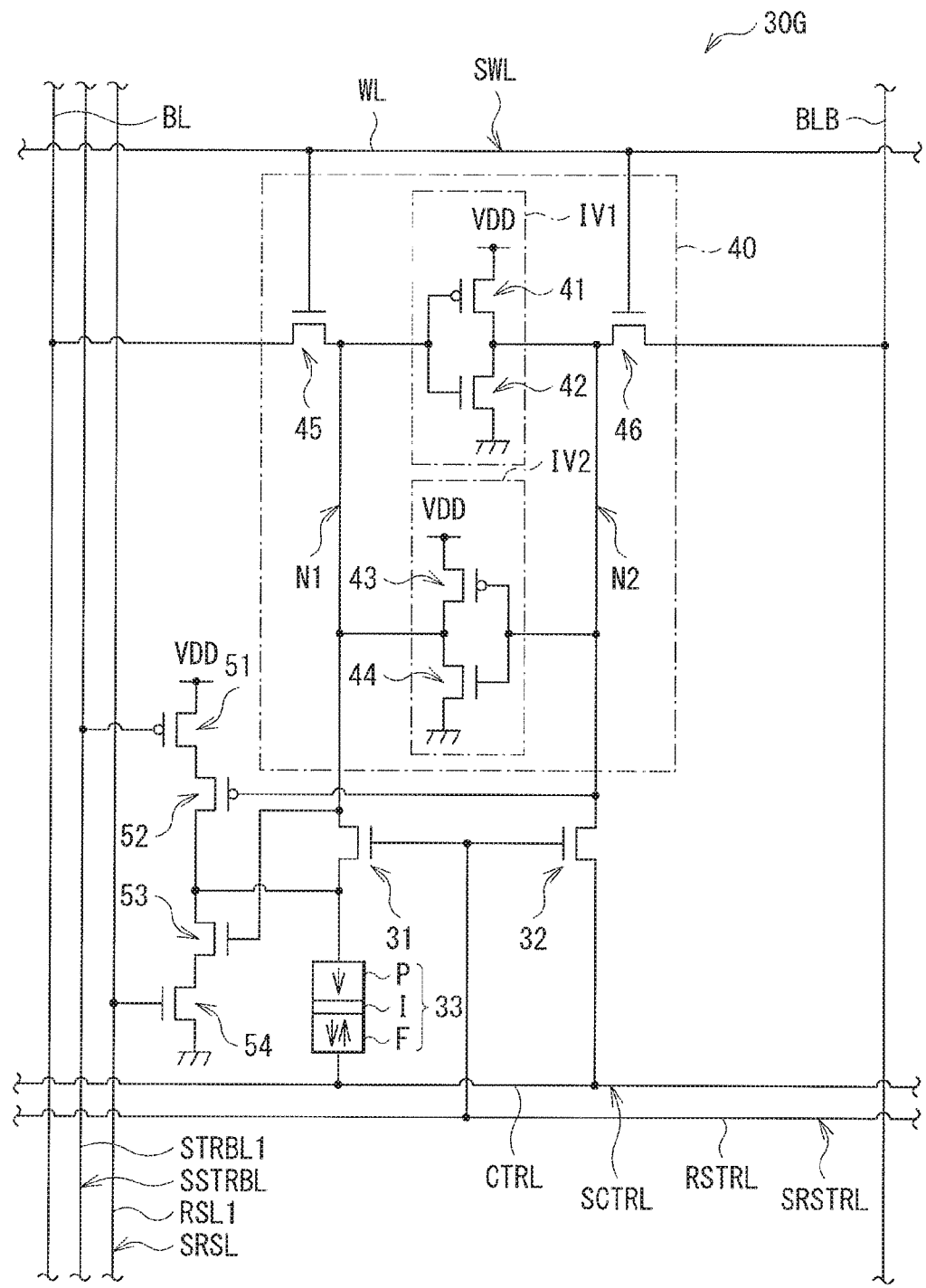

[FIG. 22]
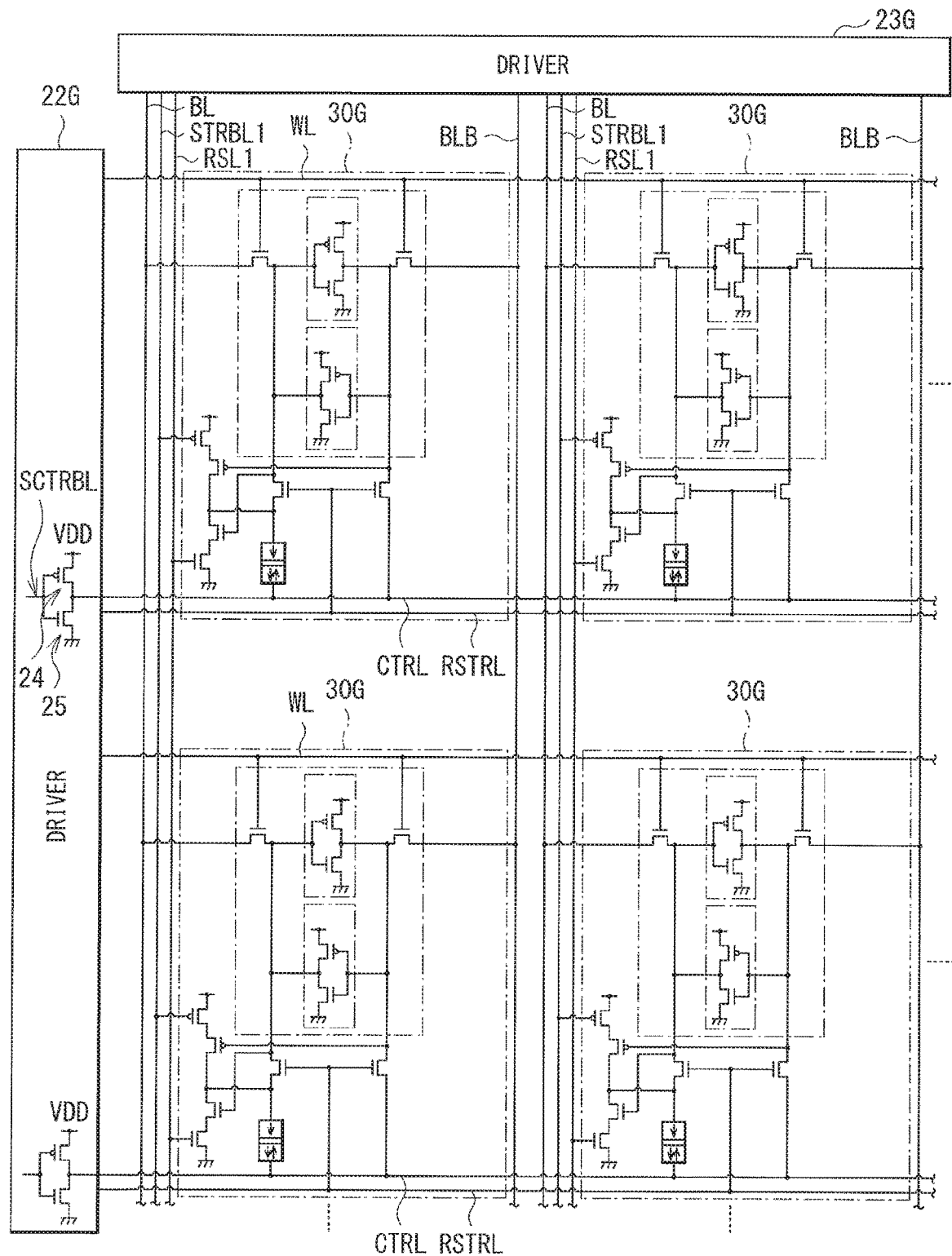

[FIG. 23]
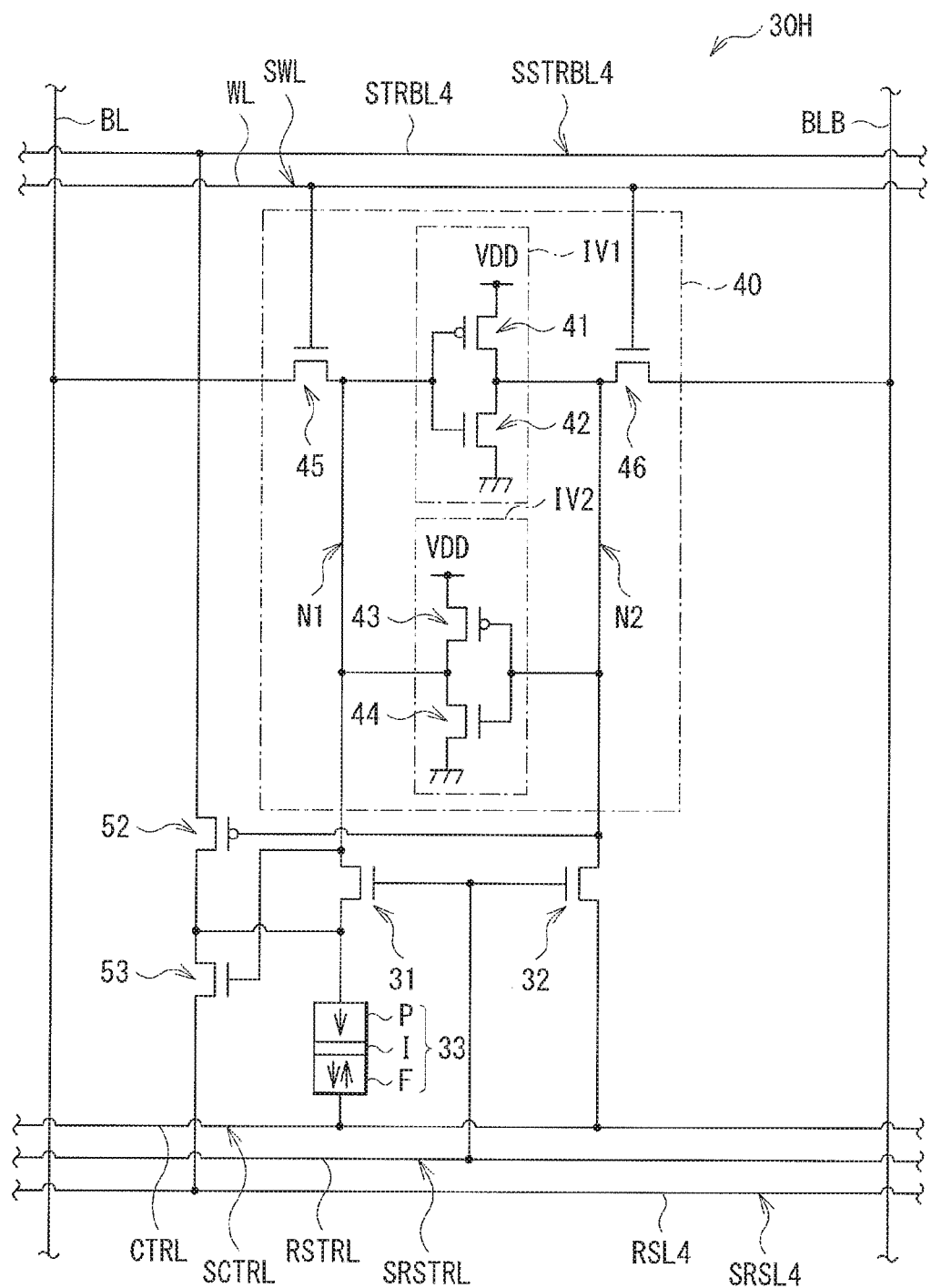

[FIG. 24]
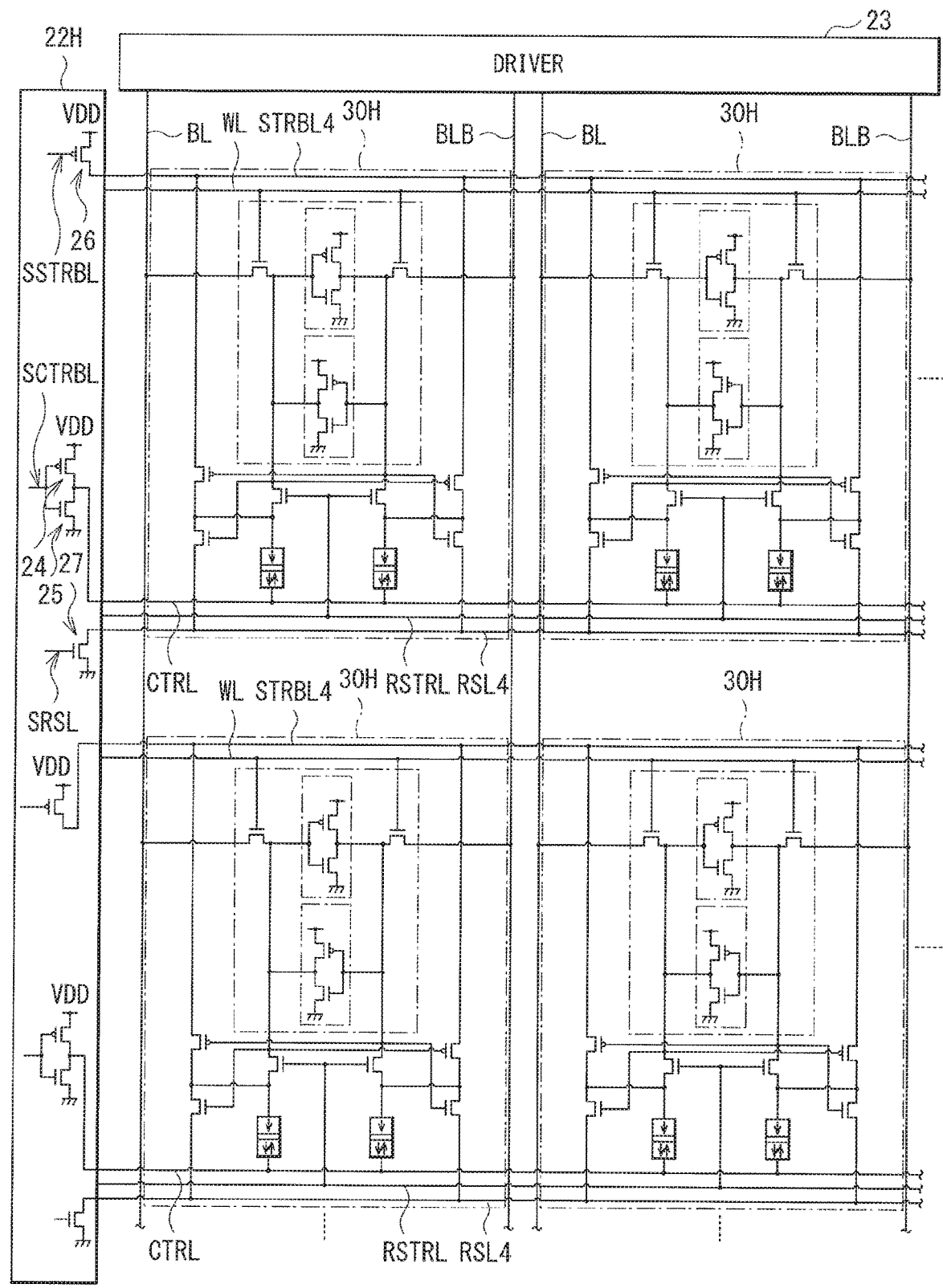

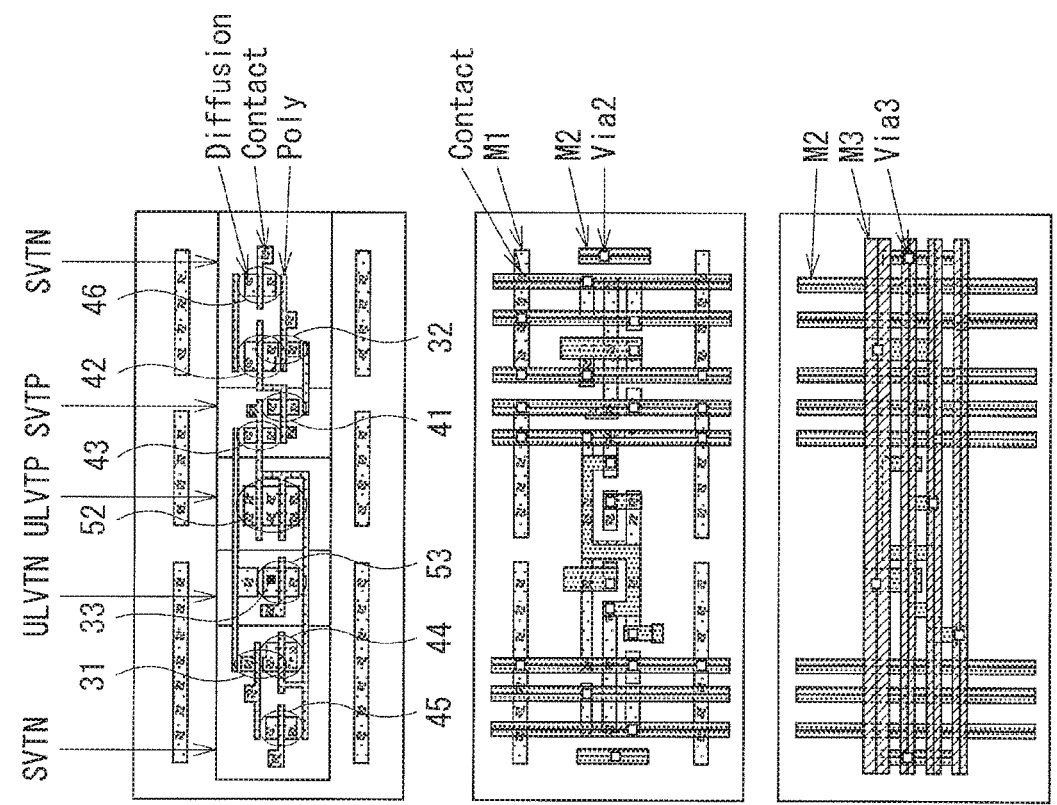
[FIG. 25]

[FIG. 26]
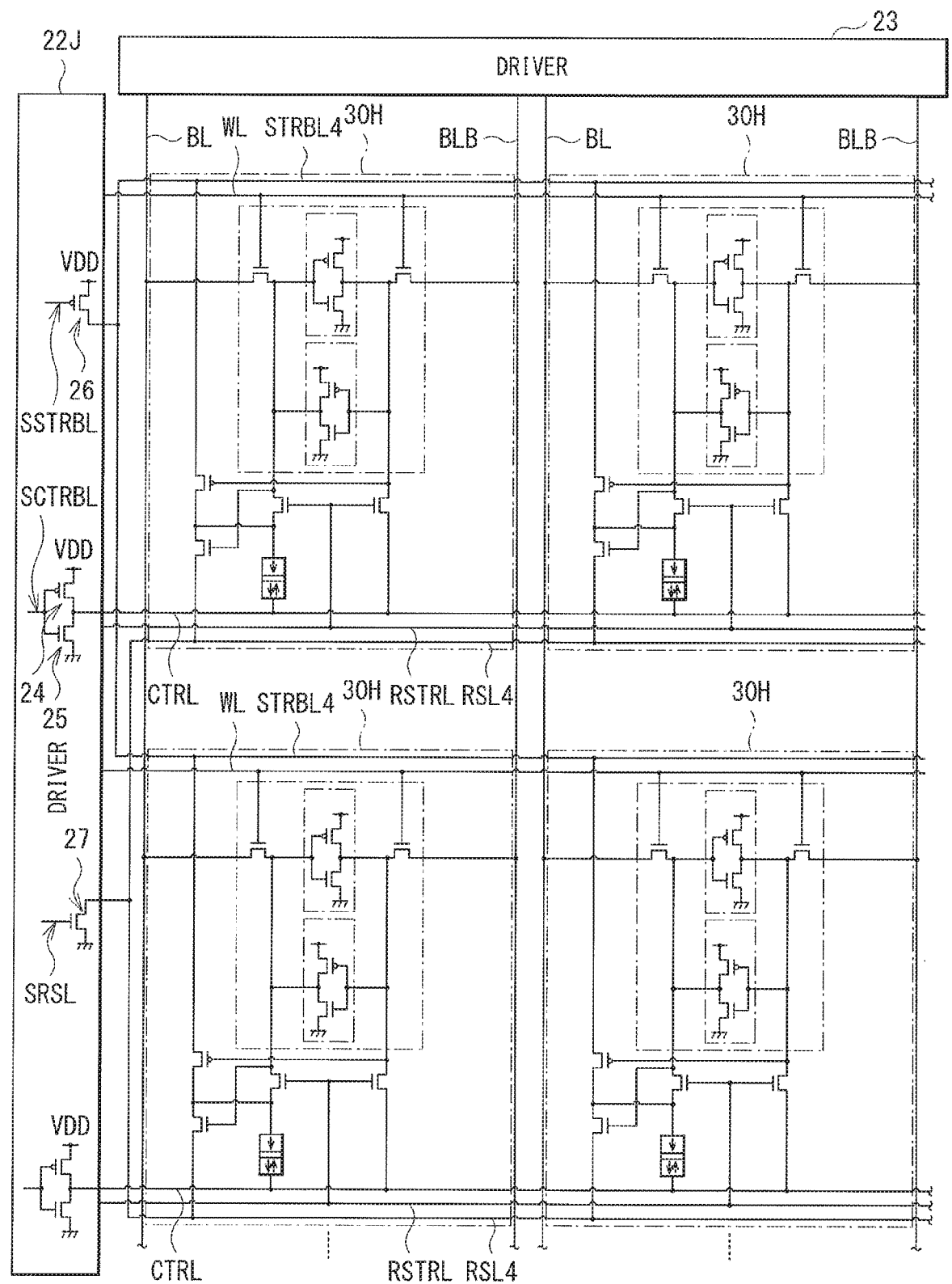

[ FIG. 27 ]
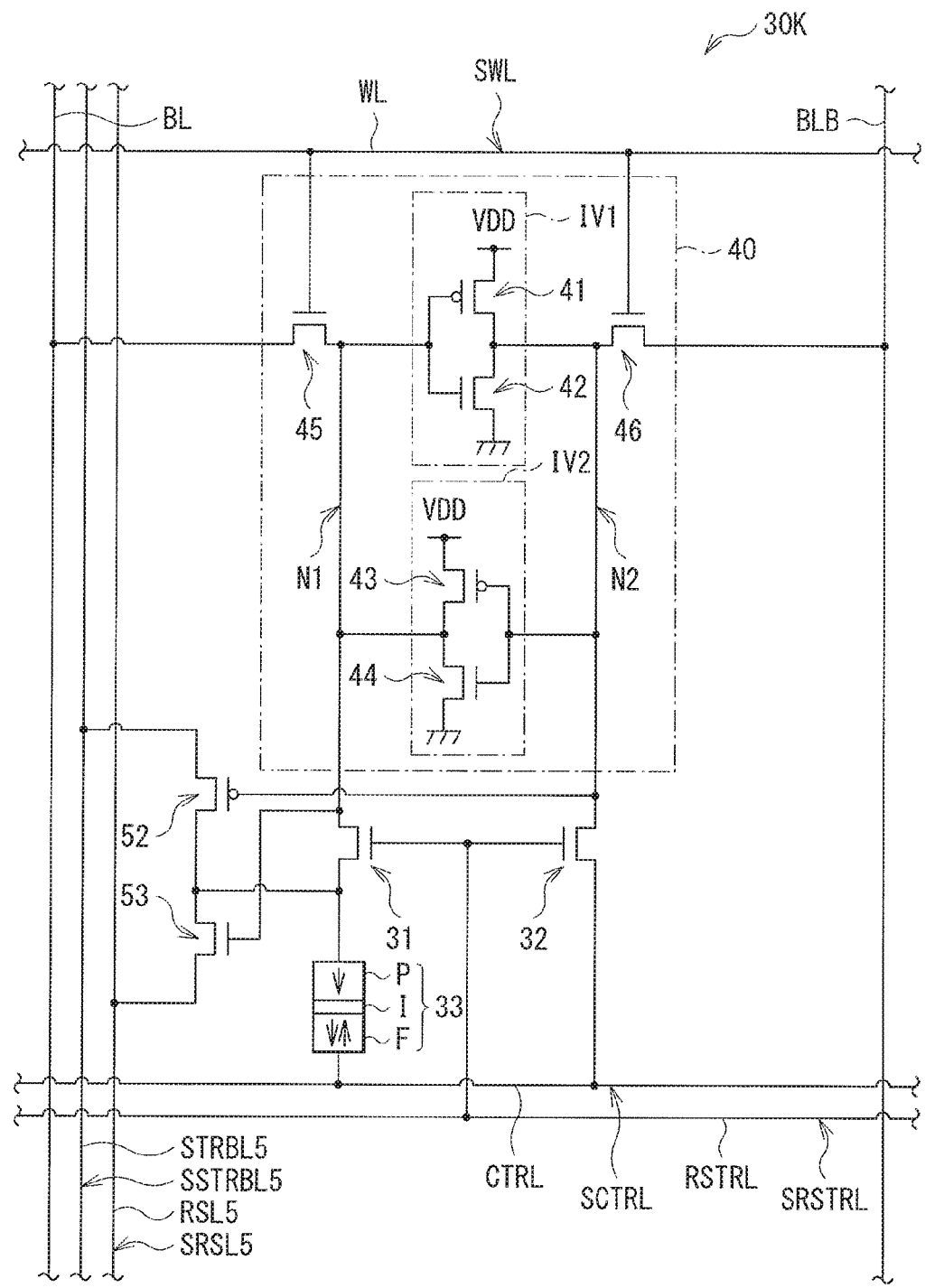

[FIG. 28]
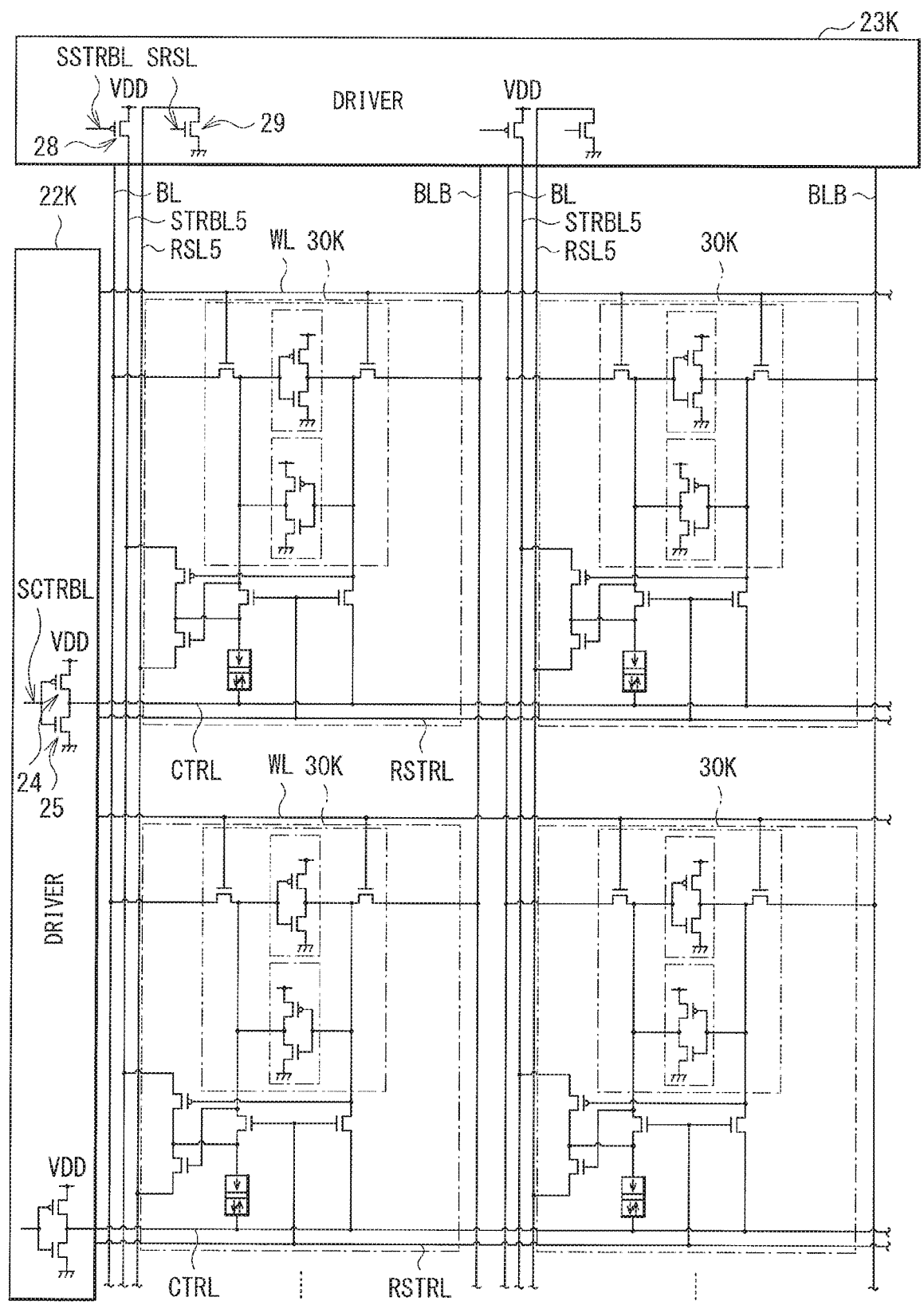

[FIG. 29]
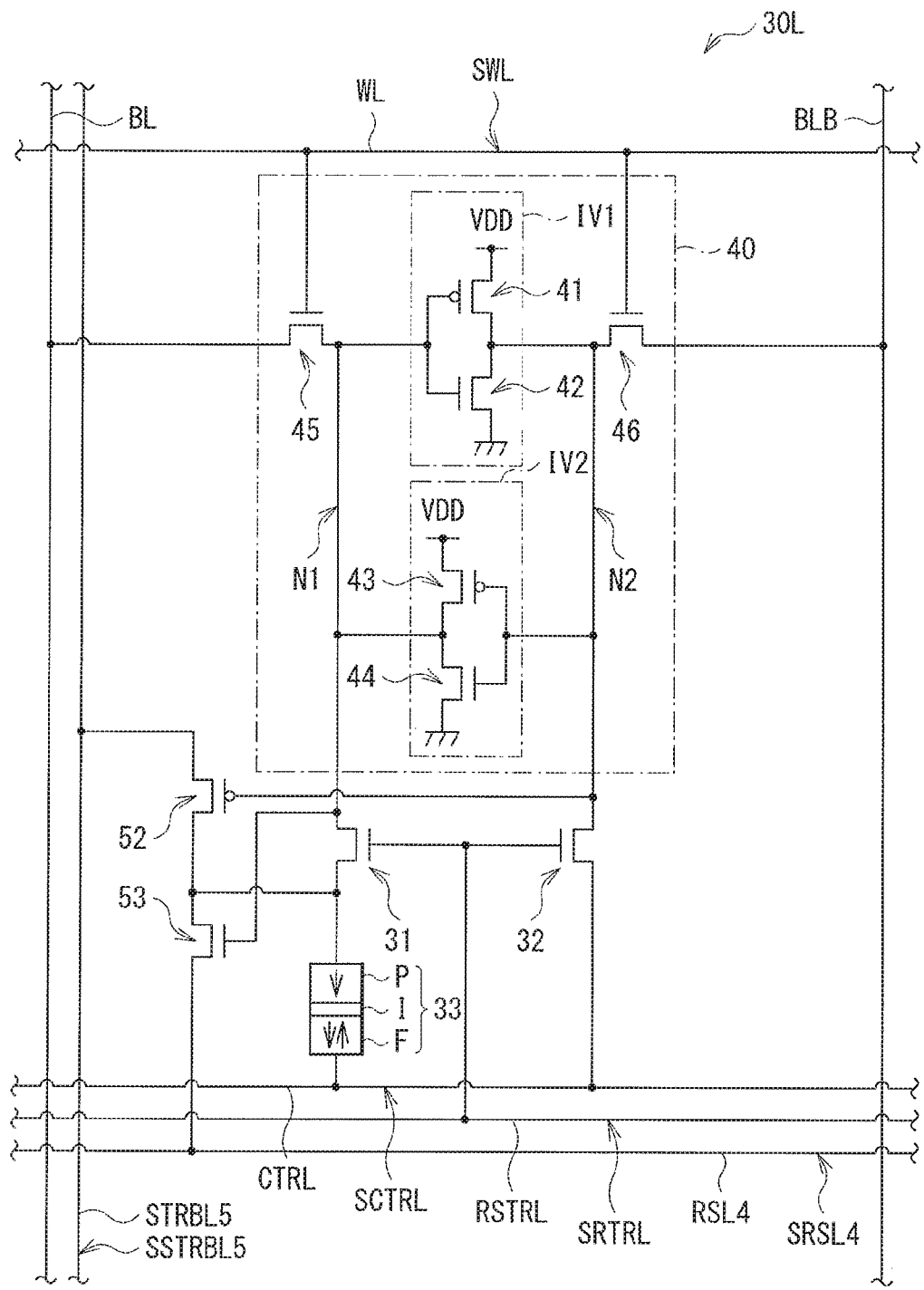

[FIG. 30]
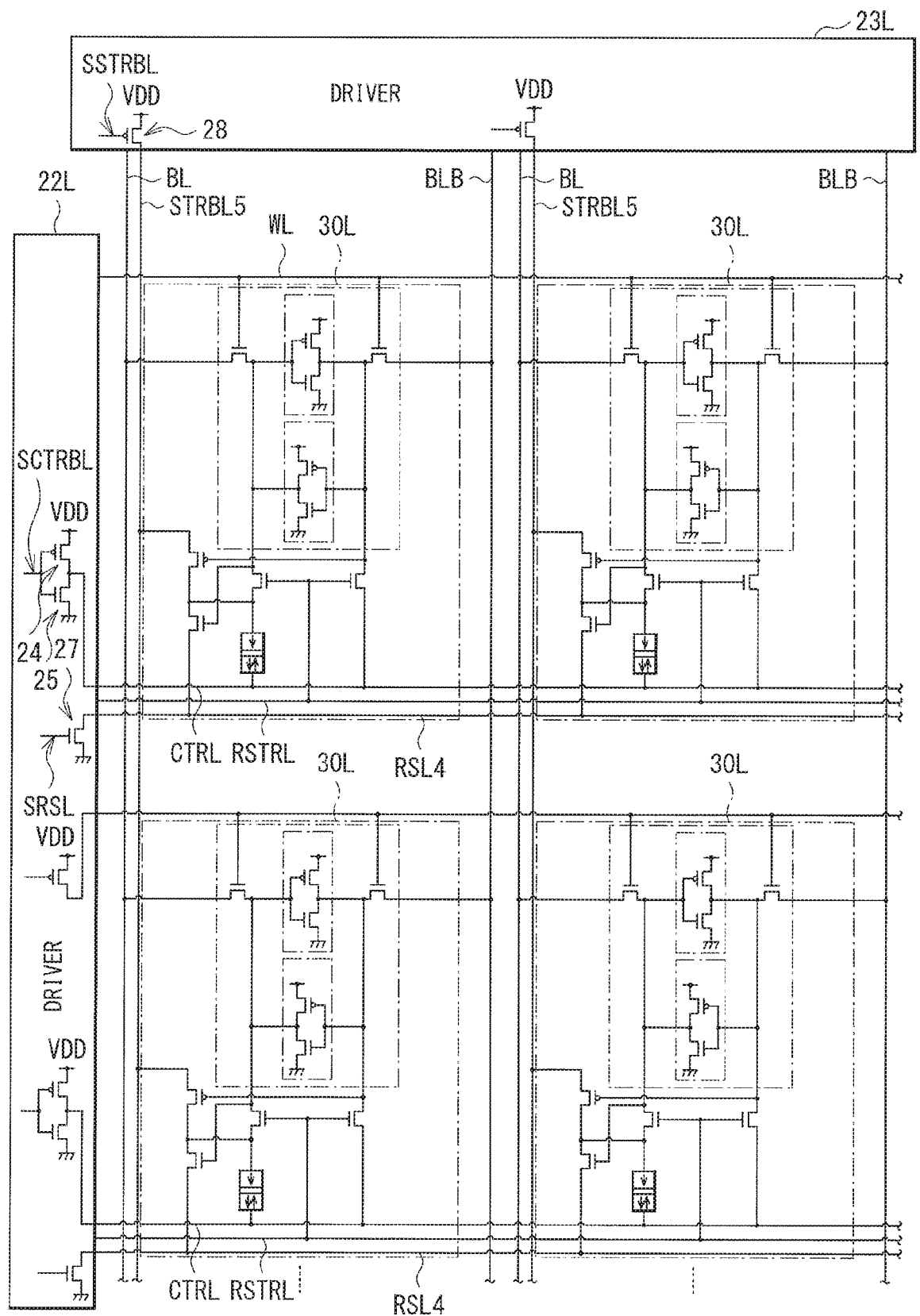

[ FIG. 31 ]
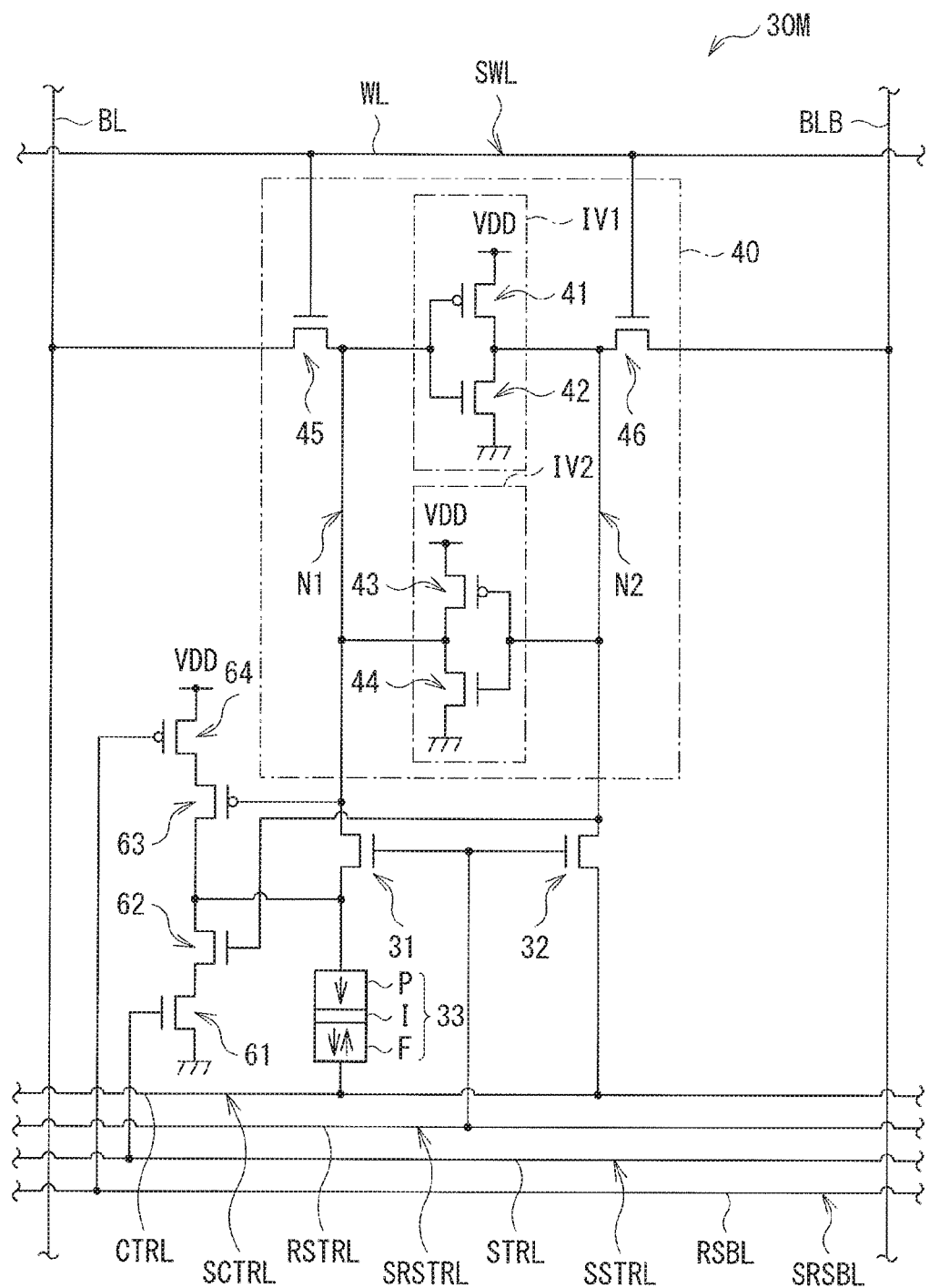

[ FIG. 32 ]
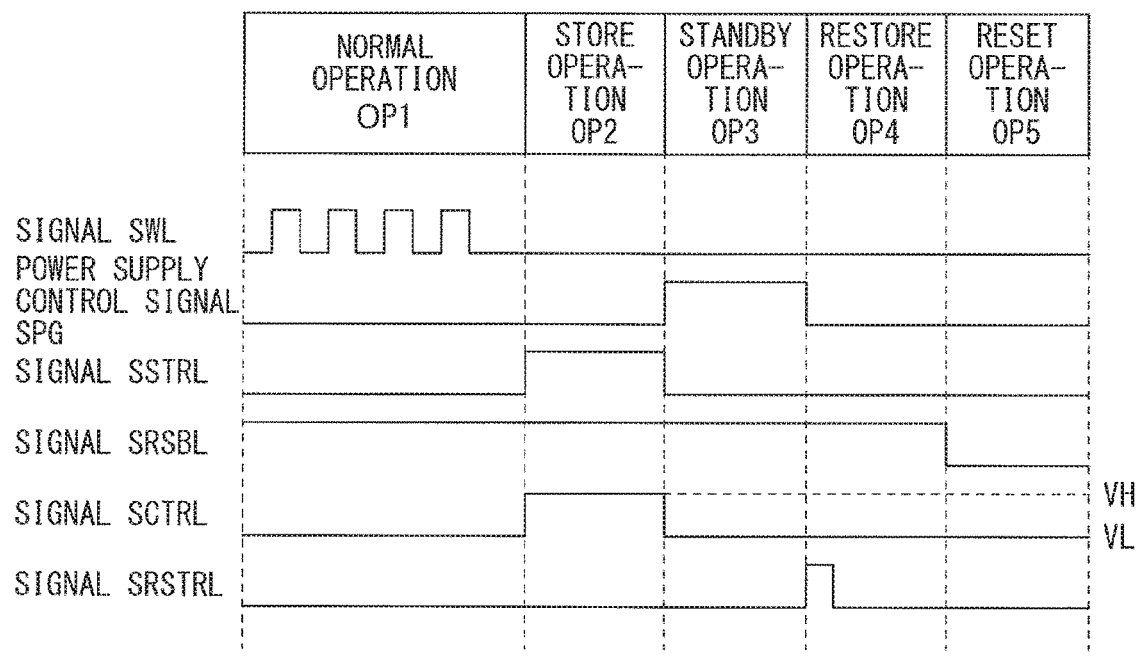
[ FIG. 33 ]
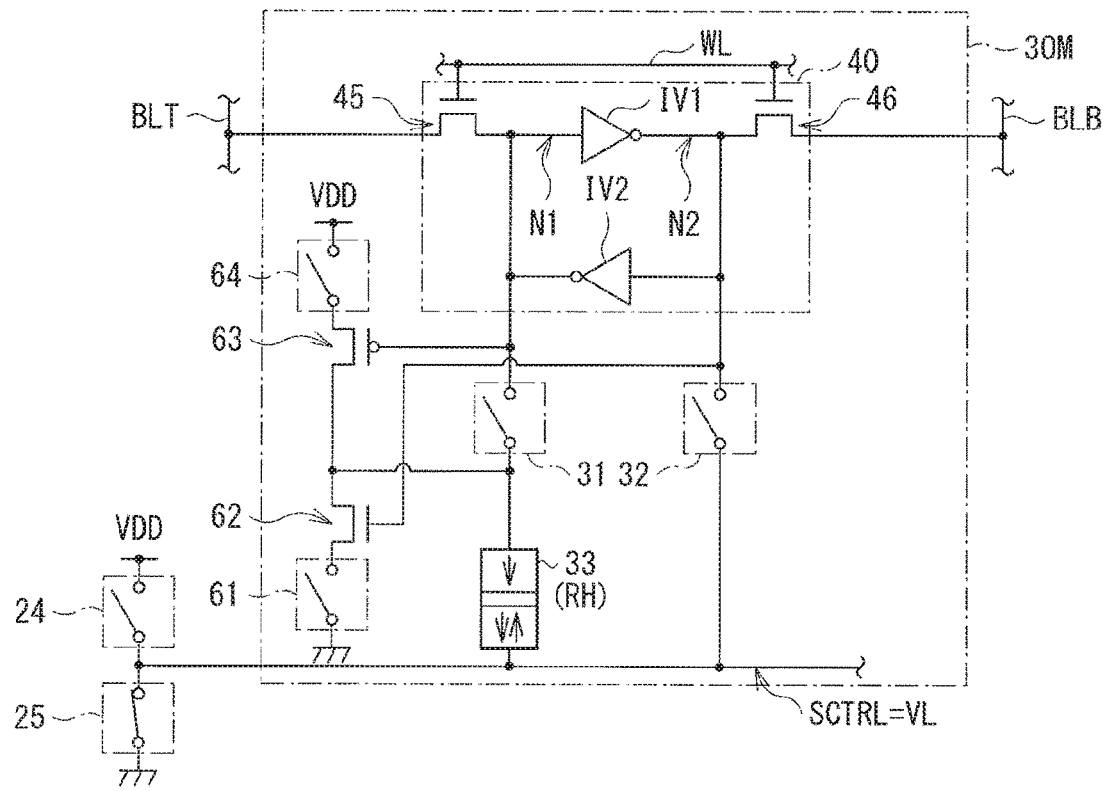

[ FIG. 34A ]
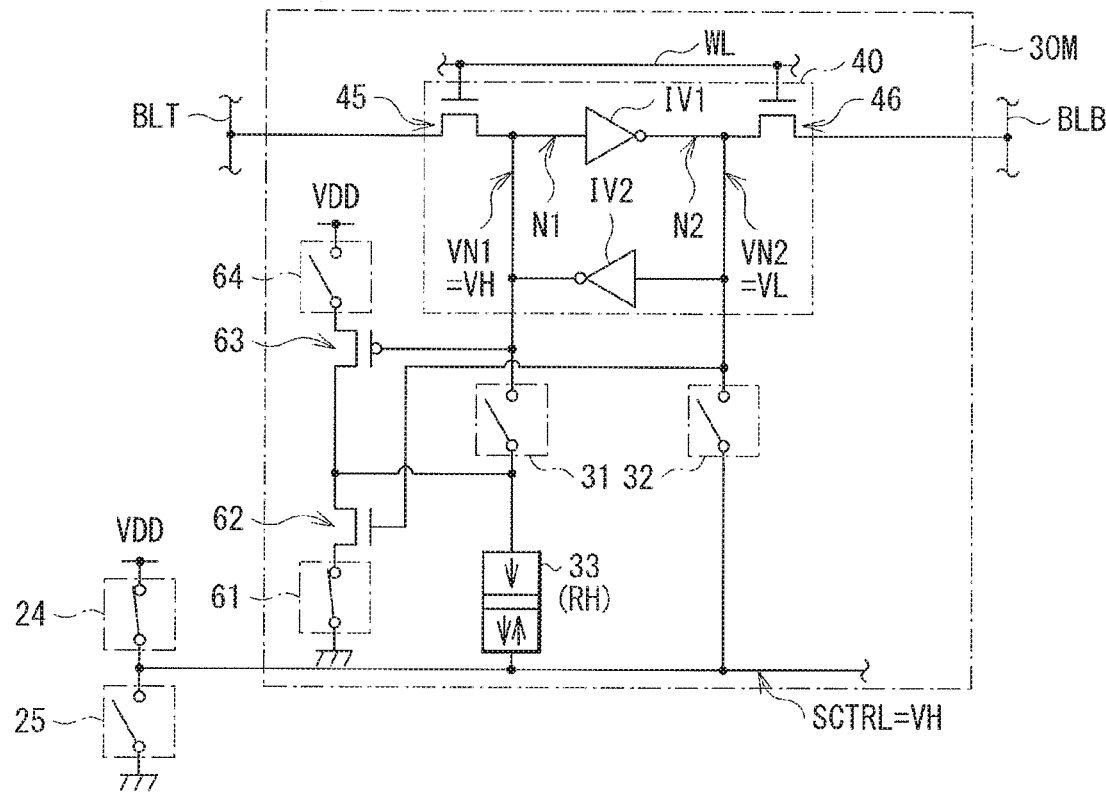
[ FIG. 34B ]
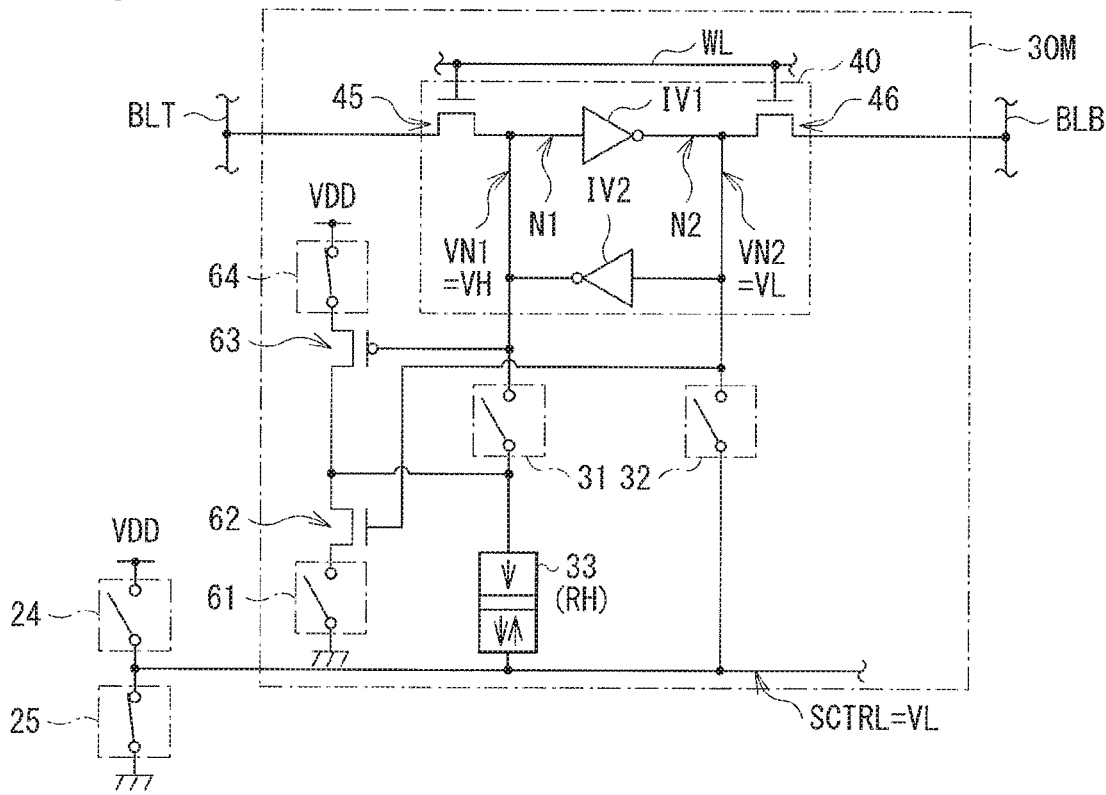

[ FIG. 35A ]
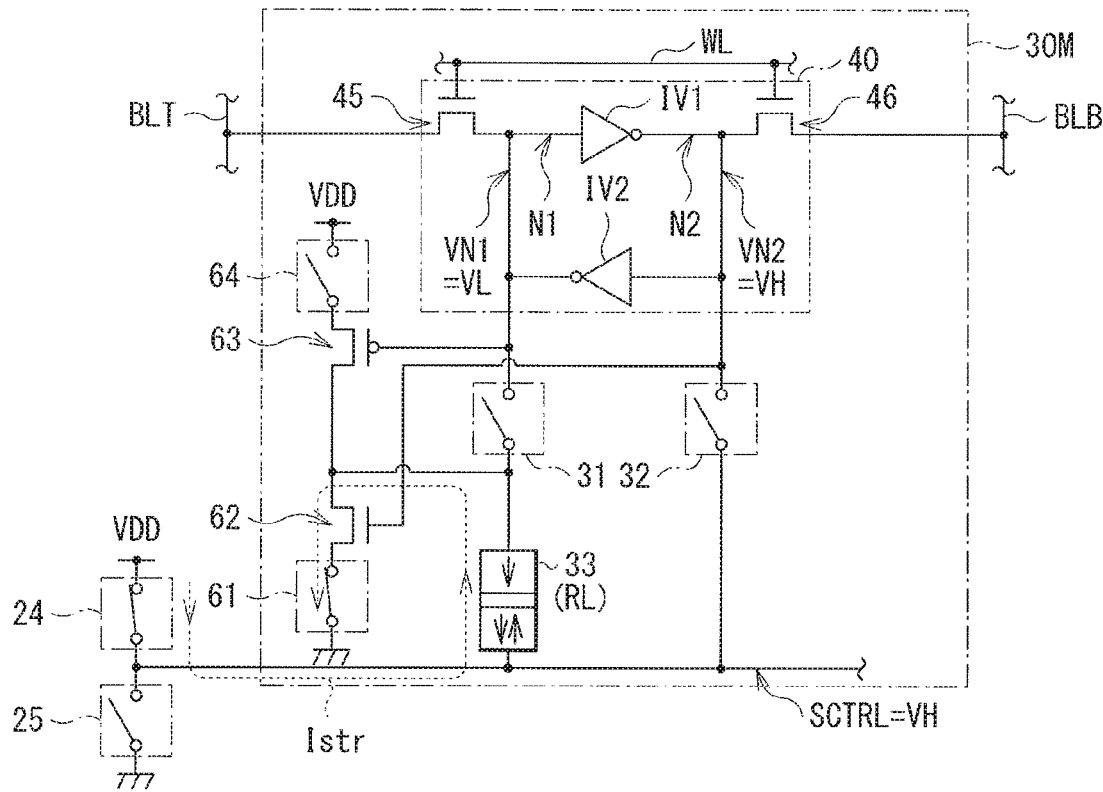
[ FIG. 35B ]
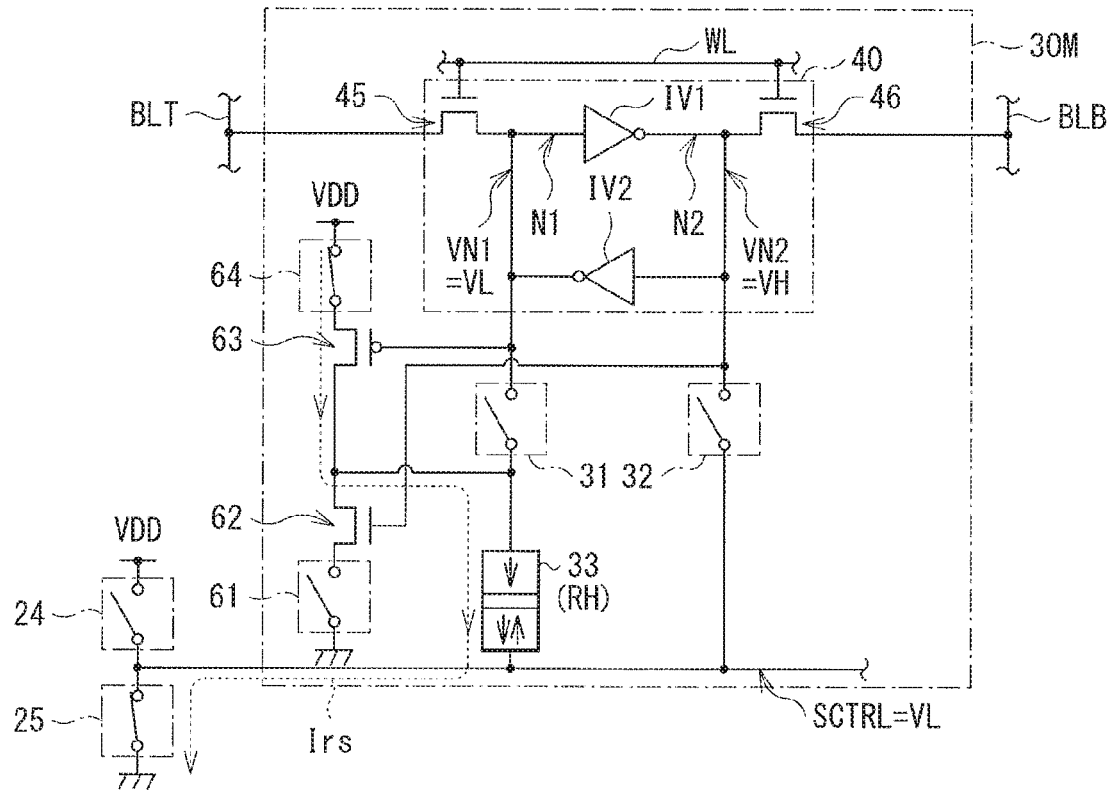

[FIG. 36]
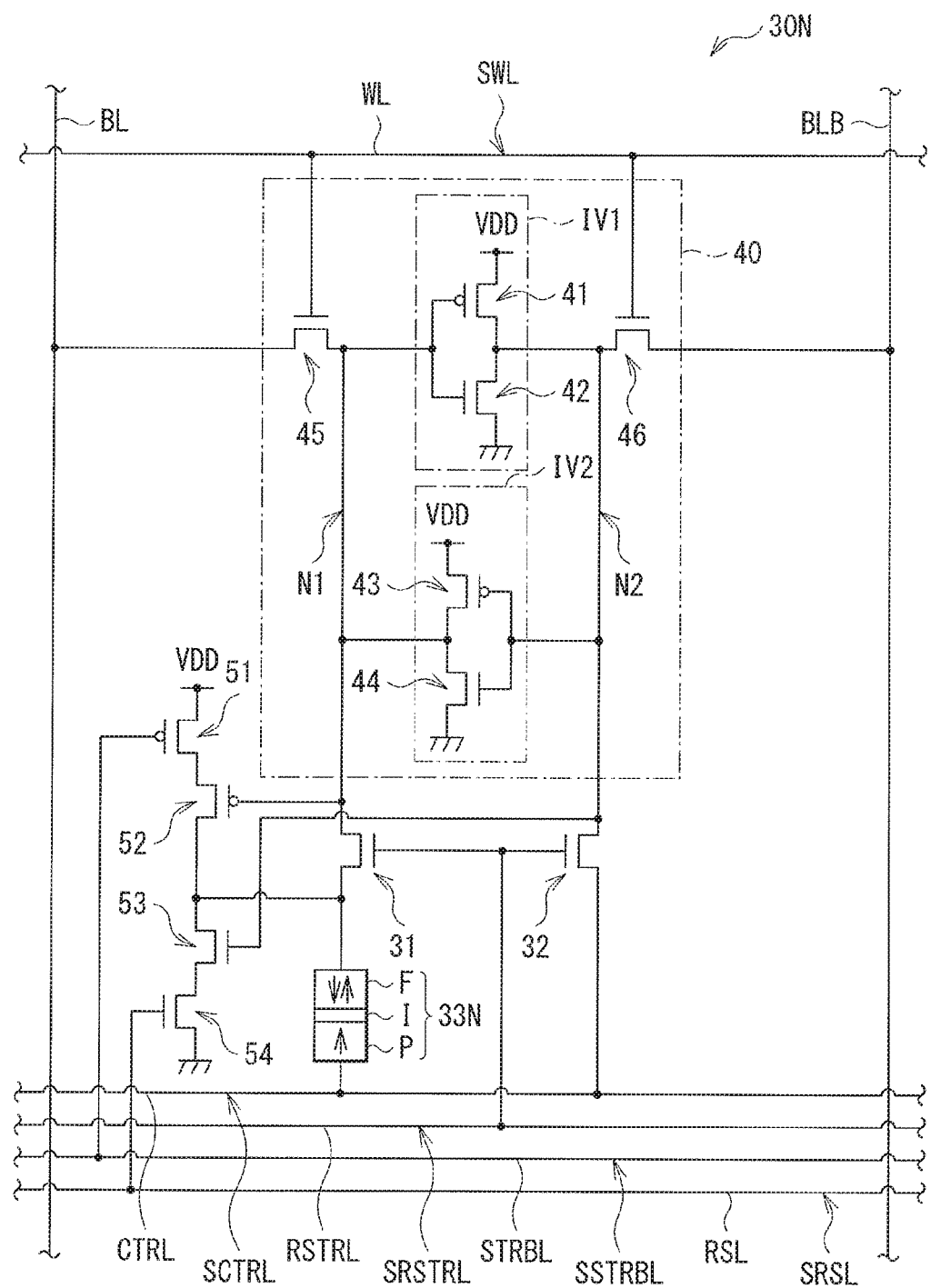

[ FIG. 37 ]
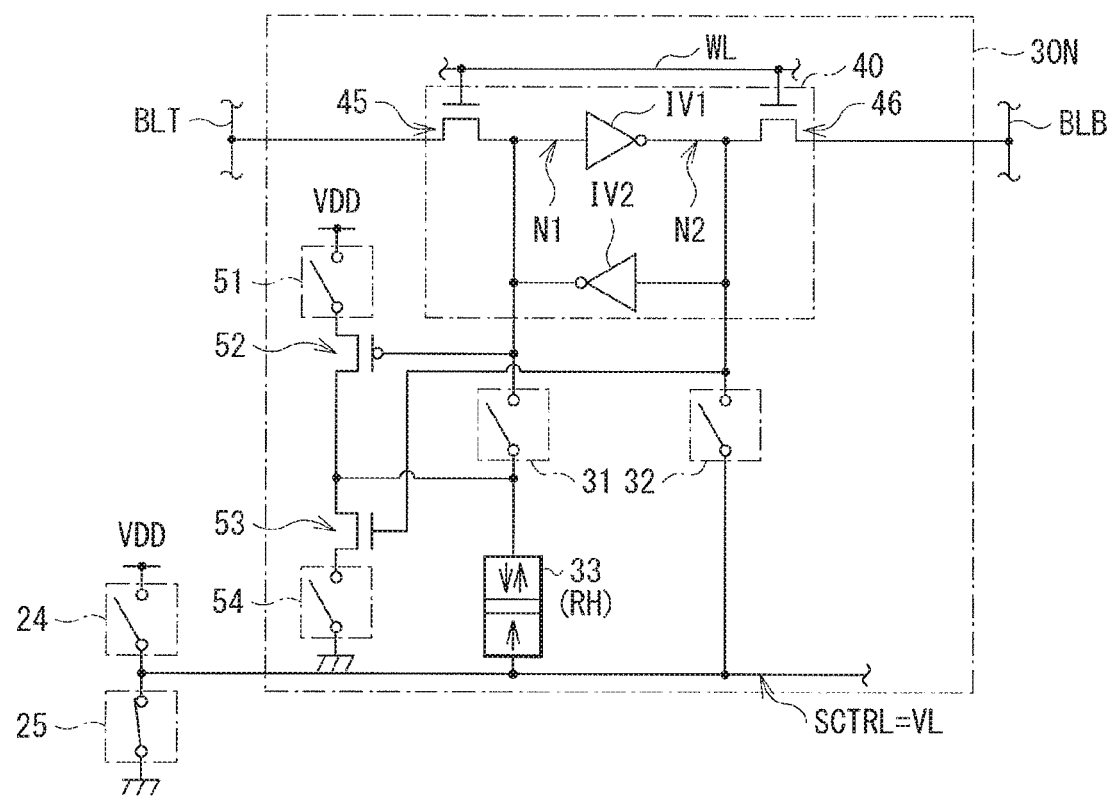

[ FIG. 38A ]
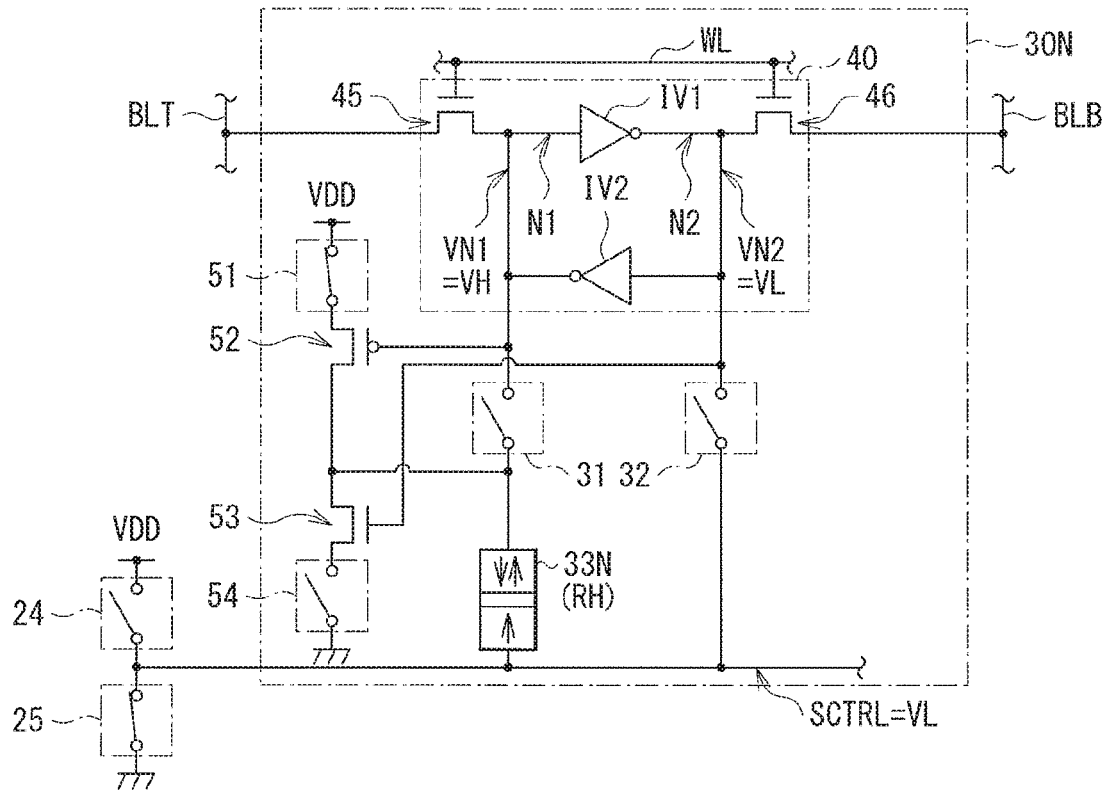
[ FIG. 38B ]
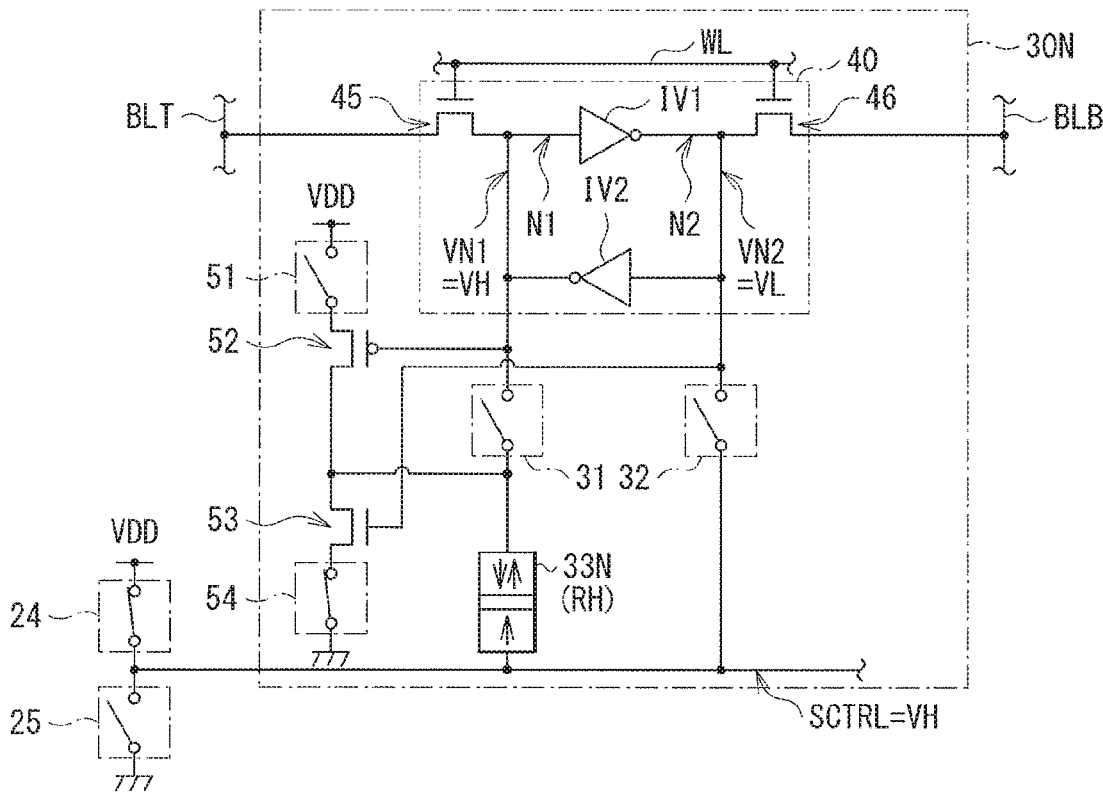

[FIG. 39A]
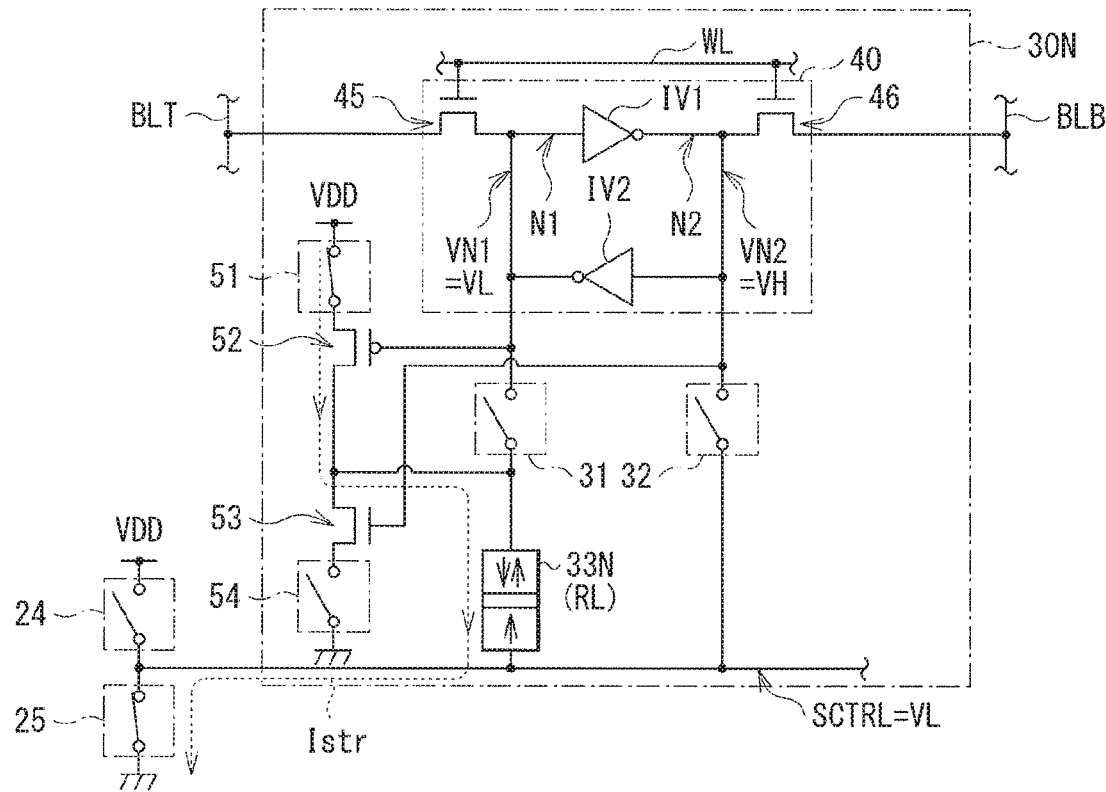
[FIG. 39B]
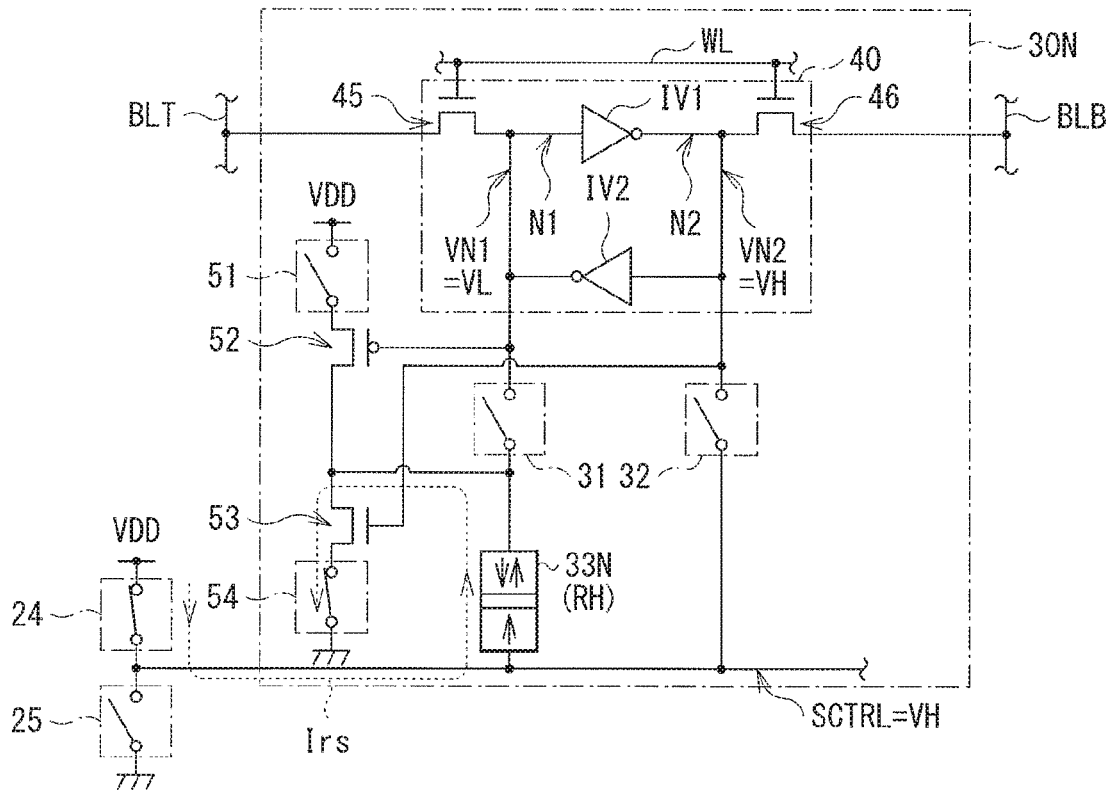

[FIG. 40]
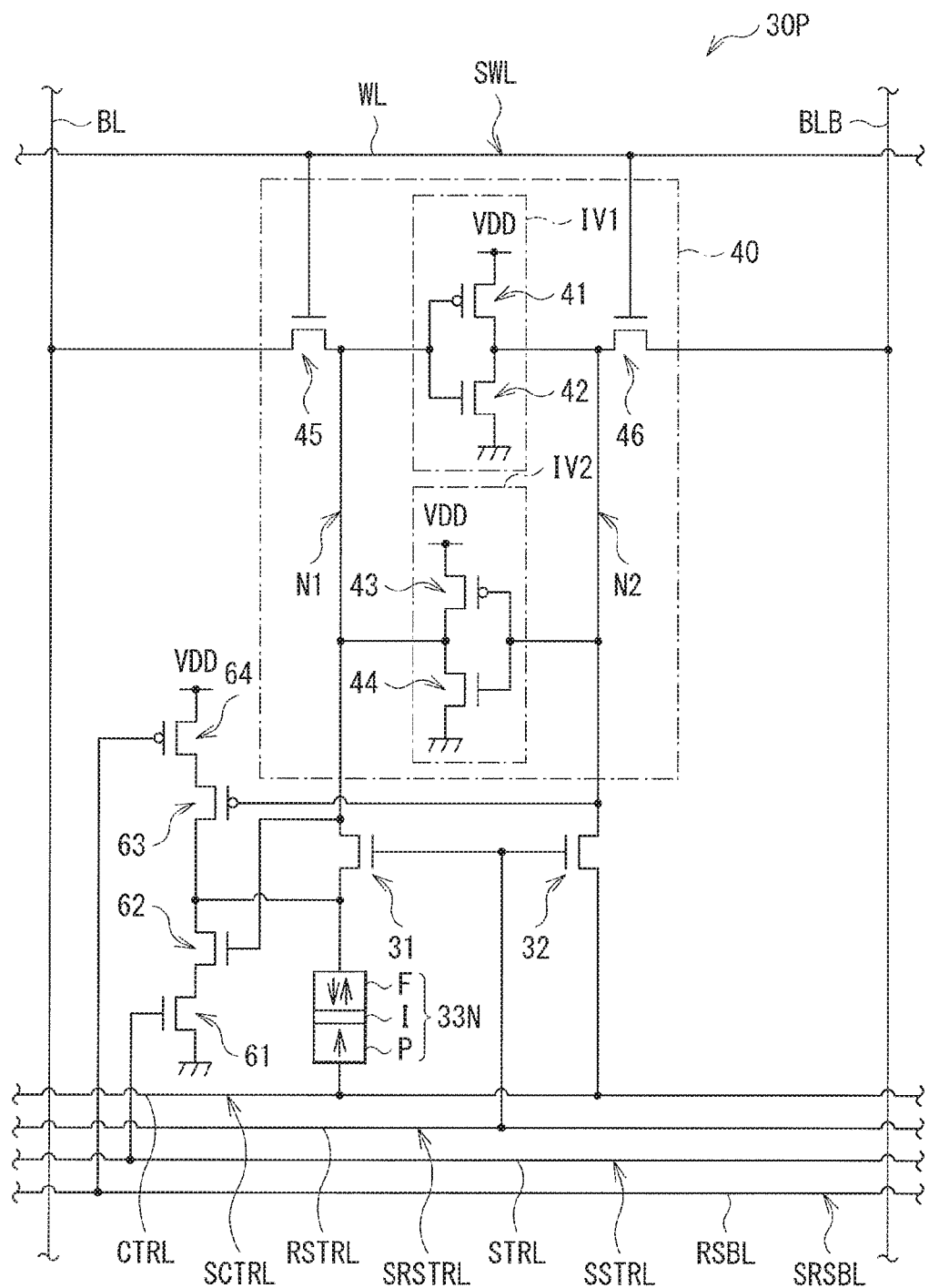

[FIG. 41]
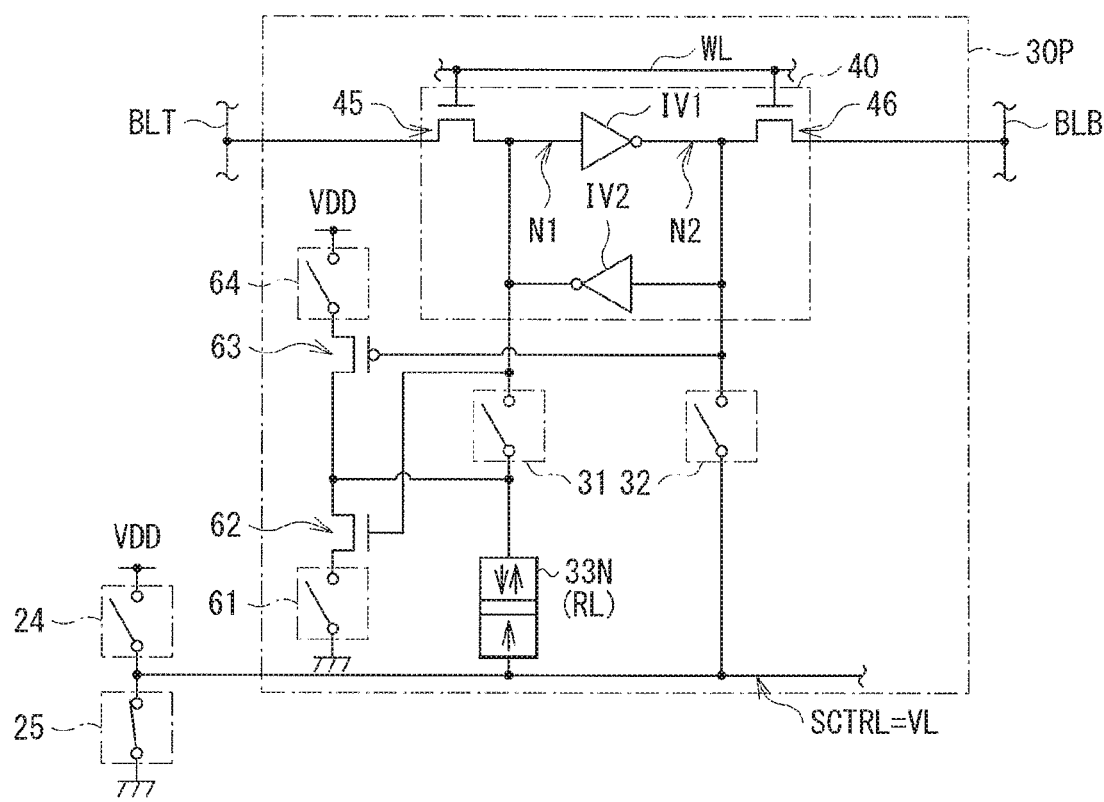

[ FIG. 42A ]
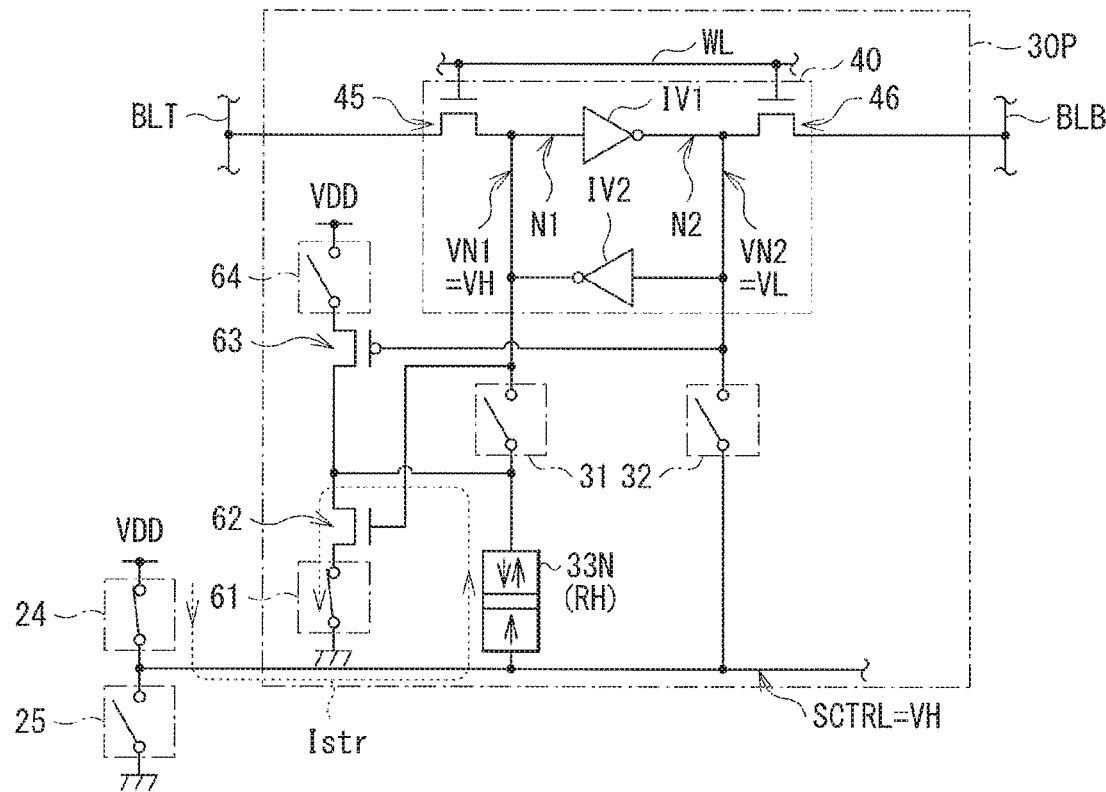
[ FIG. 42B ]
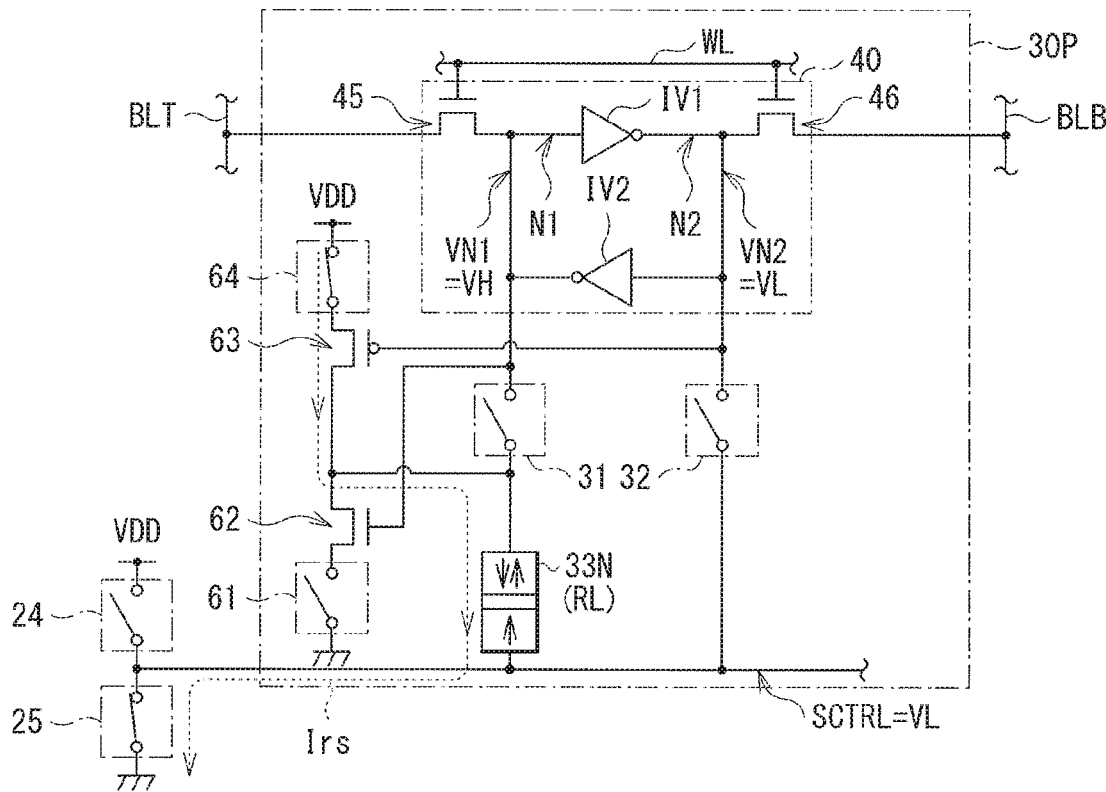

[ FIG. 43A ]
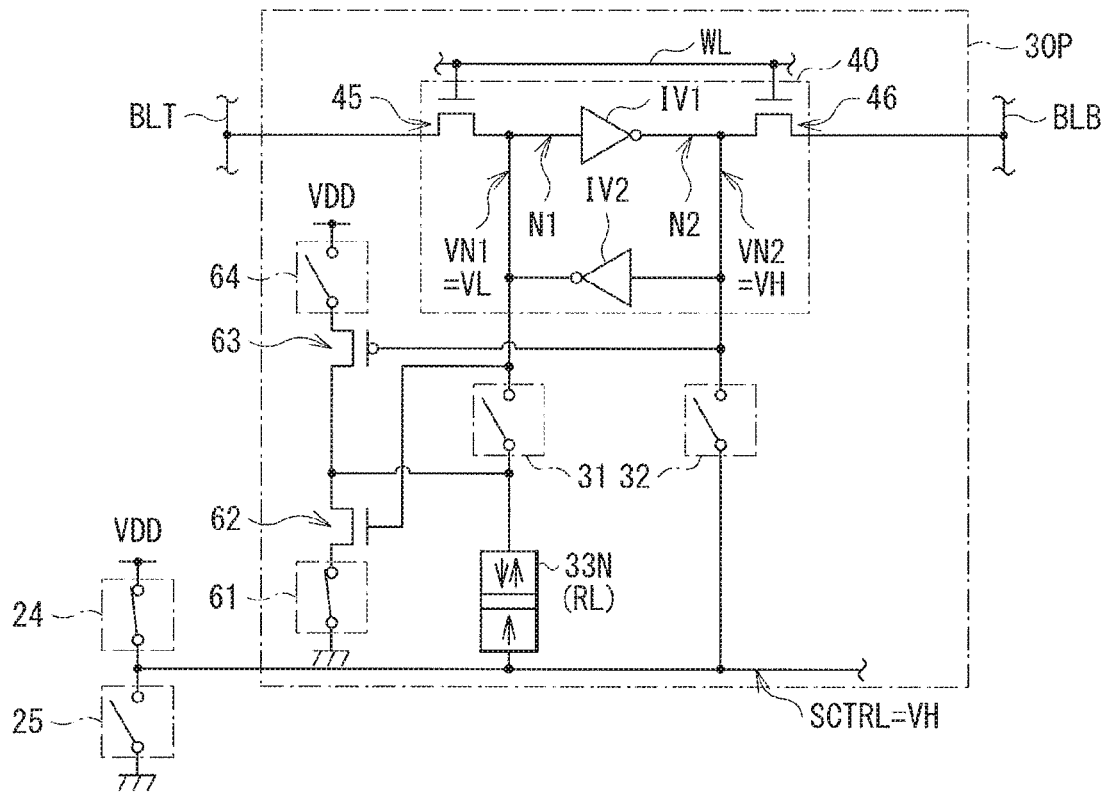
[ FIG. 43B ]
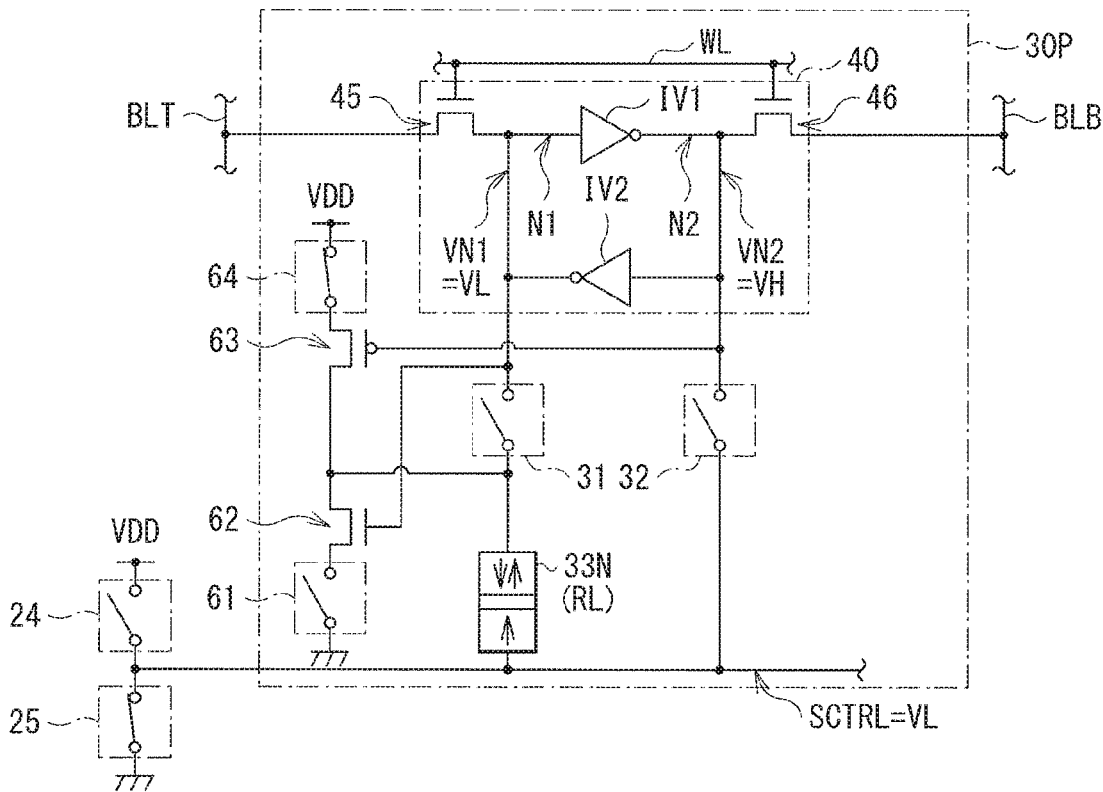

[FIG. 44]
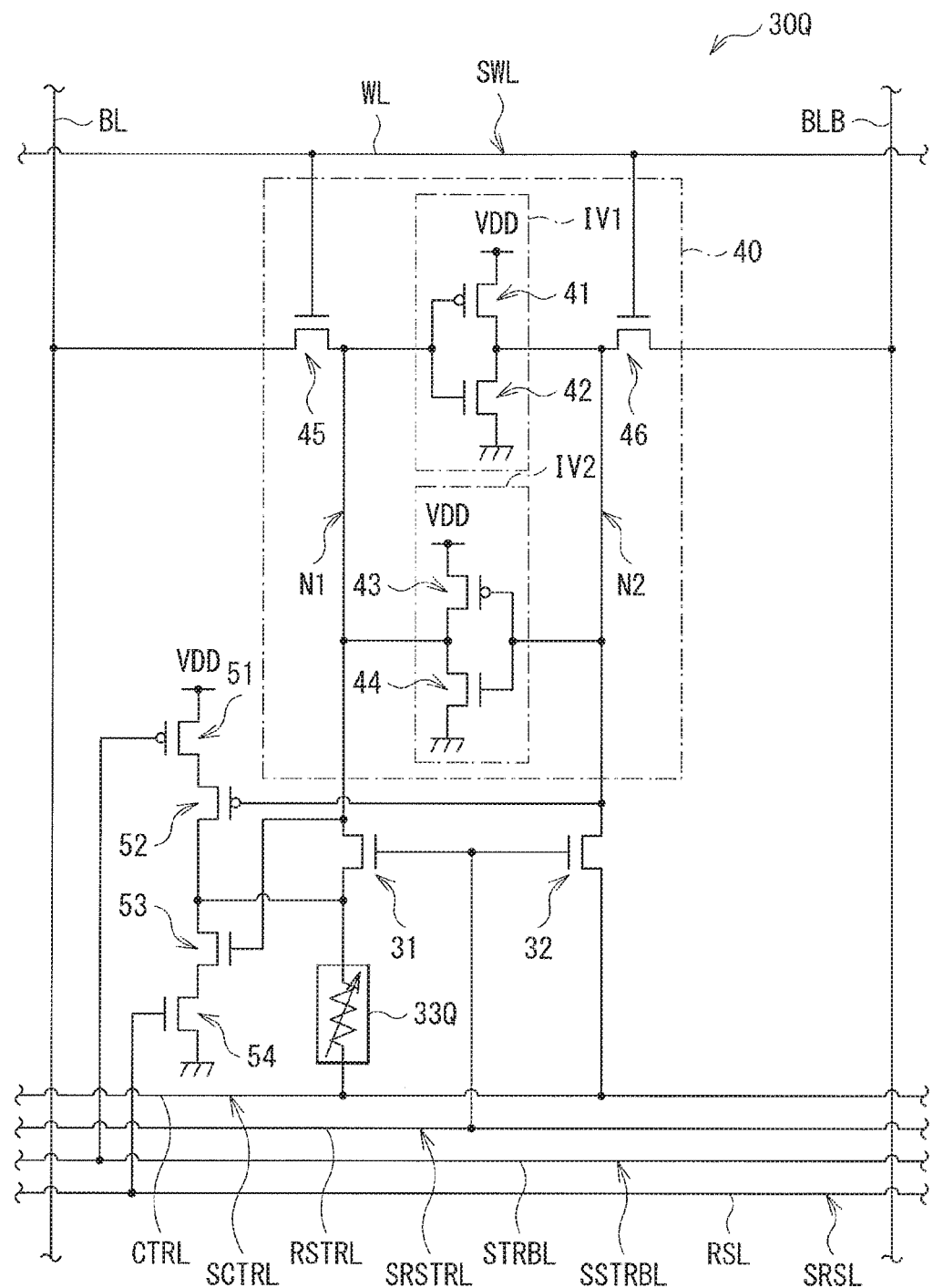

[FIG. 45]
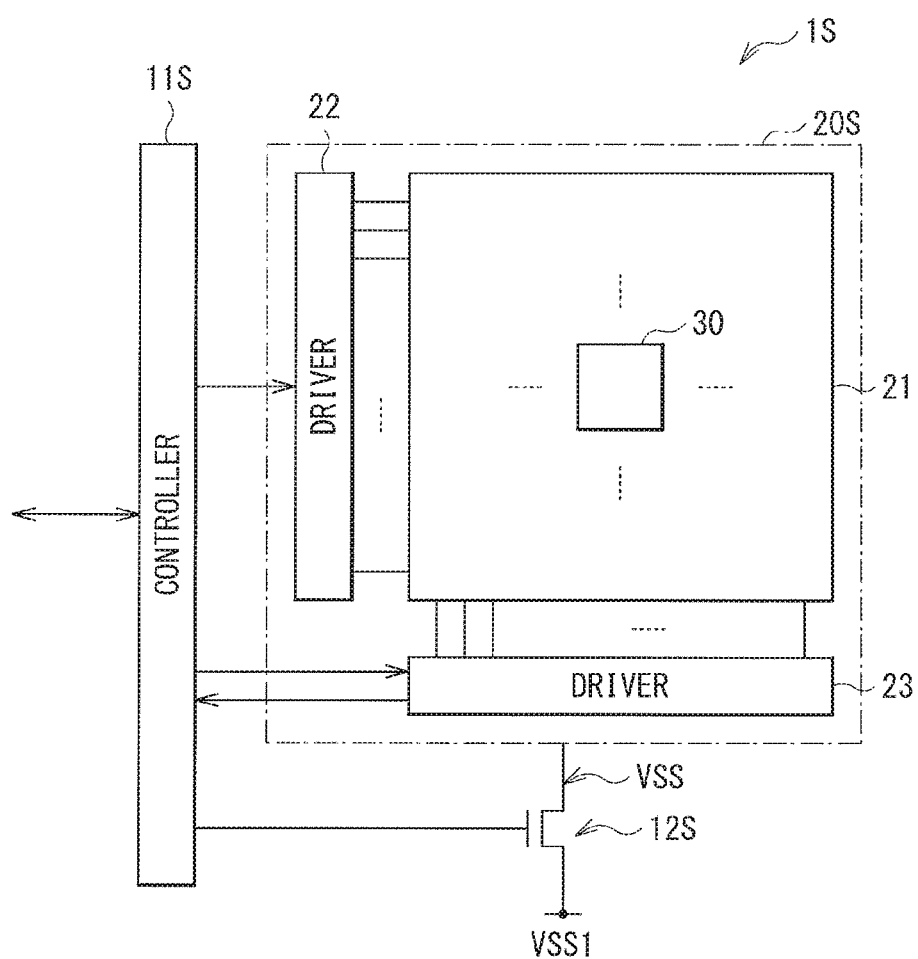

[ FIG. 46 ]
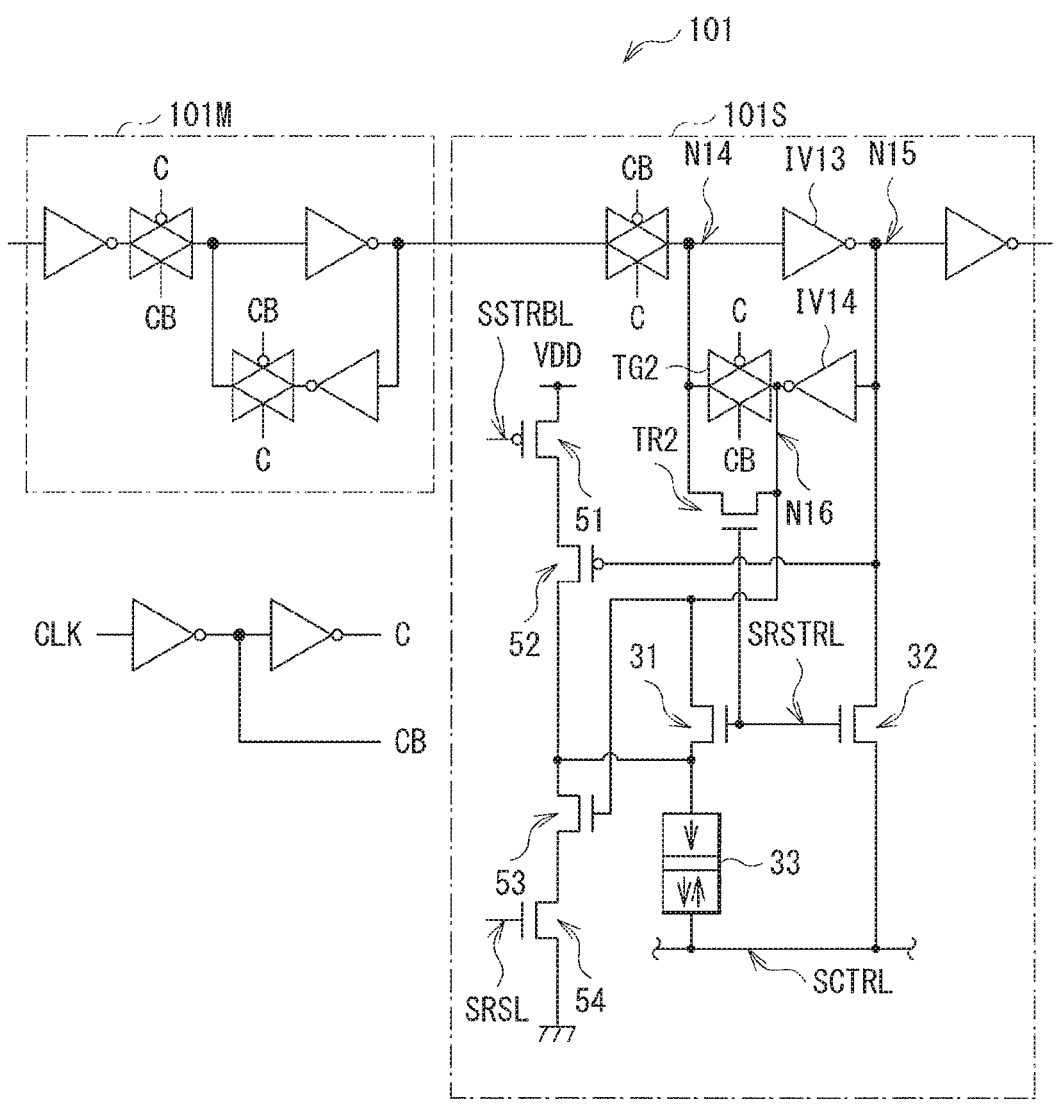

[ FIG. 47 ]
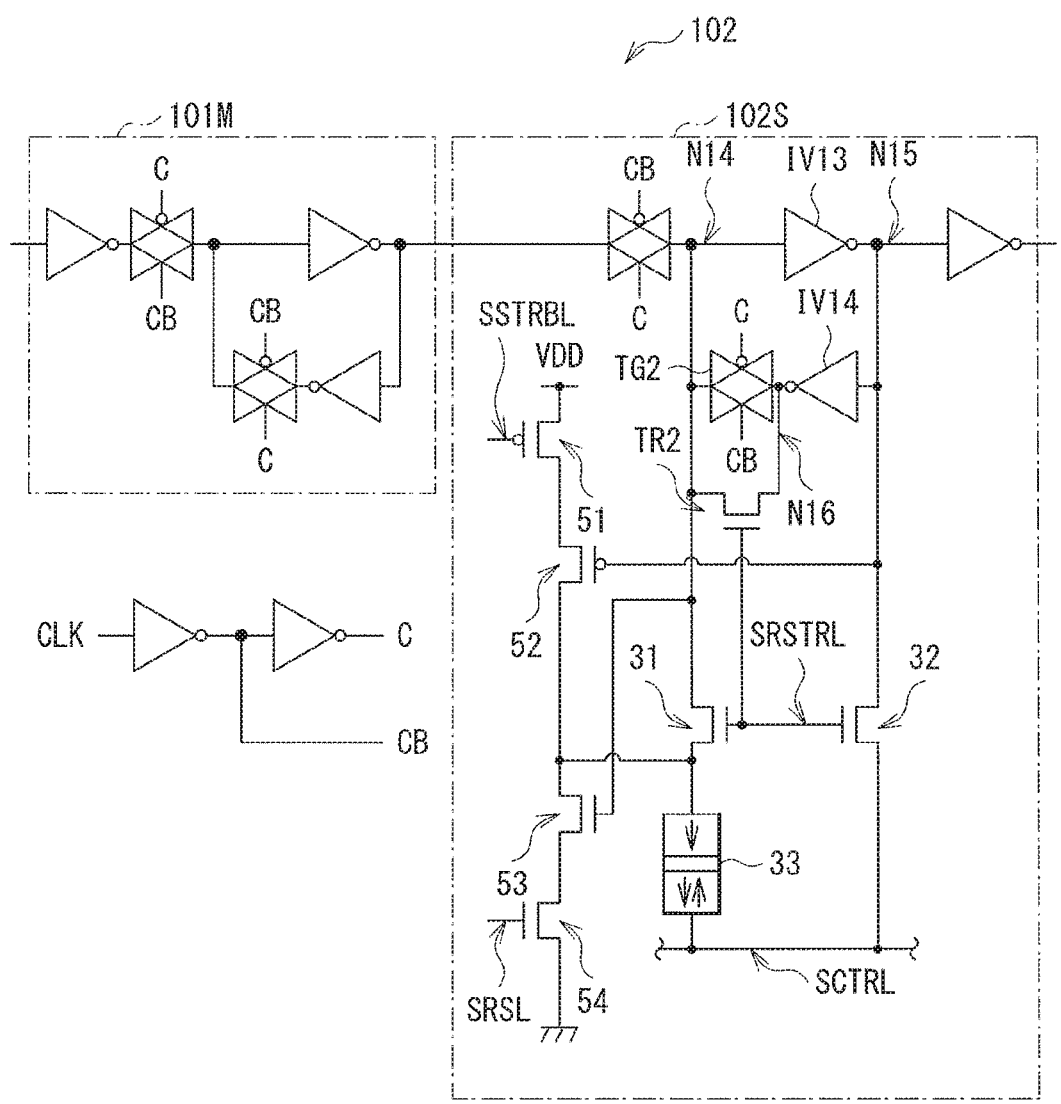

[FIG. 48]
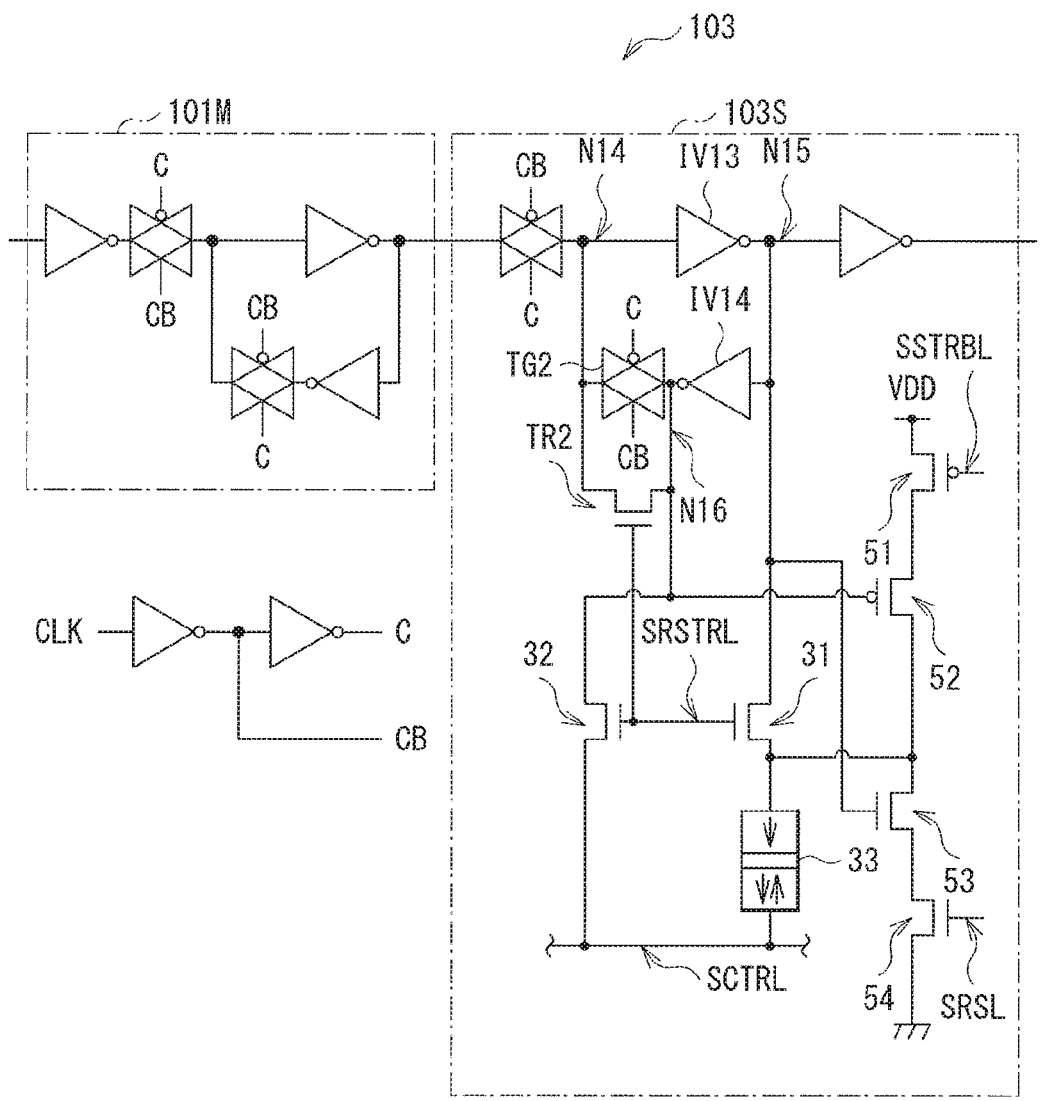

[FIG. 49]
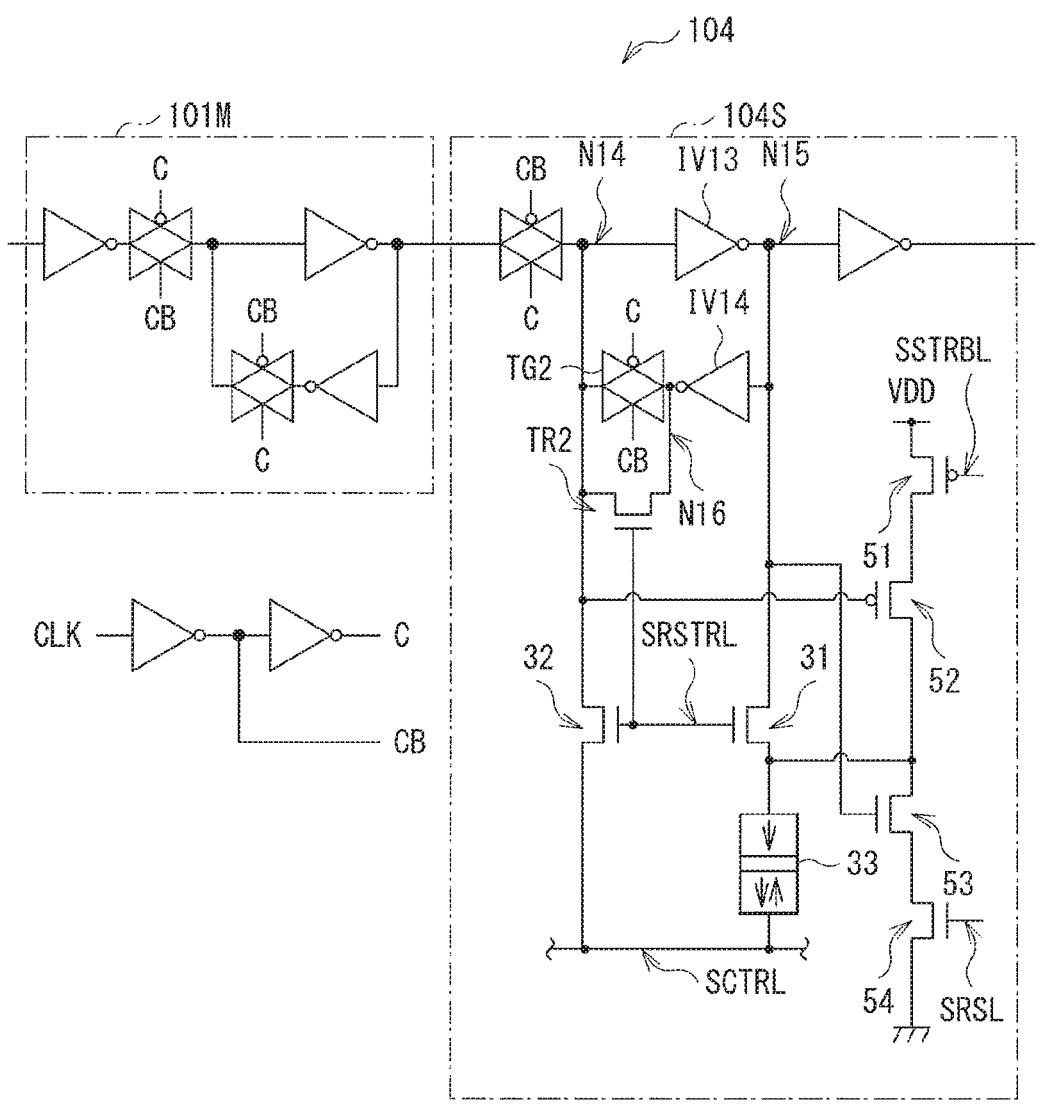

[FIG. 50]
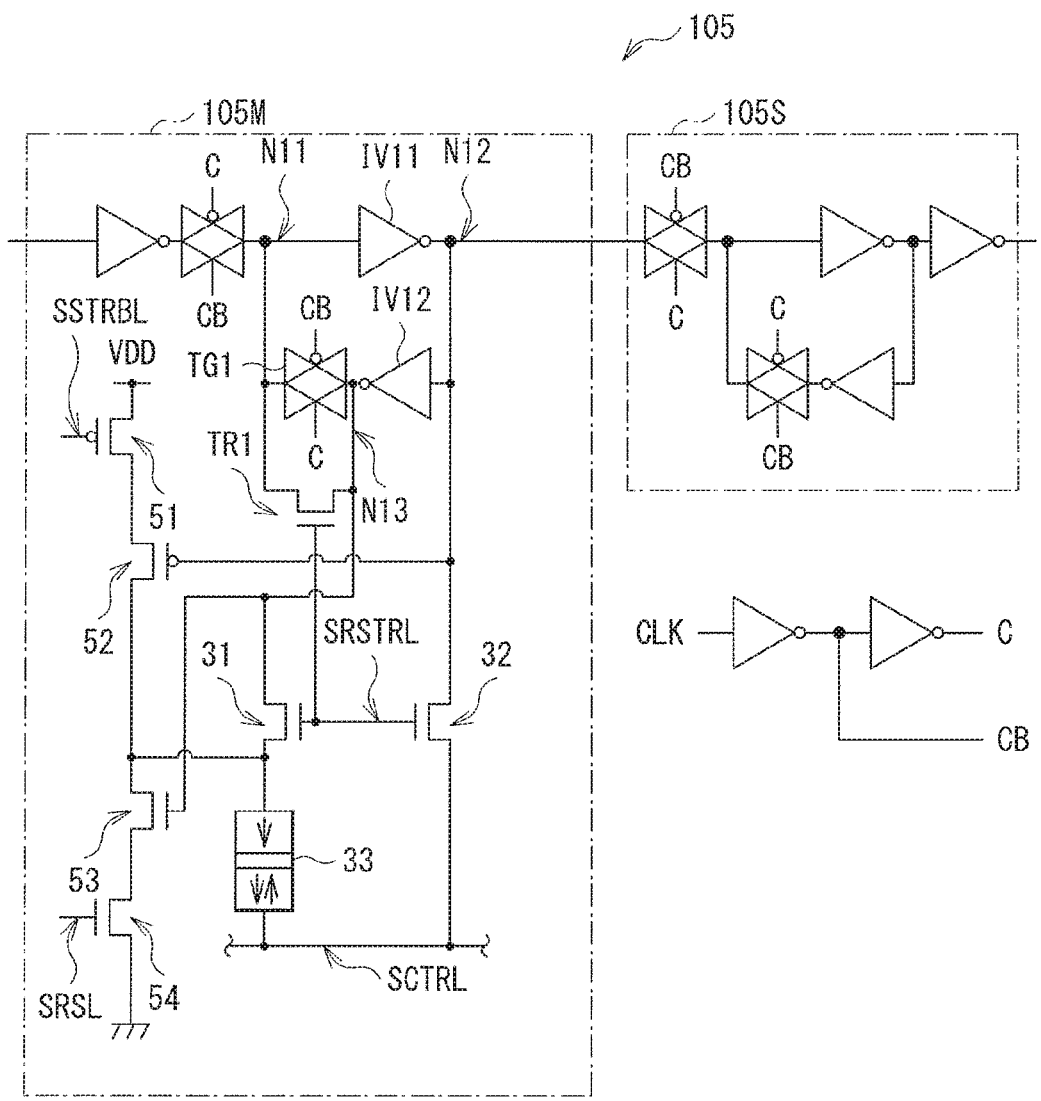

[FIG. 51]
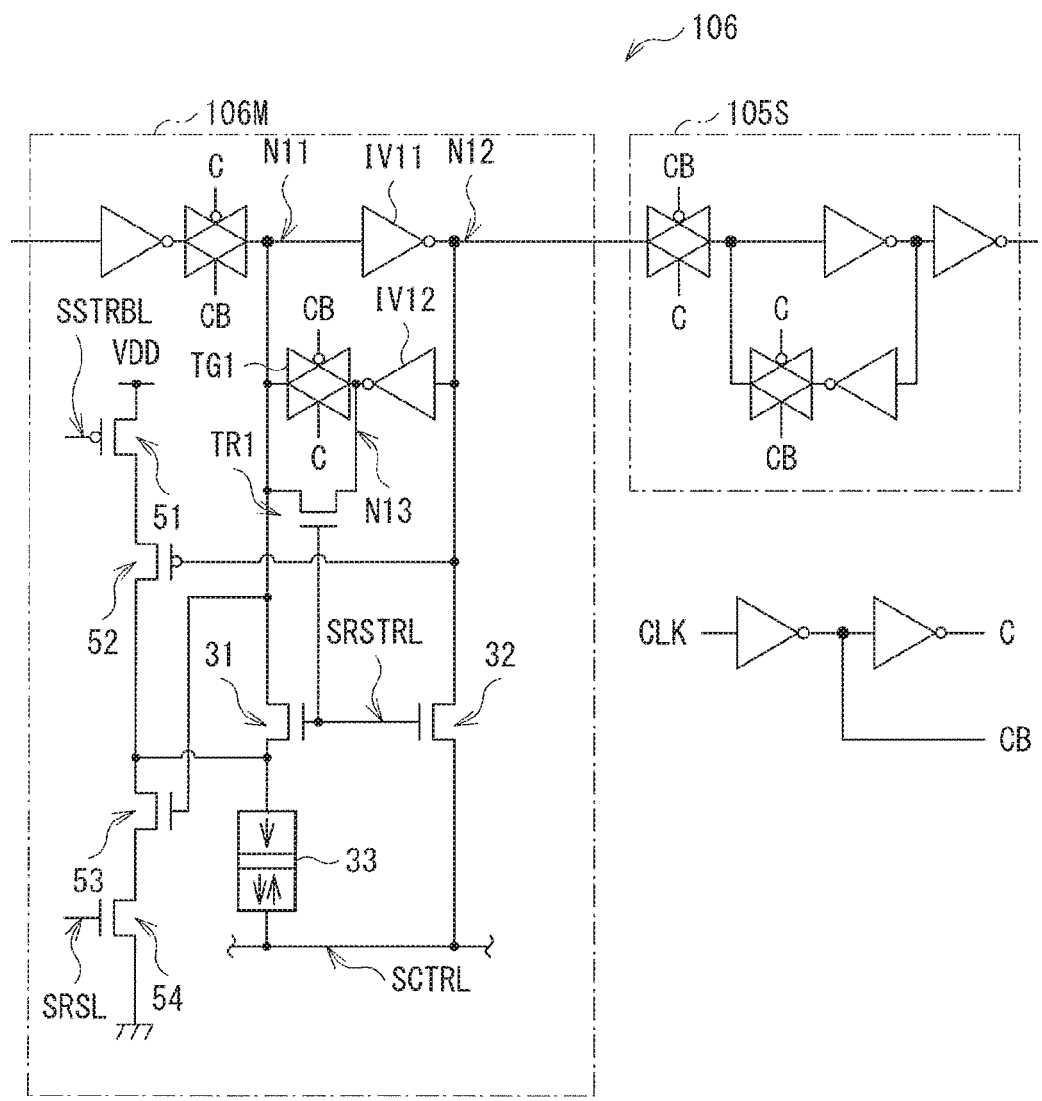

[FIG. 52]
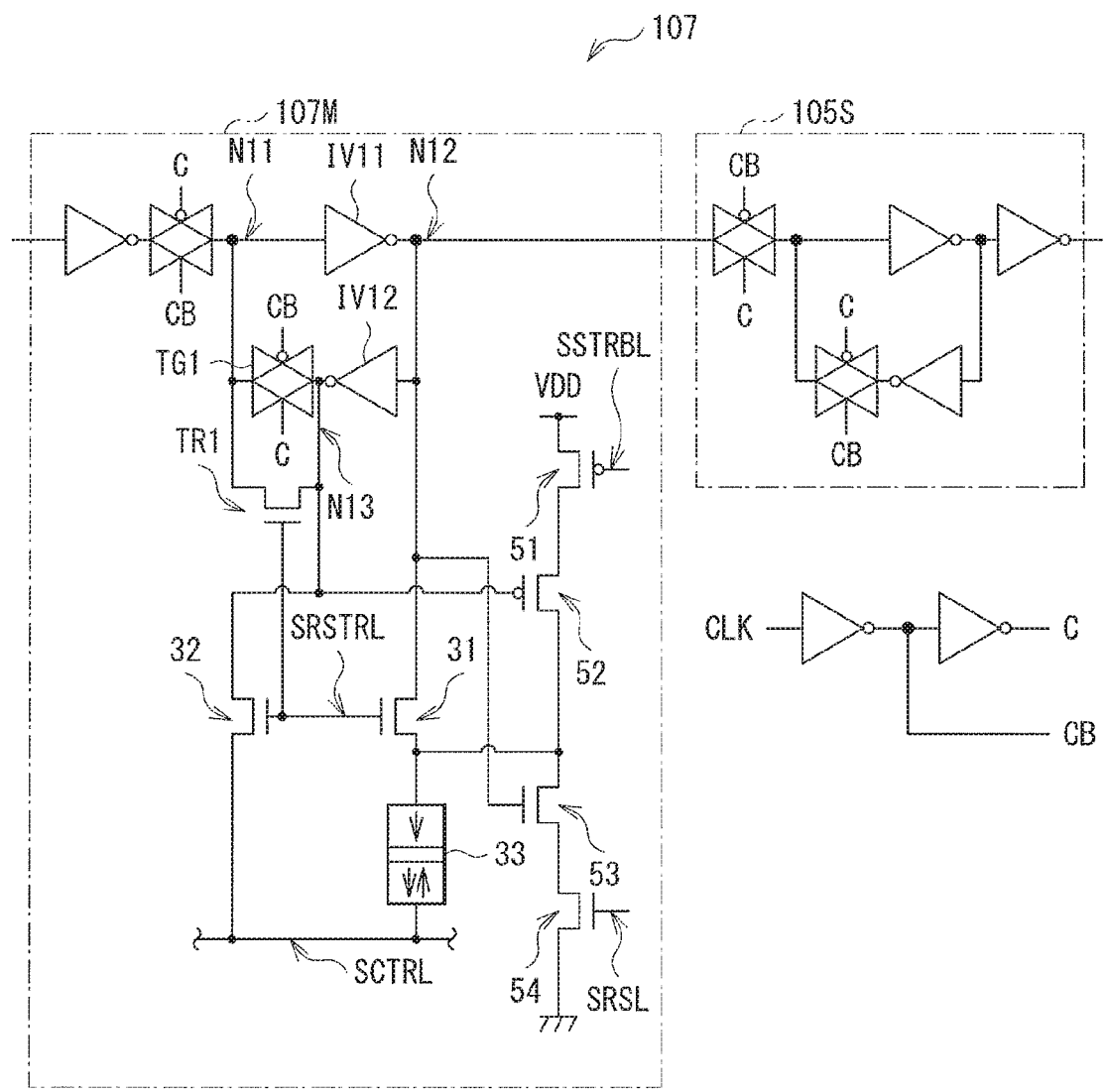

[FIG. 53]
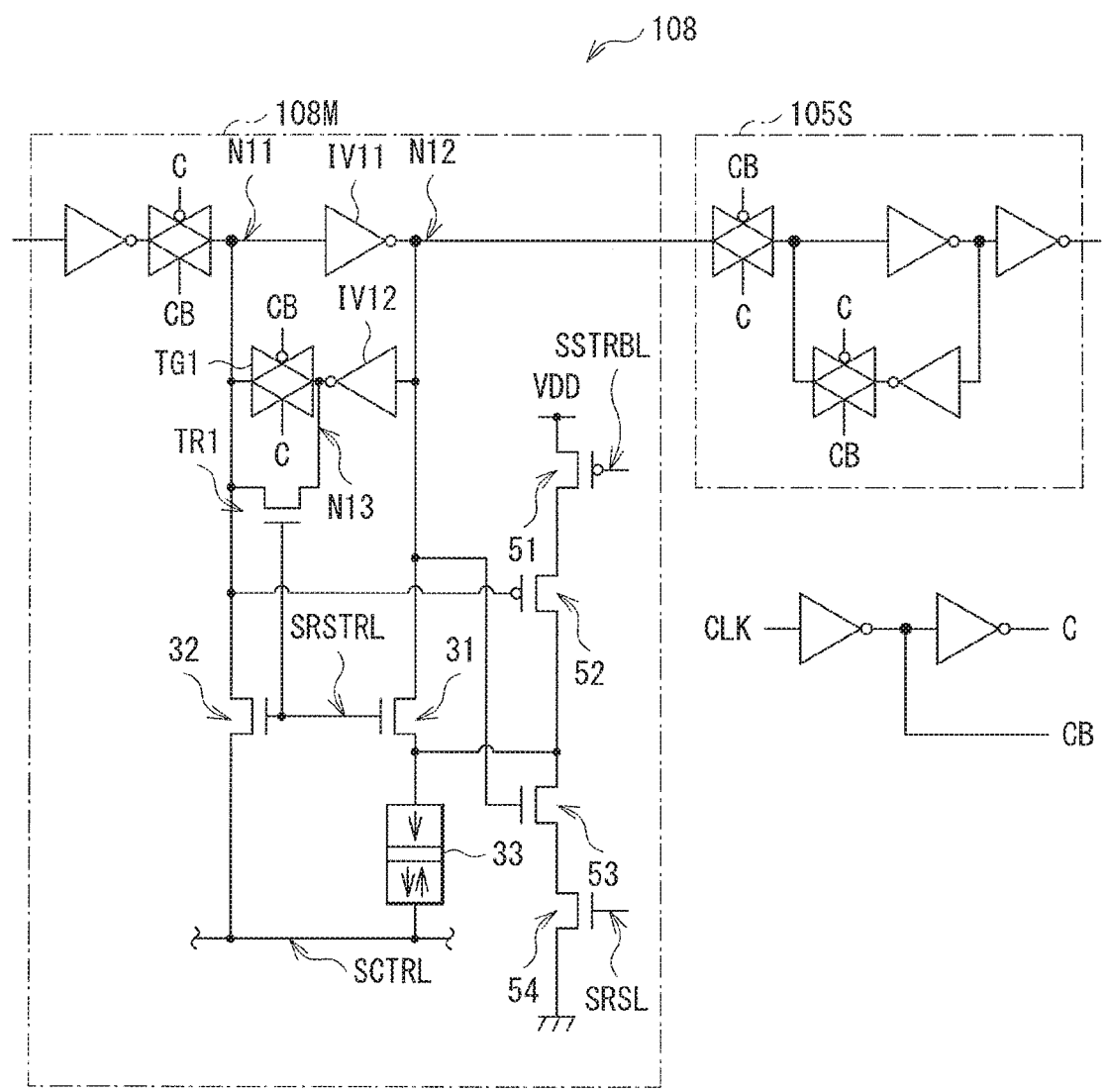

[ FIG. 54 ]
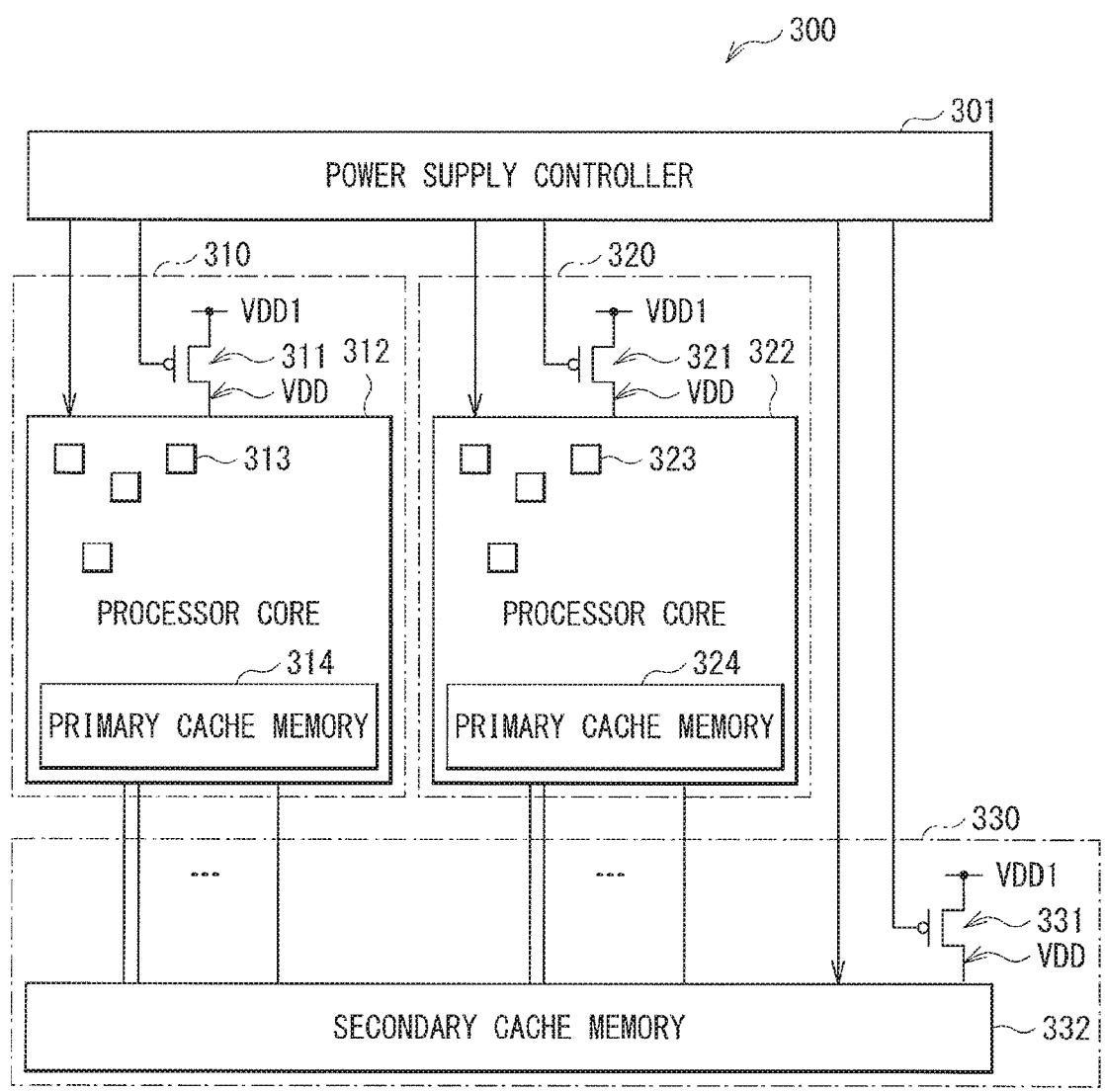

[ FIG. 55 ]
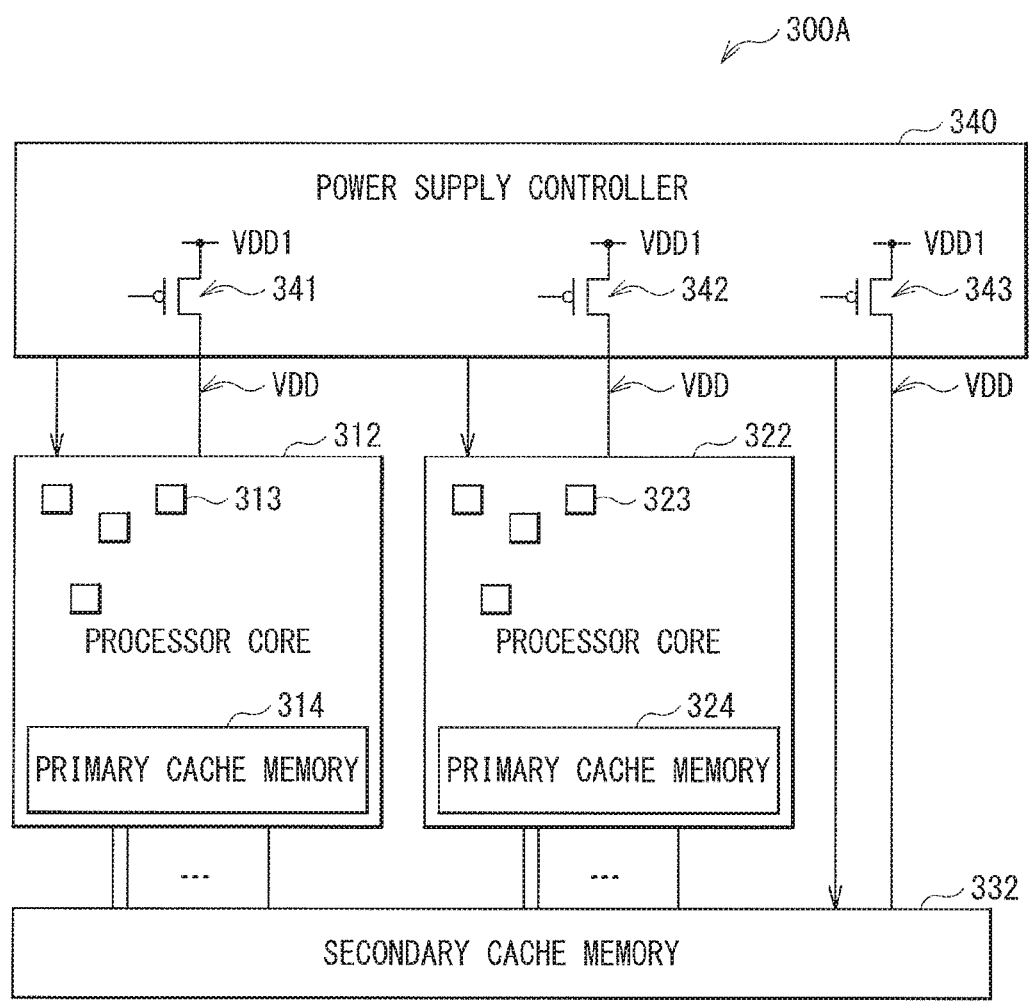

SEMICONDUCTOR CIRCUIT AND SEMICONDUCTOR CIRCUIT SYSTEM TO SUPPRESS DISTURBANCE IN THE SEMICONDUCTOR CIRCUIT

CROSS REFERENCE TO RELATED APPLICATIONS

This application is a U.S. National Phase of International Patent Application No. PCT/JP2018/044033 filed on Nov. 29, 2018, which claims priority benefit of Japanese Patent Application No. JP 2017-237980 filed in the Japan Patent Office on Dec. 12, 2017. Each of the above-referenced applications is hereby incorporated herein by reference in its entirety.

TECHNICAL FIELD

The present disclosure relates to a semiconductor circuit and a semiconductor circuit system.

BACKGROUND ART

Electronic devices are desired to have low power consumption from the viewpoint of ecology. For semiconductor circuits, for example, a so-called power gating technique is often used in which power consumption is reduced by selectively stopping power supply to a portion of the circuits. The circuits the power supply to which is stopped in this manner are desired to return to an operation state in which the power supply has not yet been stopped, immediately after the power supply is restarted. One method of achieving such a short-time return operation is to incorporate a nonvolatile memory element in a circuit. For example, PTL 1 discloses a circuit in which an SRAM (Static Random Access Memory) that is a volatile memory and a spin transfer torque type memory element are combined.

CITATION LIST

Patent Literature

PTL 1: International Publication No. WO 2009/028298
PTL 2: Japanese Unexamined Patent Application Publication No. 2013-30249

SUMMARY OF THE INVENTION

Incidentally, it is desired that a circuit including such memory elements be less likely to have disturbance, and a further improvement is expected.

It is desirable to provide a semiconductor circuit and a semiconductor circuit system that make it possible to suppress disturbance.

A semiconductor circuit according to an embodiment of the present disclosure includes a first circuit, a second circuit, a first transistor, a first memory element, a second transistor, a third transistor, and a driver. The first circuit is configured to generate an inverted voltage of a voltage at a first node and apply the inverted voltage to a second node. The second circuit is configured to generate an inverted voltage of a voltage at the second node and apply the inverted voltage to the first node. The first transistor is configured to couple the first node to a third node by being turned on. The first memory element has a first terminal coupled to the third node and a second terminal to which a control voltage is to be applied, and is allowed to take a first resistance state or a second resistance state. The second transistor has a source to which a first voltage is to be applied, a drain coupled to the third node, and a gate coupled to a first predetermined node being one of the first node and the second node. The third transistor has a source to which a second voltage is to be applied, a drain coupled to the third node, and a gate coupled to a second predetermined node being the other of the first node and the second node. The driver is configured to control an operation of the first transistor and set the control voltage.

A semiconductor circuit system according to an embodiment of the present disclosure includes a memory section and a controller that controls power supply to the memory section. The memory section includes the above-described semiconductor circuit.

In the semiconductor circuit and the semiconductor circuit system according to the embodiments of the present disclosure, mutually inverted voltages appear at the first node and the second node by the first circuit and the second circuit. The first node is coupled to the third node by turning on the first transistor. The third node is coupled to one end of the first memory element. The control voltage is applied to another end of the first memory element. The third node is coupled to the drain of the second transistor and the drain of the third transistor. The first voltage is applied to the source of the second transistor, and the gate of the second transistor is coupled to the first predetermined node that is one of the first node and the second node. The second voltage is applied to the source of the third transistor, and the gate of the third transistor is coupled to the second predetermined node that is the other of the first node and the second node.

According to the semiconductor circuit and the semiconductor circuit system according to the embodiments of the present disclosure, the gate of the second transistor is coupled to the first predetermined node, the gate of the third transistor is coupled to the second predetermined node, and the drains of the second transistor and the third transistor are coupled to the third node, which makes it possible to be less likely to cause disturbance. It is to be noted that the effects described here are not necessarily limited, but any of effects described in the present disclosure may be included.

BRIEF DESCRIPTION OF DRAWING

FIG. 1 is a block diagram illustrating a configuration example of a semiconductor circuit according to an embodiment of the present disclosure.

FIG. 2 is a circuit diagram illustrating a configuration example of a memory cell illustrated in FIG. 1.

FIG. 3 is a circuit diagram illustrating a configuration example of a memory cell array including the memory cell illustrated in FIG. 2.

FIG. 4 is a table illustrating an operation example of the memory cell illustrated in FIG. 2.

FIG. 5 is a circuit diagram illustrating an operation example of the memory cell illustrated in FIG. 2.

FIG. 6A is another circuit diagram illustrating an operation example of the memory cell illustrated in FIG. 2.

FIG. 6B is another circuit diagram illustrating an operation example of the memory cell illustrated in FIG. 2.

FIG. 6C is another circuit diagram illustrating an operation example of the memory cell illustrated in FIG. 2.

FIG. 6D is another circuit diagram illustrating an operation example of the memory cell illustrated in FIG. 2.

FIG. 7A is another circuit diagram illustrating an operation example of the memory cell illustrated in FIG. 2.

FIG. 7B is another circuit diagram illustrating an operation example of the memory cell illustrated in FIG. 2.

FIG. 7C is another circuit diagram illustrating an operation example of the memory cell illustrated in FIG. 2.

FIG. 7D is another circuit diagram illustrating an operation example of the memory cell illustrated in FIG. 2.

FIG. 8 is another table illustrating an operation example of the memory cell illustrated in FIG. 2.

FIG. 9 is a circuit diagram illustrating a configuration example of a memory cell according to a comparative example.

FIG. 10 is an explanatory diagram illustrating an operation example of the memory cell illustrated in FIG. 9.

FIG. 11A is a circuit diagram illustrating an operation example of the memory cell illustrated in FIG. 9.

FIG. 11B is another circuit diagram illustrating an operation example of the memory cell illustrated in FIG. 9.

FIG. 12 is a layout diagram illustrating a configuration example of the memory cell illustrated in FIG. 2.

FIG. 13 is a circuit diagram illustrating a configuration example of a memory cell according to a modification example.

FIG. 14 is a circuit diagram illustrating a configuration example of a memory cell according to another modification example.

FIG. 15 is a circuit diagram illustrating a configuration example of a memory cell array including the memory cell illustrated in FIG. 14.

FIG. 16 is a circuit diagram illustrating a configuration example of a memory cell according to another modification example.

FIG. 17 is a circuit diagram illustrating a configuration example of a memory cell according to another modification example.

FIG. 18 is a circuit diagram illustrating a configuration example of a memory cell array including the memory cell illustrated in FIG. 17.

FIG. 19 is a circuit diagram illustrating a configuration example of a memory cell according to another modification example.

FIG. 20 is a circuit diagram illustrating a configuration example of a memory cell array including the memory cell illustrated in FIG. 19.

FIG. 21 is a circuit diagram illustrating a configuration example of a memory cell according to another modification example.

FIG. 22 is a circuit diagram illustrating a configuration example of a memory cell array including the memory cell illustrated in FIG. 21.

FIG. 23 is a circuit diagram illustrating a configuration example of a memory cell according to another modification example.

FIG. 24 is a circuit diagram illustrating a configuration example of a memory cell array including the memory cell illustrated in FIG. 23.

FIG. 25 is a layout diagram illustrating a configuration example of the memory cell illustrated in FIG. 23.

FIG. 26 is a circuit diagram illustrating another configuration example of a memory cell array including the memory cell illustrated in FIG. 23.

FIG. 27 is a circuit diagram illustrating a configuration example of a memory cell according to another modification example.

FIG. 28 is a circuit diagram illustrating a configuration example of a memory cell array including the memory cell illustrated in FIG. 27.

FIG. 29 is a circuit diagram illustrating a configuration example of a memory cell according to another modification example.

FIG. 30 is a circuit diagram illustrating a configuration example of a memory cell array including the memory cell illustrated in FIG. 29.

FIG. 31 is a circuit diagram illustrating a configuration example of a memory cell according to another modification example.

FIG. 32 is a table illustrating an operation example of the memory cell illustrated in FIG. 31.

FIG. 33 is a circuit diagram illustrating an operation example of the memory cell illustrated in FIG. 31.

FIG. 34A is another circuit diagram illustrating an operation example of the memory cell illustrated in FIG. 31.

FIG. 34B is another circuit diagram illustrating an operation example of the memory cell illustrated in FIG. 31.

FIG. 35A is another circuit diagram illustrating an operation example of the memory cell illustrated in FIG. 31.

FIG. 35B is another circuit diagram illustrating an operation example of the memory cell illustrated in FIG. 31.

FIG. 36 is a circuit diagram illustrating a configuration example of a memory cell according to another modification example.

FIG. 37 is a circuit diagram illustrating an operation example of the memory cell illustrated in FIG. 36.

FIG. 38A is another circuit diagram illustrating an operation example of the memory cell illustrated in FIG. 36.

FIG. 38B is another circuit diagram illustrating an operation example of the memory cell illustrated in FIG. 36.

FIG. 39A is another circuit diagram illustrating an operation example of the memory cell illustrated in FIG. 36.

FIG. 39B is another circuit diagram illustrating an operation example of the memory cell illustrated in FIG. 36.

FIG. 40 is a circuit diagram illustrating a configuration example of a memory cell according to another modification example.

FIG. 41 is a circuit diagram illustrating an operation example of the memory cell illustrated in FIG. 40.

FIG. 42A is another circuit diagram illustrating an operation example of the memory cell illustrated in FIG. 40.

FIG. 42B is another circuit diagram illustrating an operation example of the memory cell illustrated in FIG. 40.

FIG. 43A is another circuit diagram illustrating an operation example of the memory cell illustrated in FIG. 40.

FIG. 43B is another circuit diagram illustrating an operation example of the memory cell illustrated in FIG. 40.

FIG. 44 is a circuit diagram illustrating a configuration example of a memory cell according to another modification example.

FIG. 45 is a block diagram illustrating a configuration example of a semiconductor circuit according to another modification example.

FIG. 46 is a circuit diagram illustrating a configuration example of a flip-flop circuit to which the technology of an embodiment is applied.

FIG. 47 is a circuit diagram illustrating another configuration example of the flip-flop circuit to which the technology of the embodiment is applied.

FIG. 48 is a circuit diagram illustrating another configuration example of the flip-flop circuit to which the technology of the embodiment is applied.

FIG. 49 is a circuit diagram illustrating another configuration example of the flip-flop circuit to which the technology of the embodiment is applied.

FIG. 50 is a circuit diagram illustrating another configuration example of the flip-flop circuit to which the technology of the embodiment is applied.

FIG. 51 is a circuit diagram illustrating another configuration example of the flip-flop circuit to which the technology of the embodiment is applied.

FIG. 52 is a circuit diagram illustrating another configuration example of the flip-flop circuit to which the technology of the embodiment is applied.

FIG. 53 is a circuit diagram illustrating another configuration example of the flip-flop circuit to which the technology of the embodiment is applied.

FIG. 54 is a block diagram illustrating a configuration example of an information processor to which the technology of an embodiment is applied.

FIG. 55 is a block diagram illustrating another configuration example of the information processor to which the technology of the embodiment is applied.

MODES FOR CARRYING OUT THE INVENTION

The following describes embodiments of the present disclosure in detail with reference to the drawings. It is to be noted that description is given in the following order.
1. Embodiment
2. Application Example 1. First Embodiment Configuration Example FIG. 1 illustrates a configuration example of a semiconductor circuit (semiconductor circuit 1) according to a first embodiment. The semiconductor circuit 1 is a circuit that stores information. The semiconductor circuit 1 includes a controller 11, a power supply transistor 12, and a memory circuit 20.

The controller 11 controls an operation of the memory circuit 20. Specifically, the controller 11 writes information to the memory circuit 20 on the basis of a write command and write data supplied from the outside, and reads information from the memory circuit 20 on the basis of a read command supplied from the outside. In addition, the controller 11 also has a function of controlling power supply to the memory circuit 20 by supplying a power supply control signal SPG to the power supply transistor 12 to turn on and off the power supply transistor 12.

In this example, the power supply transistor 12 is a P-type MOS (Metal Oxide Semiconductor) transistor, and has a gate to be supplied with the power supply control signal SPG, a source to be supplied with a power supply voltage VDD1, and a drain coupled to the memory circuit 20.

With this configuration, in the semiconductor circuit 1, in a case where the memory circuit 20 is used, the power supply transistor 12 is turned on, and the power supply voltage VDD1 is supplied to the memory circuit 20 as a power supply voltage VDD. In addition, in the semiconductor circuit 1, in a case where the memory circuit 20 is not used, the power supply transistor 12 is turned off. In the semiconductor circuit 1, it is possible to reduce power consumption by such so-called power gating.

The memory circuit 20 stores data. The memory circuit 20 includes a memory cell array 21 and drivers 22 and 23.

The memory cell array 21 includes memory cells 30 arranged in a matrix.

FIG. 2 illustrates a configuration example of the memory cell 30. FIG. 3 illustrates a configuration example of the memory cell array 21. This FIG. 3 also illustrates the drivers 22 and 23 in addition to the memory cell array 21. The memory cell array 21 includes a plurality of word lines WL, a plurality of bit lines BL, a plurality of bit lines BLB, a plurality of control lines CTRL, a plurality of restore control lines RSTRL, a plurality of store control line STRBL, and a plurality of reset control lines RSL. The word lines WL extend in a horizontal direction of FIGS. 2 and 3, and one end of each of the word lines WL is coupled to the driver 22. The driver 22 applies a signal SWL to each of the word lines WL. The bit lines BLT extend in a vertical direction of FIGS. 2 and 3, and one end of each of the bit lines BLT is coupled to the driver 23. The bit lines BLB extend in the vertical direction of FIGS. 2 and 3, and one end of each of the bit lines BLB is coupled to the driver 23. The control lines CTRL extend in the horizontal direction of FIGS. 2 and 3, and one end of each of the control lines CTRL is coupled to the driver 22. The driver 22 applies a signal SCTRL to each of the control lines CTRL. The restore control lines RSTRL extend in the horizontal direction of FIGS. 2 and 3, and one end of each of the restore control lines RSTRL is coupled to the driver 22. The driver 22 applies a signal SRSTRL to each of the restore control lines RSTRL. The store control lines STRBL extend in the horizontal direction of FIGS. 2 and 3, and one end of each of the store control lines STRBL is coupled to the driver 22. The driver 22 applies a signal SSTRBL to each of the store control lines STRBL. The reset control lines RSL extend in the horizontal direction of FIGS. 2 and 3, and one end of each of the reset control lines RSL is coupled to the driver 22. The driver 22 applies a signal SRSL to each of the reset control lines RSL.

The memory cell 30 includes an SRAM (Static Random Access Memory) circuit 40, transistors 31, 32, and 51 to 54, and a memory element 33.

The SRAM circuit 40 stores one-bit information by positive feedback. The SRAM circuit 40 includes transistors 41 to 46. The transistors 41 and 43 are P-type MOS transistors, and the transistors 42, 44, 45, and 46 are N-type MOS transistors.

The transistor 41 has a gate coupled to a node N1, a source to be supplied with the power supply voltage VDD, and a drain coupled to a node N2. The transistor 42 has a gate coupled to the node N1, a source grounded, and a drain coupled to the node N2. The transistors 41 and 42 are included in an inverter IV1. The inverter IV1 inverts a voltage VN1 at the node N1, and outputs a result of such inversion to the node N2. The transistor 43 has a gate coupled to the node N2, a source to be supplied with the power supply voltage VDD, and a drain coupled to the node N1. The transistor 44 has a gate coupled to the node N2, a source grounded, and a drain coupled to the node N1. The transistors 43 and 44 are included in an inverter IV2. The inverter IV2 inverts a voltage VN2 at the node N2, and outputs a result of such inversion to the node N1. The transistor 45 has a gate coupled to the word line WL, a source coupled to the bit line BL, and a drain coupled to the node N1. The transistor 46 has a gate coupled to the word line WL, a source coupled to the bit line BLB, and a drain coupled to the node N2.

With this configuration, an input terminal of the inverter IV1 and an output terminal of the inverter IV2 are coupled to each other via the node N1, and an input terminal of the inverter IV2 and an output terminal of the inverter IV1 are coupled to each other via the node N2. This causes the SRAM circuit 40 to store one-bit information by positive feedback. Turning on the transistors 45 and 46 then causes information to be written into the SRAM circuit 40 via the bit lines BL and BLB, or to be read from the SRAM circuit 40.

The transistors 31 and 32 are N-type MOS transistors. The transistor 31 has a gate coupled to the restore control line RSTRL, a drain coupled to the node N1, and a source coupled to drains of the transistors 52 and 53 and one end of the memory element 33. The transistor 32 has a gate coupled to the restore control line RSTRL, a drain coupled to the node N2, and a source coupled to the control line CTRL. An on-resistance of the resistor 32 is set to be larger than an on-resistance of the transistor 31. Specifically, for example, a gate length L32 of the transistor 32 may be longer than a gate length L31 of the transistor 31, a gate width W32 of the transistor 32 may be narrower than a gate width W31 of the transistor 31, or a threshold voltage Vth32 of the transistor 32 may be higher than a threshold voltage Vth31 of the transistor 31.

It is to be noted that, in this example, N-type MOS transistors are used as the transistors 31 and 32, but the transistors 31 and 32 are not limited thereto. For example, P-type MOS transistors may be used instead of the N-type MOS transistors. In this case, for example, it is desirable to change polarity or the like of the signal SRSTRL.

The transistors 51 and 52 are P-type MOS transistors, and the transistors 53 and 54 are N-type MOS transistors. The transistor 51 has a gate coupled to the store control line STRBL, a source to be supplied with the power supply voltage VDD, and a drain coupled to a source of the transistor 52. The transistor 52 has a gate coupled to the node N2, the source coupled to the drain of the transistor 51, and the drain coupled to the drain of the transistor 53, the source of the transistor 31, and the one end of the memory element 33. The transistor 53 has a gate coupled to the node N1, the drain coupled to the drain of the transistor 52, the source of the transistor 31, and the one end of the memory element 33, and a source coupled to a drain of the transistor 54. The transistor 54 has a gate coupled to the reset control line RSL, the drain coupled to the source of the transistor 53, and a source grounded.

The memory element 33 is a nonvolatile memory element, and is, in this example, a spin transfer torque (STT) magnetic tunnel junction (MTJ) element that changes a magnetization direction of a free layer F (to be described later) by spin injection to store information. The memory element 33 has the one end coupled to the source of the transistor 31 and the drains of the transistors 52 and 53 and another end coupled to the control line CTRL.

The memory element 33 includes a pinned layer P, a tunnel barrier layer I, and the free layer F. In this example, the pinned layer P is coupled to the source of the transistor 31 and the drains of the transistors 52 and 53, and the free layer F is coupled to the control line CTRL. In this example, the memory element 33 has a so-called bottom pin structure in which the pinned layer P, the tunnel barrier layer I, and the free layer F are stacked in this order from a lower layer side of the semiconductor circuit 1.

The pinned layer P includes a ferromagnetic material of which a magnetization direction is fixed to a direction perpendicular to a film surface, for example. The free layer F includes a ferromagnetic material of which a magnetization direction is changed in the direction perpendicular to the film surface in response to an incoming spin polarized current. The tunnel barrier layer I performs functions of disconnecting magnetic coupling between the pinned layer P and the free layer F and causing a tunnel current to pass therethrough.

With this configuration, in the memory element 33, for example, a current flows from the free layer F to the pinned layer P, which causes polarized electrons having a moment (spin) in the same direction as the magnetization direction of the pinned layer P to be injected from the pinned layer P to the free layer F, thereby changing the magnetization direction of the free layer F to the same direction as the magnetization direction of the pinned layer P (parallel state). In a case where the memory element 33 is turned to such a parallel state, a resistance value between both ends becomes lower (low resistance state RL).

In addition, for example, a current flowing from the pinned layer P to the free layer F causes electrons to be injected from the free layer F to the pinned layer P. At this time, polarized electrons having a moment in the same direction as the magnetization direction of the pinned layer P of the injected electrons pass through the pinned layer P, and polarized electrons having a moment in a direction opposite to the magnetization direction of the pinned layer P are reflected by the pinned layer P and injected into the free layer F. Thus, the magnetization direction of the free layer F is changed to a direction opposite to the magnetization direction of the pinned layer P (antiparallel state). In a case where the memory element 33 is turned to such an antiparallel state, the resistance value between both ends becomes higher (high resistance state RH).

As described above, in the memory element 33, the magnetization direction of the free layer F is changed in accordance with a direction where a current flows, thereby switching a resistance state between the high resistance state RH and the low resistance state RL. Setting the resistance state in such a manner allows the memory element 33 to store information.

As described above, the memory cell 30 includes the transistors 31, 32, and 51 to 54, and the memory element 33 in addition to the SRAM circuit 40. Accordingly, for example, in a case where the power supply transistor 12 is turned off to perform a standby operation, performing a store operation immediately before the standby operation makes it possible to cause the memory element 33 that is a nonvolatile memory to store information stored in the SRAM circuit 40 that is a volatile memory. Then, in the semiconductor circuit 1, performing a restore operation immediately after the standby operation makes it possible to cause the SRAM circuit 40 to store the information stored in the memory element 33. This allows the semiconductor circuit 1 to return, in a short time, a state of each of the memory cells 30 to a state in which power supply has not yet been stopped after the power supply is restarted.

The driver 22 respectively applies the signal SWL, the signal SCTRL, the signal SRSTRL, the signal SSTRBL, and the signal SRSL to the word lines WL, the control lines CTRL, the restore control lines RSTRL, the store control lines STRBL, and the reset control lines RSL on the basis of a control signal supplied from the controller 11.

As illustrated in FIG. 3, the driver 22 includes transistors 24 and 25. The transistor 24 is a P-type MOS transistor, and has a gate to be supplied with a signal SCTRBL, a source to be supplied with the power supply voltage VDD, and a drain coupled to the control line CTRL. The transistor 25 is an N-type MOS transistor, and has a gate to be supplied with the signal SCTRBL, a drain coupled to the control line CTRL, and a source grounded. The transistors 24 and 25 are included in an inverter, and the driver 22 drives the control lines CTRL with use of this inverter.

The driver 23 writes information to the memory cell array 21 or reads information from the memory cell array 21 via the bit lines BL and BLB. Specifically, the driver 23 writes information to the memory cell array 21 via the bit lines BL and BLB on the basis of a control signal and data supplied from the controller 11. In addition, the driver 23 reads information from the memory cell array 21 via the bit lines BL and BLB on the basis of a control signal from the controller 11, and supplies the read information to the controller 11.

Here, the inverter IV1 corresponds to a specific example of a "first circuit" in the present disclosure. The inverter IV2 corresponds to a specific example of a "second circuit" in the present disclosure. The transistor 31 corresponds to a specific example of a "first transistor" in the present disclosure. The transistor 52 corresponds to a specific example of a "second transistor" in the present disclosure. The transistor 53 corresponds to a specific example of a "third transistor" in the present disclosure. The transistor 51 corresponds to a specific example of a "fourth transistor" in the present disclosure. The transistor 54 corresponds to a specific example of a "fifth transistor" in the present disclosure. The transistor 32 corresponds to a specific example of a "sixth transistor" in the present disclosure. The memory element 33 corresponds to a specific example of a "first memory element" in the present disclosure. The drivers 22 and 23 correspond to specific examples of a "driver" in the present disclosure. The memory circuit 20 corresponds to a specific example of a "memory section" in the present disclosure.

Operation and Workings

Next, an operation and workings of the semiconductor circuit 1 according to the present embodiment are described.

Overview of Overall Operation

First, an overview of an overall operation of the semiconductor circuit 1 is described with reference to FIGS. 1 to 3. The controller 11 controls an operation of the memory circuit 20. Specifically, the controller 11 writes information to the memory circuit 20 on the basis of a write command and write data supplied from the outside, and reads information from the memory circuit 20 on the basis of a read command supplied from the outside. In addition, the controller 11 controls power supply to the memory circuit 20 by supplying the power supply control signal SPG to the power supply transistor 12 to turn on and off the power supply transistor 12. The power supply transistor 12 performs an on/off operation on the basis of a control signal supplied from the controller 11. The power supply transistor 12 is then turned on, which causes the power supply voltage VDD1 as the power supply voltage VDD to be supplied to the memory circuit 20. The driver 22 of the memory circuit 20 respectively applies the signal SWL, the signal SCTRL, the signal SRSTRL, the signal SSTRBL, and the signal SRSL to the word lines WL, the control lines CTRL, the restore control lines RSTRL, the store control lines STRBL, and the reset control lines RSL on the basis of a control signal supplied from the controller 11. The driver 23 writes information to the memory cell array 21 via the bit lines BL and BLB on the basis of a control signal and data supplied from the controller 11. In addition, the driver 23 reads information from the memory cell array 21 via the bit lines BL and BLB on the basis of a control signal supplied from the controller 11, and supplies the read information to the controller 11.

(Detailed Operation)

In a normal operation OP1, the semiconductor circuit 1 causes the SRAM circuit 40 that is a volatile memory to store information. For example, in a case where the power supply transistor 12 is turned off to perform a standby operation OP3, the semiconductor circuit 1 performs a store operation OP2 immediately before the standby operation OP3, thereby causing the memory element 33 that is a nonvolatile memory to store the information stored in the SRAM circuit 40 that is a volatile memory. The semiconductor circuit 1 then performs a restore operation OP4 immediately after the standby operation OP3, thereby causing the SRAM circuit 40 to store the information stored in the memory element 33. The semiconductor circuit 1 then performs a reset operation OP5 immediately after the restore operation OP4, thereby resetting the resistance state of the memory element 33 to a predetermined resistance state (the low resistance state RL in this example). This operation is described in detail below.

FIG. 4 illustrates an operation example of a certain memory cell 30 of interest in the semiconductor circuit 1. FIGS. 5, 6A, 6B, 6C, 6D, 7A, 7B, 7C, and 7D each illustrate an operation state of the memory cell 30. FIG. 5 illustrates a state in the normal operation OP1. FIGS. 6A, 6B, 6C, and 6D each illustrate a state in a case where the voltage VN1 at the node N1 is a high level voltage VH (VN1=VH), and FIGS. 6A, 6B, 6C, and 6D respectively illustrate a state in the store operation OP2, a state in the standby operation OP3, a state in the restore operation OP4, and a state in the reset operation OP5. FIGS. 7A, 7B, 7C, and 7D each illustrate a state in a case where the voltage VN1 at the node N1 is a low level voltage VL (VN1=VL), and FIGS. 7A, 7B, 7C, and 7D respectively illustrate a state in the store operation OP2, a state in the standby operation OP3, a state in the restore operation OP4, and a state in the reset operation OP5.

Normal Operation OP1

The semiconductor circuit 1 performs the normal operation OP1 to write information to the SRAM circuit 40 that is a volatile memory, or read information from the SRAM circuit 40.

In the normal operation OP1, as illustrated in FIG. 4, the controller 11 sets a voltage of the power supply control signal SPG to a low level. This turns on the power supply transistor 12 (FIG. 1), and the power supply voltage VDD is supplied to the memory circuit 20. The driver 22 then sets a voltage of the signal SRSTRL to the low level as illustrated in FIG. 4. This turns off each of the transistors 31 and 32 as illustrated in FIG. 5. That is, the SRAM circuit 40 is electrically separated from the memory element 33. In addition, as illustrated in FIG. 4, the driver 22 sets a voltage of the signal SSTRBL to a high level and sets a voltage of the signal SRSL to the low level. This turns off each of the transistors 51 and 54 as illustrated in FIG. 5. In addition, the driver 22 sets a voltage of the signal SCTRL to the low level voltage VL (ground level) as illustrated in FIG. 4. Specifically, the driver 22 sets a voltage of the signal SCTRBL (FIG. 3) to the high level, thereby turning off the transistor 24 and turning on the transistor 25, as illustrated in FIG. 5. As a result, the voltage of the SCTRL is changed to the low level voltage VL.

In the normal operation OP1, the semiconductor circuit 1 writes information to the SRAM circuit 40 of the memory cell 30 or reads information from the SRAM circuit 40. Specifically, in a case where information is written to the SRAM circuit 40, first, the driver 23 applies, to the bit lines BL and BLB, signals having mutually inverted voltage levels corresponding to the information to be written. The driver 22 then sets a voltage of the signal SWL to the high level, thereby turning on the transistors 45 and 46 of the SRAM circuit 40. This causes information corresponding to voltages of the bit lines BL and BLB to be written to the SRAM circuit 40. In addition, in a case where information is read from the SRAM circuit 40, the driver 23 pre-charges each of the bit lines BL and BLB, for example, with a high level voltage. Thereafter, the driver 22 sets the voltage of the signal SWL to the high level, thereby turning on the transistors 45 and 46. This causes the voltage of one of the bit lines BL and BLB to change in accordance with the information stored in the SRAM circuit 40. The driver 23 then detects a difference between the voltages of the bit lines BL and BLB, thereby reading the information stored in the SRAM circuit 40.

At this time, as illustrated in FIG. 5, the transistors 31, 32, 51, and 54 are off. Accordingly, a current does not flow to the memory element 33, which causes the resistance state of the memory element 33 to be maintained in a predetermined resistance state (the low resistance state RL in this example).

Store Operation OP2

Next, the store operation OP2 is described. The semiconductor circuit 1 performs the store operation OP2 before performing the standby operation OP3, thereby causing the memory element 33 to store the information stored in the SRAM circuit 40.

In the store operation OP2, the driver 22 sets the voltage of the signal SWL to the low level as illustrated in FIG. 4. This turns off the transistors 45 and 46. In addition, the driver 22 sets the voltage of the signal SSTRBL to the low level as illustrated in FIG. 4. This turns on the transistor 51 as illustrated in FIGS. 6A and 7A. The driver 22 then sets the voltage of the signal SCTRBL (FIG. 3) to the high level, thereby turning off the transistor 24 and turning on the transistor 25 as illustrated in FIGS. 6A and 7A. As a result, the voltage of the signal SCTRL is changed to the low level voltage VL. Thus, the resistance state of the memory element 33 is set in accordance with the information stored in the SRAM circuit 40.

Specifically, for example, as illustrated in FIG. 6A, in a case where the voltage VN1 at the node N1 is the high level voltage VH (VN1=VH), the voltage VN2 at the node N2 is the low level voltage VL (VN2=VL); therefore, the transistors 52 and 53 are on. Accordingly, in the memory cell 30, a store current Istr flows in order of the transistor 51, the transistor 52, the memory element 33, and the transistor 25 as illustrated in FIG. 6A. At this time, in the memory element 33, the store current Istr flows from the pinned layer P to the free layer F, which causes the magnetization direction of the free layer F to be changed to a direction opposite to the magnetization direction of the pinned layer P (antiparallel state). As a result, the resistance state of the memory element 33 is changed to the high resistance state RH.

In addition, for example, as illustrated in FIG. 7A, in a case where the voltage VN1 at the node N1 is the low level voltage VL (VN1=VL), the voltage VN2 at the node N2 is the high level voltage VH (VN2=VH); therefore, the transistors 52 and 53 are off. Accordingly, in the memory cell 30, a store current does not flow as illustrated in FIG. 7A. This causes the resistance state of the memory element 33 to be maintained in the low resistance state RL.

Thus, in the memory cell 30, the resistance state of the memory element 33 is set in accordance with the information stored in the SRAM circuit 40.

The store operation OP2 is performed in units of a row, for example. It is possible to set a row on which the store operation OP2 is to be performed and a row on which the store operation OP2 is not to be performed with use of the signal SSTRBL, for example. Specifically, the driver 22 sets the voltage of the signal SSTRBL to the low level for the row on which the store operation OP2 is to be performed as illustrated in FIG. 4, and the driver 22 sets the voltage of the signal SSTRBL to the high level for the row on which the store operation OP2 is not to be performed as illustrated in FIG. 8.

Standby Operation OP3

The semiconductor circuit 1 then turns off the power supply transistor 12 after the store operation OP2, thereby performing the standby operation OP3.

In the standby operation OP3, as illustrated in FIG. 4, the controller 11 sets the voltage of the power supply control signal SPG to the high level. This turns off the power supply transistor 12 (FIG. 1), and the power supply to the memory circuit 20 is stopped. At this time, the resistance state of the memory element 33 is maintained as illustrated in FIGS. 6B and 7B.

Restore Operation OP4

Next, the restore operation OP4 is described. In a case where the normal operation OP1 is performed after the standby operation OP3, the semiconductor circuit 1 performs the restore operation OP4, thereby causing the SRAM circuit 40 to store the information stored in the memory element 33.

In the restore operation OP4, as illustrated in FIG. 4, the controller 11 sets the voltage of the power supply control signal SPG to the low level. This turns on the power supply transistor 12 (FIG. 1), and the power supply voltage VDD is supplied to the memory circuit 20. The driver 22 then sets the voltage of the signal SRSTRL to the high level only in a period of a predetermined length immediately after the power supply transistor 12 is turned on. This turns on each of the transistors 31 and 32 in this period as illustrated in FIGS. 6C and 7C. That is, the SRAM circuit 40 is electrically coupled to the memory element 33 in this period. In addition, the driver 22 sets the voltage of the signal SSTRBL to the high level and sets the voltage of the signal SRSL to the low level as illustrated in FIG. 4. This turns off each of the transistors 51 and 54 as illustrated in FIGS. 6C and 7C. In addition, the driver 22 sets the voltage of the signal SCTRL to the low level voltage VL (ground level) as illustrated in FIG. 4. This causes the node N1 to be grounded via the transistor 31 and the memory element 33, and causes the node N2 to be grounded via the transistor 32. At this time, a magnitude relationship between a resistance value between the node N1 and the ground and a resistance value between the node N2 and the ground differs in accordance with the resistance state of the memory element 33, which causes a voltage state of the SRAM circuit 40 to be determined.

Specifically, for example, as illustrated in FIG. 6C, in a case where the resistance state of the memory element 33 is the high resistance state RH, the resistance value between the node N1 and the ground becomes larger than the resistance value between the node N2 and the ground. This causes a current value of a current I31 flowing from the node N1 to the control line CTRL via the transistor 31 and the memory element 33 to become smaller than a current value of a current I32 flowing from the node N2 to the control line CRTL via the transistor 32 immediately after the power supply transistor 12 is turned on. Accordingly, the voltage at the node N1 is set to the high level voltage VH.

In addition, for example, as illustrated in FIG. 7C, in a case where the resistance state of the memory element 33 is the low resistance state RL, the resistance value between the node N1 and the ground becomes smaller than the resistance value between the node N2 and the ground. This causes the current value of the current I31 flowing from the node N1 to the control line CTRL via the transistor 31 and the memory element 33 to become larger than the current value of the current I32 flowing from the node N2 to the control line CTRL via the transistor 32 immediately after the power supply transistor 12 is turned on. Accordingly, the voltage at the node N1 is set to the low level voltage VL.

Thus, in the memory cell 30, the SRAM circuit 40 stores information in accordance with the information stored in the memory element 33.

It is to be noted that, in this example, the voltage of the signal SRSTRL is set to the high level only in the period of the predetermined length immediately after the power supply transistor 12 is turned on, but this is not limitative. Alternatively, for example, the voltage of the signal SRSTRL may be set to the high level in advance before the power supply transistor 12 is turned on.

All the memory cells 30 in the memory cell array 21 simultaneously perform the restore operation OP4, for example. It is to be noted that this is not limitative, and some of the memory cells 30 in the memory cell array 21 may perform the restore operation OP4, and the other memory cells 30 may not perform the restore operation OP4. For example, in a case where the restore operation OP4 is performed in units of a row, the driver 22 may set the signal SRSTRL to the high level only in a predetermined period, as illustrated in FIG. 4, for a row on which the restore operation OP4 is to be performed, and may maintain the signal SRSTRL in the low level for a row on which the restore operation OP4 is not to be performed.

Reset Operation OP5

The semiconductor circuit 1 then performs the reset operation OP5 immediately after the restore operation OP4, thereby resetting the resistance state of the memory element 33 to a predetermined resistance state (the low resistance state RL in this example).

In the reset operation OP5, the driver 22 sets the voltage of the signal SRSL to the high level as illustrated in FIG. 4. This turns on the transistor 54 as illustrated in FIGS. 6D and 7D. In addition, the driver 22 sets the voltage of the signal SCTRL to the high level voltage VH (power supply voltage level) as illustrated in FIG. 4. This causes the resistance state of the memory element 33 to be set (reset) to a predetermined resistance state (the low resistance state RL in this example).

Specifically, for example, as illustrated in FIG. 6D, in a case where the voltage VN1 at the node N1 is the high level voltage VH and the voltage VN2 at the node N2 is the low level voltage VL immediately after the restore operation OP4, the transistors 52 and 53 are on. Accordingly, in the memory cell 30, as illustrated in FIG. 6D, a reset current Irs flows in order of the transistor 24, the memory element 33, the transistor 53, and the transistor 54. At this time, in the memory element 33, the reset current Irs flows from the free layer F to the pinned layer P, which causes the magnetization direction of the free layer F to be changed to the same direction as the magnetization direction of the pinned layer P (parallel state), and as a result, the resistance state of the memory element 33 is changed to the low resistance state RL.

In addition, for example, as illustrated in FIG. 7D, in a case where the voltage VN1 at the node N1 is the low level voltage VL and the voltage VN2 at the node N2 is the high level voltage VH immediately after the restore operation OP4, the transistors 52 and 53 are off. Accordingly, the reset current does not flow in the memory cell 30 as illustrated in FIG. 7D. This causes the resistance state of the memory element 33 to be maintained in the low resistance state RL.

That is, in the semiconductor circuit 1, the reset operation OP5 is performed before the information in the SRAM circuit 40 is rewritten, immediately after the restore operation OP4. Accordingly, immediately after the restore operation OP4, in an example in FIG. 6D, the voltage VN1 at the node N1 is the high level voltage VH and the voltage VN2 at the node N2 is the low level voltage VL, for example. Thus, performing the reset operation OP5 after the restore operation OP4 is performed and before the voltages at the nodes N1 and N2 are changed makes it possible to reset the resistance state of the memory element 33 to the low resistance state RL.

As described above, the resistance state of the memory element 33 is set to the low resistance state RL by the reset operation OP5.

The reset operation OP5 is performed in units of a row, for example. It is possible to set a row on which the reset operation OP5 is to be performed and a row on which the reset operation OP5 is not to be performed with use of the signal SRSL, for example. Specifically, the driver 22 sets the voltage of the signal SRSL to the high level for the row on which the reset operation OP5 is to be performed as illustrated in FIG. 4, and the driver 22 sets the voltage of the signal SRSL to the low level for the row on which the reset operation OP5 is not to be performed as illustrated in FIG. 8. In addition, in this example, the driver 22 sets the signal SCTRL to the high level voltage VH for both the row on which the reset operation OP5 is to be performed and the row on which the reset operation OP5 is not to be performed as illustrated in FIGS. 4 and 8, but this is not limitative. The signal SCTRL may be maintained in the low level voltage VL for the row on which the reset operation OP5 is not to be performed.

Thereafter, the semiconductor circuit 1 performs the normal operation OP1 (FIG. 5). After this, the semiconductor circuit 1 then repeats the store operation OP2, the standby operation OP3, the restore operation OP4, the reset operation OP5, and the normal operation OP1 in this order.

As described above, the semiconductor circuit 1 performs the store operation OP2 immediately before the standby operation OP3, thereby causing the memory element 33 that is a nonvolatile memory to store information stored in the SRAM circuit 40 that is a volatile memory. The semiconductor circuit 1 then performs the restore operation OP4 immediately after the standby operation OP3, thereby causing the SRAM circuit 40 to store the information stored in the memory element 33. This allows the semiconductor circuit 1 to return, in a short time, the state of each of the memory cells 30 to the state in which the power supply has not yet been stopped after the power supply is restarted.

The semiconductor circuit 1 then performs the reset operation OP5 before the information in the SRAM circuit 40 is rewritten, immediately after the restore operation OP4. This allows the semiconductor circuit 1 to reset the resistance state of the memory element 33 to the low resistance state RL and prepare for the next store operation OP2.

In addition, in a case where the semiconductor circuit 1 includes the transistors 51 and 52 and performs the store operation OP2, for example, the store current Istr flows to the memory element 33 via these transistors 51 and 52 as illustrated in FIG. 6A. In other words, in the semiconductor circuit 1, the store current does not flow to the SRAM circuit 40. This makes it possible to reduce the possibility of occurrence of so-called disturbance in the semiconductor circuit 1, as compared with a case of a comparative example to be described below.

Comparative Example

Next, workings of the present embodiment are described as compared with a semiconductor circuit 1R according to a comparative example. The semiconductor circuit 1R includes a memory circuit 20R similarly to the semiconductor circuit 1 (FIG. 1) according to the present embodiment. The memory circuit 20R includes a memory cell array 21R, a driver 22R, and a driver 23R.

FIG. 9 illustrates a configuration example of a memory cell 30R in the memory cell array 21R. The memory cell 30R includes the SRAM circuit 40, transistors 71 and 72, and memory elements 33 and 34. The transistors 71 and 72 are N-type MOS transistors, and respectively correspond to the transistors 31 and 32 according to the present embodiment. A size and a configuration of the transistor 71 are substantially the same as a size and a configuration of the transistor 72. In other words, electrical characteristics of the transistor 71 are substantially the same as electrical characteristics of the transistor 72. The memory element 34 is a spin transfer torque magnetic tunnel junction element similarly to the memory element 33. The memory element 34 has one end coupled to a source of the transistor 32, and another end coupled to the control line CTRL.

The semiconductor circuit 1R causes the SRAM circuit 40 that is a volatile memory to store information in the normal operation OP1. The semiconductor circuit 1R then performs the store operation OP2 immediately before the standby operation OP3, thereby causing the memory element 33 that is a nonvolatile memory to store the information stored in the SRAM circuit 40 that is a volatile memory. The semiconductor circuit 1R then performs the restore operation OP4 immediately after the standby operation OP3, thereby causing the SRAM circuit 40 to store the information stored in the memory element 33.

FIG. 10 illustrates an operation example of a certain memory cell 30R of interest in the semiconductor circuit 1R. FIGS. 11A and 11B illustrate an operation state of the memory cell 30R in the store operation OP2. In the store operation OP2, the driver 22R sets the voltage of the signal SRSTRL to the high level as illustrated in FIG. 10. This turns on the transistors 71 and 72 as illustrated in FIGS. 11A and 11B.

In the semiconductor circuit 1R according to the comparative example, each of the memory cells 30R uses two steps to cause the memory elements 33 and 34 to store information stored in the SRAM circuit 40. First, in a first step, the driver 22R sets the voltage of the signal SCTRL to the low level voltage VL (ground level) as illustrated in FIG. 10. In this example, the voltage VN1 at the node N1 is the high level voltage VH; therefore, a store current Istr1 flows in order of the transistor 43 of the inverter IV2, the transistor 71, the memory element 33, and the transistor 25 as illustrated in FIG. 11A. At this time, in the memory element 33, the store current Istr1 flows from the pinned layer P to the free layer F, which causes the resistance state of the memory element 33 to be set to the high resistance state RH. Next, in a second step, the driver 22R sets the voltage of the signal SCTRL to the high level voltage VH (power supply voltage level) as illustrated in FIG. 10. In this example, the voltage VN2 at the node N2 is the low level voltage VL; therefore, a store current Istr2 flows in order of the transistor 24, the memory element 34, the transistor 72, and the transistor 42 of the inverter IV1 as illustrated in FIG. 11B. At this time, in the memory element 34, the store current Istr2 flows from the free layer F to the pinned layer P, which causes the resistance state of the memory element 34 to be set to the low resistance state RL.

In the semiconductor circuit 1R according to the comparative example, as described above, the store current Istr1 flows from the transistor 43 of the inverter IV2 in the first step, and the store current Istr2 flows to the transistor 42 of the inverter IV1 in the second step. Accordingly, in a case where current values of the store currents Istr1 and Istr2 are large, information stored in the SRAM circuit 40 may be lost to cause so-called disturbance. In addition, in a case where sizes of the respective transistors of the SRAM circuit 40 are increased to avoid this, an area of the semiconductor circuit 1R becomes large.

In contrast, in the semiconductor circuit 1 according to the present embodiment, the transistors 51 and 52 are provided, and in a case where the store operation OP2 is performed, for example, as illustrated in FIG. 6A, the store current Istr flows to the memory element 33 via the transistors 51 and 52. Accordingly, in the semiconductor circuit 1, the store current does not flow to the SRAM circuit 40, which makes it possible to reduce the possibility of occurrence of disturbance.

In addition, in the semiconductor circuit 1, the store current Istr and the reset current Irs do not flow to the SRAM circuit 40, which makes it possible to make a size of each of the transistors 41 to 46 of the SRAM circuit 40 equal to a size of a transistor of a typical SRAM circuit that is not coupled to the memory element 33. As a result, it is possible to reduce an area of the semiconductor circuit 1.

In addition, in the semiconductor circuit 1, the drain of the transistor 52 is coupled to the one end of the memory element 33. This makes it possible to easily secure the current value of the store current Istr in the semiconductor circuit 1 in a case where the store operation OP2 is performed, for example, as illustrated in FIG. 6A. That is, for example, in the semiconductor circuit 1R according to the comparative example, in a case where the resistance state of the memory element is changed to the high resistance state RH, it may not be possible to sufficiently secure the current value of the store current. Specifically, in FIG. 11A, the store current Istr1 flows in order of the transistor 43 of the inverter IV2, the transistor 71, the memory element 33, and the transistor 25. At this time, the transistor 71 operates as a so-called source follower, which causes a so-called negative feedback effect on the voltage at the one end of the memory element 33. This makes it difficult to secure the current value of the store current Istr1. It is difficult to secure the current of store current Istr1. In contrast, in the semiconductor circuit 1, the drain of the transistor 52 is coupled to the one end of the memory element 33, which does not cause the so-called negative feedback effect. This makes it possible to easily secure the current value of the store current Istr.

Similarly, in the semiconductor circuit 1, the drain of the transistor 53 is coupled to the one end of the memory element 33, which makes it possible to easily secure the current value of the reset current Irs in a case where the reset operation OP5 is performed.

In addition, in the semiconductor circuit 1, as described above, it is possible to easily secure the current value of store current Istr, which makes it possible to reduce sizes of the transistors 51 and 52, for example. Similarly, it is possible to easily secure the current value of the reset current Irs, which makes it possible to reduce sizes of the transistors 53 and 54, for example. Thus, in the semiconductor circuit 1, it is possible to reduce the sizes of the transistors 51 to 54, which makes it possible to reduce an area of each of the memory cells 30 and reduce the area of the semiconductor circuit 1.

In addition, in the semiconductor circuit 1, a path (the transistors 51 and 52) for causing the store current Istr to flow to the memory element 33 and a path (the transistors 53 and 54) for causing the reset current Irs to flow to the memory element 33 are separately provided, which makes it possible to reduce the possibility of occurrence of so-called backhopping and to improve reliability and durability of the circuit. That is, for example, in the semiconductor circuit 1R according to the comparative example, in a case where the resistance state of the memory element 33 is changed to the high resistance state RH, for example, the store current flows in order of the transistor 43 of the inverter IV2, the transistor 71, the memory element 33, and the transistor 25 as illustrated in FIG. 11A; therefore, the transistor 71 operates as a so-called source follower as described above, which makes it difficult to secure the current value. In contrast, in a case where the resistance state of the memory element 33 is changed to the low resistance state RL, the store current flows in order of the transistor 24, the memory element 33, the transistor 71, and the transistor 44 of the inverter IV2 similarly to the case of FIG. 11B; therefore, the transistor 71 does not operate as a so-called source follower, which makes it easy to secure the current value. Accordingly, in the semiconductor circuit 1R, the size of the transistor 71 is desirably increased to allow the current value to be secured in a case where the resistance state of the memory element 33 is changed to the high resistance state RH. However, in this case, in a case where the resistance state of the memory element 33 is changed to the low resistance state RL, too much current flows. In a case where too much current flows in such a manner, for example, in the store operation OP2 and the reset operation OP5, the resistance state of the memory element 33 may be changed to a resistance state different from a desired resistance state, that is, so-called backhopping may occur. In addition, too much current flowing may cause deterioration in reliability and durability of the circuit. In contrast, in the semiconductor circuit 1, the path (the transistors 51 and 52) for causing the store current Istr to flow to the memory element 33 and the path (the transistors 53 and 54) for causing the reset current Irs to flow to the memory element 33 are separately provided. This makes it possible to determine the sizes of the transistors 51 and 52 in consideration of the current amount of the store current Istr and determine the sizes of the transistors 53 and 54 in consideration of the current amount of the reset current Irs. As described above, in the semiconductor circuit 1, it is possible to set the current value of the store current Istr and the current value of the reset current Irs independently of each other, which makes it possible to relax constraints on circuit design. As a result, in the semiconductor circuit 1, it is possible to reduce the possibility that too much current flows, which makes it possible to reduce the possibility of occurrence of backhopping and to improve reliability and durability of the circuit.

In addition, in the semiconductor circuit 1, unlike the semiconductor circuit 1R according to the comparative example, one memory element 33 is provided in each of the memory cells 30. This makes it possible to reduce the number of elements in the semiconductor circuit 1, which makes it possible to reduce the area of each of the memory cells 30. As a result, it is possible to reduce the area of the entire semiconductor circuit 1.

In addition, in the semiconductor circuit 1, the on-resistance of the transistor 32 is made larger than the on-resistance of the transistor 31. Specifically, at least one of the gate length, the gate width, or the threshold voltage differs between the transistor 31 and the transistor 32. Then, in the restore operation OP4, the current 132 flowing from the node N2 to the control line CTRL via the transistor 32 is made larger than the current 131 flowing from the node N1 to the control line CTRL via the transistor 31 and the memory element 33 in a case where the resistance state of the memory element 33 is the high resistance state RH, and is made smaller than the current 131 flowing from the node N1 to the control line CTRL via the transistor 31 and the memory element 33 in a case where the resistance state of the memory element 33 is the low resistance state RL. This makes it possible to achieve the restore operation OP4 with use of one memory element 33 in the semiconductor circuit 1.

Layout Example

FIG. 12 illustrates an example of a layout of the memory cell 30 according to the present embodiment. In this example, the transistors 41 to 46, 31, and 32 are configured with transistors having a standard threshold voltage (Standard Vth) and the transistors 51 to 54 are configured with transistors having a low threshold voltage (Low Vth or Ultra-low Vth). It is to be noted that, in this example, transistors having Ultra-low Vth are used. The transistors 51 to 54 are configured with transistors having a low threshold voltage in such a manner, which makes it possible to achieve a sufficient store current Istr and a sufficient reset current Irs in a small area. It is to be noted that this is not limitative, and all transistors in the memory cell 30 may be configured with transistors having a standard threshold voltage, or may be configured with transistors having a low threshold voltage. It is possible to configure the memory cell 30 with use of, for example, transistors having the same characteristics (for example, a threshold voltage) as a transistor used in a normal SRAM. In addition, a layout rule used to lay out the normal SRAM is applicable to the layout of the memory cell 30. This makes it possible to enhance the degree of integration or to enhance operation speed.

Effects

As described above, in the present embodiment, the transistors 51 and 52 are provided, and in a case where the store operation is performed, the store current flows to the memory element via these transistors; therefore, the store current does not flow to the SRAM circuit, which makes it possible to reduce the possibility of occurrence of disturbance. In addition, the store current does not flow to the SRAM circuit in this manner, which makes it possible to reduce the sizes of the transistors in the SRAM circuit. This makes it possible to reduce the area of the semiconductor circuit.

In the present embodiment, the drain of the transistor 52 is coupled to the one end of the memory element, which makes it possible to easily secure the current value of the store current in a case where the store operation is performed. Similarly, in the present embodiment, the drain of the transistor 53 is coupled to the one end of the memory element, which makes it possible to easily secure the current value of the reset current in a case where the reset operation is performed.

In the present embodiment, it is possible to easily secure the current value of the store current and the current value of the reset current, which makes it possible to reduce the sizes of the transistors 51 to 54. This makes it possible to reduce the area of the semiconductor circuit.

In the present embodiment, the path for causing the store current to flow to the memory element and the path for causing the reset current to flow to the memory element are separately provided, which makes it possible to reduce the possibility of occurrence of backhopping and to improve reliability and durability of the circuit.

In the present embodiment, one memory element is provided in each of the memory cells, which makes it possible to reduce the area of the semiconductor circuit.

In the present embodiment, the on-resistance of the transistor 32 is made larger than the on-resistance of the transistor 31, which makes it possible to achieve the restore operation with use of one memory element.

Modification Example 1

In the above-described embodiment, the on-resistance of the transistor 32 is made larger than the on-resistance of the transistor 31, and the source of the transistor 32 is coupled to the control line CTRL, but this is not limitative. For example, as in a memory cell 30A illustrated in FIG. 13, the source of the transistor 32 may be grounded.

In addition, for example, as in a semiconductor circuit 1B illustrated in FIGS. 14 and 15, the gate of the transistor 31 and the gate of the transistor 32 may be coupled to two restore control lines RSTRL1 and RSTRL2, respectively. The semiconductor circuit 1B includes a memory circuit 20B. The memory circuit 20B includes a memory cell array 21B and drivers 22B and 23. The memory cell array 21B includes a plurality of restore control lines RSTRL1 and a plurality of restore control lines RSTRL2. The restore control lines RSTRL1 extend in a horizontal direction of FIGS. 14 and 15, and one end of each of the restore control lines RSTRL1 is coupled to the driver 22B. The driver 22B applies a signal SRSTRL1 to each of the restore control lines RSTRL1. The restore control lines RSTRL2 extend in the horizontal direction of FIGS. 14 and 15, and one end of each of the restore control lines RSTRL2 is coupled to the driver 22B. The driver 22B applies a signal SRSTRL2 to each of the restore control lines RSTRL2. In each of memory cells 30B of the memory cell array 21B, the gate of the transistor 31 is coupled to the restore control line RSTRL1, and the gate of the transistor 32 is coupled to the restore control line RSTRL2. The driver 22B respectively applies the signal SRSTRL1 and the signal SRSTRL2 to the restore control line RSTRL1 and the restore control line RSTRL2 on the basis of a control signal supplied from the controller 11. A high level voltage of the signal SRSTRL1 and a voltage of the signal SRSTRL2 are adjustable. For example, a high level voltage of the signal SRSTRL2 is set to a voltage different from and a voltage of the signal SRSTRL1. It is to be noted that, in this example, the transistors 31 and 32 having on-resistances different from each other are provided, but this is not limitative, and the transistors 71 and 72 having on-resistance substantially equal to each other may be provided. In this case, it is desirable that the high level voltage of the signal SRSTRL2 be lower than and the voltage of the signal SRSTRL1.

In addition, for example, as in a memory cell 30C illustrated in FIG. 16, the transistors 71 and 72 having on-resistances substantially equal to each other and a resistor 73 may be provided, and the source of the transistor 72 may be coupled to the control line CTRL via the resistor 73.

In addition, for example, as in a memory cell 30D illustrated in FIG. 17, the transistor 32 may be omitted. The memory cell 30D includes a SRAM circuit 80, the transistor 31, the transistors 51 to 54, and the memory element 33. The SRAM circuit 80 includes transistors 81 to 84, 45, and 46. The transistors 81 to 84 respectively correspond to the transistors 41 to 44 in the above-described embodiment. The transistors 81 and 82 are included in an inverter IV3, and the transistors 83 and 84 are included in an inverter IV4. The SRAM circuit 80 is configured to easily change the voltage VN1 at the node N1 to the high level voltage VH immediately after power is turned on. Specifically, for example, a gate width W83 of the transistor 83 may be wider than a gate width W81 of the transistor 81 (W83>W81), and a gate width W82 of the transistor 82 may be wider than a gate width W84 of the transistor 84 (W82>W84). In addition, a gate length L83 of the transistor 83 in the inverter IV4 may be shorter than a gate length L81 of the transistor 81 in the inverter IV3 (L83<L81), and a gate length L82 of the transistor 82 in the inverter IV3 may be shorter than a gate length L84 of the transistor 84 in the inverter IV4 (L82<L84). Accordingly, as a result, immediately after power is turned on, the inverter IV4 easily outputs a high level, and the inverter IV3 easily outputs a low level. As a result, in the memory cell 30D, in the restore operation OP4, it is possible to make a current flowing from the transistor 83 of the inverter IV4 to the node N1 larger than a current flowing from the node N1 to the control line CTRL in a case where the resistance state of the memory element 33 is the high resistance state RH and smaller than a current flowing from the node N1 to the control line CTRL in a case where the resistance state of the memory element 33 is the low resistance state RL. Accordingly, in the memory cell 30D, in the restore operation OP4, it is possible to change the voltage VN1 at the node N1 to the high level voltage VH in a case where the resistance state of the memory element 33 is the high resistance state RH, and to change the voltage VN1 at the node N1 to the low level voltage VL in a case where the resistance state of the memory element 33 is the low resistance state RL. Here, the inverter IV3 corresponds to a specific example of a "first circuit" in the present disclosure. The inverter IV4 corresponds to a specific example of a "second circuit" in the present disclosure. The transistor 81 corresponds to a specific example of a "seventh transistor" in the present disclosure. The transistor 83 corresponds to a specific example of an "eighth transistor" in the present disclosure. The transistor 84 corresponds to a specific example of a "ninth transistor" in the present disclosure. The transistor 82 corresponds to a specific example of a "tenth transistor" in the present disclosure.

Modification Example 2

In the above-described embodiment, as illustrated in FIG. 3, the driver 22 drives the store control lines STRBL in units of a row, and drives the reset control lines RSL in units of a row, but this is not limitative. Alternatively, for example, as in a semiconductor circuit 1E illustrated in FIG. 18, the store control lines STRBL may be driven in units of a plurality of rows, and the reset control lines RSL may be driven in units of a plurality of rows. The semiconductor circuit 1E includes a memory circuit 20E. The memory circuit 20E includes the memory cell array 21 and drivers 22E and 23. In this example, two store control lines STRBL are coupled to each other, and two reset control lines RSL are coupled to each other. Accordingly, the driver 22E drives the store control lines STRBL in units of two store control lines STRBL, and drives the reset control lines RSL in units of two reset control lines RSL.

Modification Example 3

In the above-described embodiment, as illustrated in FIG. 3, the driver 22 includes the inverter (the transistors 24 and 25) that generates the signal SCTRL, but this is not limitative. Alternatively, for example, each memory cell may include an inverter that generates the signal SCTRL. A semiconductor circuit 1F according to the present modification example is described in detail below. The semiconductor circuit 1F includes a memory circuit 20F. The memory circuit 20F includes a memory cell array 21F and drivers 22F and 23.

FIG. 19 illustrates a configuration example of the memory cell 30B of the memory cell array 21F. FIG. 20 illustrates a configuration example of the memory cell array 21F. The memory cell array 21F includes a plurality of control lines CTRBL. That is, in the memory cell array 21 according to the above-described embodiment includes the plurality of control lines CTRL, but the memory cell array 21F according to the present modification example includes the plurality of control lines CTRBL instead of the plurality of control lines CTRL. The control lines CTRBL extend in a horizontal direction of FIGS. 19 and 20, and one end of each of the control lines CTRBL is coupled to the driver 22F. The driver 22F applies the signal SCTRBL to each of the control lines CTRBL. This signal SCTRBL is an inverted signal of the signal SCTRL according to the above-described embodiment.

A memory cell 30F includes transistors 37 and 38. The transistor 37 is a P-type MOS transistor, and has a gate coupled to the control line CTRBL, a source to be supplied with the power supply voltage VDD, and a drain coupled to a drain of the transistor 38, the other end of the memory element 33, and the source of the transistor 32. The transistor 38 is an N-type MOS transistor, and has a gate coupled to the control line CTRBL, the drain coupled to the drain of the transistor 37, the other end of the memory element 33, and the source of the transistor 32, and a source grounded. The transistors 37 and 38 are included in an inverter. The inverter then generates the signal SCTRL on the basis of the signal SCTRBL, and supplies the signal SCTRL to the other end of the memory element 33 and the source of the transistor 32. Here, the transistor 37 corresponds to a specific example of a "fourteenth transistor" in the present disclosure. The transistor 38 corresponds to a specific example of a "fifteenth transistor" in the present disclosure.

The driver 22F applies the signal SCTRBL to each of the control lines CTRBL on the basis of a control signal supplied from the controller 11.

Modification Example 4

In the above-described embodiment, the control lines CTRL, the restore control lines RSTRL, the store control lines STRBL, and the reset control lines RSL extend in the horizontal direction of FIGS. 2 and 3, but this is not limitative. A semiconductor circuit 1G according to the present modification example is described in detail below. The semiconductor circuit 1G includes a memory circuit 20G. The memory circuit 20G includes a memory cell array 21G and drivers 22G and 23G.

FIG. 21 illustrates a configuration example of a memory cell 30G of the memory cell array 21G. FIG. 22 illustrates a configuration example of the memory cell array 21G. The memory cell array 21G includes a plurality of store control lines STRBL1 and a plurality of reset control lines RSL1. That is, the memory cell array 21 according to the above-described embodiment includes the plurality of store control lines STRBL and the reset control lines RSL, but the memory cell array 21C according to the present modification example includes the plurality of store control lines STRBL1 instead of the plurality of store control lines STRBL, and the plurality of reset control lines RSL1 instead of the plurality of reset control lines RSL. The store control lines STRBL1 extend in a horizontal direction of FIGS. 21 and 22, and one end of each of the store control lines STRBL1 is coupled to the driver 23G. The driver 23G applies the signal SSTRBL to each of the store control lines STRBL1. The reset control lines RSL1 extend in the horizontal direction of FIGS. 21 and 22, and one end of each of the reset control lines RSL1 is coupled to the driver 23G. The driver 23G applies the signal SRSL to each of the reset control lines RSL1.

In the memory cell 30G, the gate of the transistor 51 is coupled to the store control line STRBL1, and the gate of the transistor 54 is coupled to the reset control line RSL1.

The driver 22G respectively applies the signal SCTRL and the signal SRSTRL to each of the control lines CTRL and each of the restore control lines RSTRL on the basis of a control signal supplied from the controller 11. The driver 23G respectively applies the signal SSTRBL and the signal SRSL to each of the store control lines STRBL1 and each of the reset control lines RSL1 on the basis of a control signal supplied from the controller 11.

It is to be noted that, in the semiconductor circuit 1G, the driver 23G drives the store control lines STRBL1 in units of a column and drives the reset control lines RSL1 in units of a column, but this is not limitative. For example, the store control lines STRBL1 may be driven in units of a plurality of columns and the reset control lines RSL1 may be driven in units of a plurality of columns.

Modification Example 5

In the above-described embodiment, as illustrated in FIG. 2, the memory cell 30 includes the transistors 51 and 54, but this is not limitative. Alternatively, for example, the driver 22 may include transistors corresponding to these transistors. A semiconductor circuit 1H according to the present modification example is described in detail below. The semiconductor circuit 1H includes a memory circuit 20H. The memory circuit 20H includes a memory cell array 21H and drivers 22H and 23.

FIG. 23 illustrates a configuration example of a memory cell 30H of the memory cell array 21H. FIG. 24 illustrates a configuration example of the memory cell array 21H. The memory cell array 21H includes a plurality of store control lines STRBL4 and a plurality of reset control lines RSL4. The store control lines STRBL4 extend in a horizontal direction of FIGS. 23 and 24, and one end of each of the store control lines STRBL4 is coupled to the driver 22H. The driver 22H applies a signal SSTRBL4 to each of the store control lines STRBL4. The reset control lines RSL4 extend in the horizontal direction of FIGS. 23 and 24, and one end of each of the reset control lines RSL4 is coupled to the driver 22H. The driver 22H applies a signal SRSL4 to each of the reset control lines RSL4. Here, the store control line STRBL4 corresponds to a specific example of a "first control line" in the present disclosure. The reset control line RSL4 corresponds to a specific example of a "second control line" in the present disclosure.

The memory cell 30H includes the transistors 52 and 53. The source of the transistor 52 is coupled to the store control line STRBL4, and the source of the transistor 53 is coupled to the reset control line RSL4.

The driver 22H respectively applies the signal SCTRL, the signal SRSTRL, the signal SSTRBL4, and the signal SRSL4 to each of the control lines CTRL, each of the restore control lines RSTRL, each of the store control lines STRBL4, and each of the reset control lines RSL4 on the basis of a control signal supplied from the controller 11. As illustrated in FIG. 24, the driver 22H includes the transistors 26 and 27. The transistor 26 is a P-type MOS transistor, and has the gate to be supplied with the signal SSTRBL, the source to be supplied with the power supply voltage VDD, and the drain coupled to the store control line STRBL4. The transistor 26 corresponds to the transistor 51 of the memory cell 30 (FIG. 2) according to the above-described embodiment. The transistor 27 is an N-type MOS transistor, and has the gate to be supplied with the signal SRSL, the drain coupled to the reset control line RSL4, and the source grounded. The transistor 27 corresponds to the transistor 54 of the memory cell 30 (FIG. 2) according to the above-described embodiment.

FIG. 25 illustrates an example of a layout of the memory cell 30H according to the present embodiment. It is possible to reduce the number of transistors in the memory cell 30H in such a manner, as compared with the memory cell 30 (FIGS. 2 and 12) according to the above-described embodiment, which makes it possible to reduce an area of the memory cell 30H.

In the semiconductor circuit 1H, as illustrated in FIG. 24, each of the transistors 26 of the driver 22H drives one store control line STRBL4, and each of the transistors 27 of the driver 22H drives one reset control line RSL4, but this is not limitative. Alternatively, for example, as in a semiconductor circuit 1J illustrated in FIG. 26, each of the transistors 26 of a driver 22J may drive a plurality of (two in this example) store control lines STRBL4, and each of the transistors 27 of the driver 22J may drive a plurality of (two in this example) reset control lines RSL4.

In the semiconductor circuit 1H according to the present modification example, the control lines CTRL, the restore control lines RSTRL, the store control lines STRBL4, and the reset control line RSL4 extend in the horizontal direction of FIGS. 23 and 24, but this is not limitative. Alternatively, for example, store control lines and reset control lines may extend in the vertical direction. A semiconductor circuit 1K according to the present modification example is described in detail below. The semiconductor circuit 1K includes a memory circuit 20K. The memory circuit 20K includes a memory cell array 21K and drivers 22K and 23K.

FIG. 27 illustrates a configuration example of the memory cell 30H of the memory cell array 21K. FIG. 28 illustrates a configuration example of the memory cell array 21K. The memory cell array 21K includes a plurality of store control lines STRBL5 and a plurality of reset control lines RSL5. That is, the memory cell array 21 according to the above-described embodiment includes the plurality of store control lines STRBL and the reset control line RSL, but the memory cell array 21H according to the present modification example include a plurality of store control lines STRBL5 instead of the plurality of store control lines STRBL, and the plurality of reset control lines RSL5 instead of the plurality of reset control lines RSL. The store control lines STRBL5 extend in the vertical direction of FIGS. 27 and 28, and one end of each of the store control lines STRBL5 is coupled to the driver 23K. The driver 23K applies a signal SSTRBL5 to each of the store control lines STRBL5. The reset control lines RSL5 extend in the vertical direction of FIGS. 27 and 28, and one end of each of the reset control lines RSL5 is coupled to the driver 23K. The driver 23K applies a signal SRSL5 to each of the reset control lines RSL5.

In a memory cell 30K, the source of the transistor 52 is coupled to the store control line STRBL5, and the source of the transistor 53 is coupled to the reset control line RSL5.

The driver 22K respectively applies the signal SCTRL and the signal SRSTRL to each of the control lines CTRL and each of the restore control lines RSTRL on the basis of a control signal supplied from the controller 11.

The driver 23K respectively applies the signal SSTRBL5 and the signal SRSL5 to each of the store control lines STRBL5 and each of the reset control lines RSL5 on the basis of a control signal supplied from the controller 11. As illustrated in FIG. 28, the driver 23K includes transistors 28 and 29. The transistor 28 is a P-type MOS transistor, and has a gate to be supplied with the signal SSTRBL, a source to be supplied with the power supply voltage VDD, and a drain coupled to the store control line STRBL5. The transistor 29 is an N-type MOS transistor, and has a gate to be supplied with the signal SRSL, a drain coupled to the reset control line RSL5, and a source grounded.

In addition, for example, one of the store control lines and the reset control lines may extend in the horizontal direction, and the other may extend in the vertical direction. A semiconductor circuit 1L according to the present modification example is described in detail below. The semiconductor circuit 1L includes a memory circuit 20L. The memory circuit 20L includes a memory cell array 21L and drivers 22L and 23L.

FIG. 29 illustrates a configuration example of a memory cell 30L of the memory cell array 21L. FIG. 30 illustrates a configuration example of the memory cell array 21L. The memory cell array 21L includes the plurality of store control lines STRBL5 and the plurality of reset control lines RSL4. The store control lines STRBL5 extend in a vertical direction of FIGS. 29 and 30, and one end of each of the store control lines STRBL5 is coupled to the driver 23L. The driver 23L applies the signal SSTRBL5 to each of the store control lines STRBL5. The reset control lines RSL4 extend in a horizontal direction of FIGS. 29 and 30, and one end of each of the reset control lines RSL4 is coupled to the driver 22L. The driver 22L applies the signal SRSL4 to each of the reset control lines RSL4.

In the memory cell 30L, the source of the transistor 52 is coupled to the store control line STRBL5, and the source of the transistor 53 is coupled to the reset control line RSL4.

The driver 22L respectively applies the signal SCTRL, the signal SRSTRL, and the signal SRSL4 to each of the control lines CTRL, each of the restore control lines RSTRL, and each of the reset control lines RSL4 on the basis of a control signal supplied from the controller 11. As illustrated in FIG. 30, the driver 22L includes the transistor 27. The transistor 27 is an N-type MOS transistor, and has the gate to be supplied with the signal SRSL, the drain coupled to the reset control line RSL4, and the source grounded.

The driver 23L applies the signal SSTRBL5 to each of the store control lines STRBL5 on the basis of a control signal supplied from controller 11. As illustrated in FIG. 30, the driver 23L includes the transistor 28. The transistor 28 is a P-type MOS transistor, and has the gate to be supplied with the signal SSTRBL, the source to be supplied with the power supply voltage VDD, and the drain coupled to the store control line STRBL5.

Modification Example 6

In the above-described embodiment, the resistance state of the memory element 33 is set to the low resistance state RL by the reset operation OP5, but this is not limitative. Alternatively, the resistance state of the memory element 33 may be set to the high resistance state RH. A semiconductor circuit 1M according to the present modification example is described in detail below. The semiconductor circuit 1M includes a memory circuit 20M. The memory circuit 20M includes a memory cell array 21M and drivers 22M and 23.

FIG. 31 illustrates a configuration example of a memory cell 30M of the memory cell array 21M. The memory cell array 21M includes a plurality of store control lines STRL and a plurality of reset control lines RSBL. The store control lines STRL extend in a horizontal direction of FIG. 31, and one end of each of the store control lines STRL is coupled to the driver 22M. The driver 22M applies a signal SSTRL to each of the store control lines STRL. The reset control lines RSBL extend in the horizontal direction of FIG. 31, and one end of each of the reset control lines RSBL is coupled to the driver 22M. The driver 22M applies a signal SRSBL to each of the reset control lines RSBL.

The memory cell 30M includes transistors 61 to 64. The transistors 61 to 64 respectively correspond to the transistor 54 to 51. The transistors 61 and 62 are N-type MOS transistors, and the transistors 63 and 64 are P-type MOS transistors. The transistor 61 has a gate coupled to the store control line STRL, a source grounded, and a drain coupled to a source of the transistor 62. The transistor 62 has a gate coupled to the node N2, the source coupled to the drain of the transistor 61, and a drain coupled to a drain of the transistor 63, the source of the transistor 31, and the one end of the memory element 33. The transistor 63 has a gate coupled to the node N1, the drain coupled to the drain of the transistor 62, the source of the transistor 31, and the one end of the memory element 33, and a source coupled to a drain of the transistor 64. The transistor 64 has a gate coupled to the reset control line RSBL, the drain coupled to the source of the transistor 63, and a source to be supplied with the power supply voltage VDD.

The driver 22M respectively applies the signal SSTRL and the signal SRSBL to each of the store control lines STRL and each of the reset control lines RSBL on the basis of a control signal supplied from the controller 11.

FIG. 32 illustrates an operation example of a certain memory cell 30M of interest in the semiconductor circuit 1M. FIGS. 33, 34A, 34B, 35A and 35B each illustrate an operation state of the memory cell 30M. FIG. 33 illustrates a state in the normal operation OP1. FIGS. 34A and 34B each illustrate a state in a case where the voltage VN1 at the node N1 is the high level voltage VH (VN1=VH). FIG. 34A illustrates a state in the store operation OP2, and FIG. 34B illustrates a state in the reset operation OP5. FIGS. 35A and 35B each illustrate a state in a case where the voltage VN1 at the node N1 is the low level voltage VL (VN1=VL). FIG. 35A illustrates a state in the store operation OP2, and FIG. 35B illustrates a state in the reset operation OP5.

In the normal operation OP1, as illustrated in FIG. 32, the controller 11 sets the voltage of the power supply control signal SPG to the low level. This turns on the power supply transistor 12 (FIG. 1), and the power supply voltage VDD is supplied to the memory circuit 20M. The driver 22M then sets the voltage of the signal SRSTRL to the low level as illustrated in FIG. 32. This turns off each of the transistors 31 and 32 as illustrated in FIG. 33. In addition, as illustrated in FIG. 32, the driver 22M sets a voltage of the signal SSTRL to the low level and sets a voltage of the signal SRSBL to the high level. This turns off each of the transistors 61 and 64 as illustrated in FIG. 33. In addition, the driver 22M sets the voltage of the signal SCTRL to the low level voltage VL (ground level) as illustrated in FIG. 32.

In this normal operation OP1, the semiconductor circuit 1M writes information to the SRAM circuit 40 of the memory cell 30M or reads information from the SRAM circuit 40. The resistance state of the memory element 33 is maintained in a predetermined resistance state (the high resistance state RH in this example).

In the store operation OP2, the driver 22M sets the voltage of the signal SSTRL to the high level as illustrated in FIG. 32. This turns on the transistor 61 as illustrated in FIGS. 34A and 35A. The driver 22M then sets the voltage of the signal SCTRL to the high level voltage VH (power supply voltage level) as illustrated in FIG. 32. Thus, the resistance state of the memory element 33 is set in accordance with information stored in the SRAM circuit 40.

Specifically, for example, as illustrated in FIG. 34A, in a case where the voltage VN1 at the node N1 is the high level voltage VH (VN1=VH), the voltage VN2 at the node N2 is the low level voltage VL (VN2=VL); therefore, the transistors 62 and 63 are off. Accordingly, in the memory cell 30M, a store current does not flow as illustrated in FIG. 34A. This causes the resistance state of the memory element 33 to be maintained in the high resistance state RH.

In addition, for example, as illustrated in FIG. 35A, in a case where the voltage VN1 at the node N1 is the low level voltage VL (VN1=VL), the voltage VN2 at the node N2 is the high level voltage VH (VN2=VH); therefore, the transistors 62 and 63 are on. Accordingly, in the memory cell 30, as illustrated in FIG. 35A, the store current Istr flows in order of the transistor 24, the memory element 33, the transistor 62, and the transistor 61. At this time, in the memory element 33, the store current Istr flows from the free layer F to the pinned layer P, which causes the resistance state of the memory element 33 to be set to the low resistance state RL.

The standby operation OP3 and the restore operation OP4 are similar to those in the above-described embodiment (FIGS. 6B, 6C, 7B, and 7C).

In the reset operation OP5, the driver 22M sets the voltage of the signal SRSBL to the low level as illustrated in FIG. 32. This turns on the transistor 64 as illustrated in FIGS. 34B and 35B. In addition, the driver 22M sets the voltage of the signal SCTRL to the low level voltage VL (ground level) as illustrated in FIG. 32. This causes the resistance state of the memory element 33 to be set (reset) to a predetermined resistance state (the high resistance state RH in this example).

Specifically, for example, as illustrated in FIG. 34B, in a case where the voltage VN1 at the node N1 is the high level voltage VH and the voltage VN2 at the node N2 is the low level voltage VL immediately after the restore operation OP4, the transistors 62 and 63 are off. Accordingly, in the memory cell 30M, a reset current does not flow as illustrated in FIG. 34B. This causes the resistance state of the memory element 33 to be maintained in the high resistance state RH.

In addition, for example, as illustrated in FIG. 35B, in a case where the voltage VN1 at the node N1 is the low level voltage VL and the voltage VN2 at the node N2 is the high level voltage VH immediately after the restore operation OP4, the transistors 62 and 63 are on. Accordingly, in the memory cell 30M, as illustrated in FIG. 35B, the reset current Irs flows in order of the transistor 64, the transistor 63, the memory element 33, and the transistor 25. At this time, in the memory element 33, the reset current Irs flows from the pinned layer P to the free layer F, which causes the resistance state of the memory element 33 to be set to the high resistance state RH.

As described above, the resistance state of the memory element 33 is set to the high resistance state RH by the reset operation OP5. Thereafter, the semiconductor circuit 1M performs the normal operation OP1 (FIG. 33).

Modification Example 7

In the above-described embodiment, as illustrated in FIG. 2, the memory element 33 includes the pinned layer P coupled to the source of the transistor 31 and the drains of the transistors 52 and 53, and the free layer F coupled to the control line CTRL, but this is not limitative. A semiconductor circuit 1N according to the present modification example is described in detail below. The semiconductor circuit 1N includes a memory circuit 20N. The memory circuit 20N includes a memory cell array 21N and the drivers 22 and 23.

FIG. 36 illustrates a configuration example of a memory cell 30N of the memory cell array 21N. The memory cell 30N includes a memory element 33N. The memory element 33N has the free layer Fs coupled to the source of the transistor 31 and the drains of the transistors 52 and 53, and the pinned layer P coupled to the control line CTRL. The gate of the transistor 52 is coupled to the node N1, and the gate of the transistor 53 is coupled to the node N2. That is, in the memory cell 30N according to the present modification example differs from the memory cell 30 (FIG. 2) according to the above-described embodiment in that the orientation of the memory element 33 is changed and coupling of the gates of the transistors 52 and 53 is changed.

FIGS. 37, 38A, 38B, 39A, and 39B each illustrate an operation state of the memory cell 30N. FIG. 37 illustrates a state in the normal operation OP1. FIGS. 38A and 38B each illustrate a state in a case where the voltage VN1 at the node N1 is the high level voltage VH (VN1=VH). FIG. 38A illustrates a state in the store operation OP2, and FIG. 38B illustrates a state in the reset operation OP5. FIGS. 39A and 39B each illustrate a state in a case where the voltage VN1 at the node N1 is the low level voltage VL (VN1=VL). FIG. 39A illustrates a state in the store operation OP2, and FIG. 39B illustrates a state in the reset operation OP5.

In the normal operation OP1, as illustrated in FIG. 4, the controller 11 sets the voltage of the power supply control signal SPG to the low level. This turns on the power supply transistor 12 (FIG. 1), and the power supply voltage VDD is supplied to the memory circuit 20N. The driver 22 then sets the voltage of the signal SRSTRL to the low level as illustrated in FIG. 4. This turns off each of the transistors 31 and 32 as illustrated in FIG. 37. In addition, as illustrated in FIG. 4, the driver 22 sets the voltage of the signal SSTRBL to the high level and sets the voltage of the signal SRSL to the low level. This turns off each of the transistors 51 and 54 as illustrated in FIG. 37. In addition, the driver 22 sets the voltage of the signal SCTRL to the low level voltage VL (ground level) as illustrated in FIG. 4.

In this normal operation OP1, the semiconductor circuit 1N writes information to the SRAM circuit 40 of the memory cell 30N or reads information from the SRAM circuit 40. The resistance state of the memory element 33N is maintained in a predetermined resistance state (the high resistance state RH in this example).

In the store operation OP2, the driver 22 sets the voltage of the signal SSTRBL to the low level as illustrated in FIG. 4. This turns on the transistor 51 as illustrated in FIGS. 37A and 38A. The driver 22 then sets the voltage of the signal SCTRL to the low level voltage VL (ground level) as illustrated in FIG. 4. Thus, the resistance state of the memory element 33N is set in accordance with information stored in the SRAM circuit 40.

Specifically, for example, as illustrated in FIG. 38A, in a case where the voltage VN1 at the node N1 is the high level voltage VH (VN1=VH), the voltage VN2 at the node N2 is the low level voltage VL (VN2=VL); therefore, the transistors 52 and 53 are off. Accordingly, in the memory cell 30N, a store current does not flow as illustrated in FIG. 38A. This causes the resistance state of the memory element 33N to be maintained in the high resistance state RH.

In addition, for example, as illustrated in FIG. 39A, in a case where the voltage VN1 at the node N1 is the low level voltage VL (VN1=VL), the voltage VN2 at the node N2 is the high level voltage VH (VN2=VH); therefore, the transistors 52 and 53 are on. Accordingly, in the memory cell 30N, as illustrated in FIG. 39A, the store current Istr flows in order of the transistor 51, the transistor 52, the memory element 33N, and the transistor 25. At this time, in the memory element 33N, the store current Istr flows from the free layer F to the pinned layer P, which causes the resistance state of the memory element 33N to be set to the low resistance state RL.

The standby operation OP3 and the restore operation OP4 are similar to those in the above-described embodiment (FIGS. 6B, 6C, 7B, and 7C).

In the reset operation OP5, the driver 22 sets the voltage of the signal SRSL to the high level as illustrated in FIG. 4. This turns on the transistor 54 as illustrated in FIGS. 38B and 39B. In addition, the driver 22 sets the voltage of the signal SCTRL to the high level voltage VH (power supply voltage level) as illustrated in FIG. 4. This causes the resistance state of the memory element 33N to be set (reset) to a predetermined resistance state (high resistance state RH in this example).

Specifically, for example, as illustrated in FIG. 38B, in a case where the voltage VN1 at the node N1 is the high level voltage VH and the voltage VN2 at the node N2 is the low level voltage VL immediately after the restore operation OP4, the transistor 52 and 53 are off. Accordingly, in the memory cell 30N, a reset current does not flow as illustrated in FIG. 38B. This causes the resistance state of the memory element 33N to be maintained in the high resistance state RH.

In addition, for example, as illustrated in FIG. 39B, in a case where the voltage VN1 at the node N1 is the low level voltage VL and the voltage VN2 at the node N2 is the high level voltage VH immediately after the restore operation OP4, the transistors 52 and 53 are on. Accordingly, in the memory cell 30N, as illustrated in FIG. 39B, the reset current Irs flows in order of the transistor 24, the memory element 33N, the transistor 53, and the transistor 54. At this time, in the memory element 33N, the reset current Irs flows from the pinned layer P to the free layer F, which causes the resistance state of the memory element 33N to be set to the high resistance state RH.

As described above, the resistance state of the memory element 33N is set to the high resistance state RH by the reset operation OP5. Thereafter, the semiconductor circuit 1N performs the normal operation OP1 (FIG. 37).

In the semiconductor circuit 1N, the resistance state of the memory element 33N is set to the high resistance state RH by the reset operation OP5, but this is not limitative. Alternatively, the resistance state of the memory element 33N may be set to the low resistance state RL. A semiconductor circuit 1P according to the present modification example is described in detail below. The semiconductor circuit 1P includes a memory circuit 20P. The memory circuit 20P includes a memory cell array 21P and drivers 22M and 23.

FIG. 40 illustrates a configuration example of a memory cell 30P of the memory cell array 21P. The memory cell array 21P includes the plurality of store control lines STRL, the plurality of reset control lines RSBL, the transistors 61 to 64, and the memory element 33N. The gate of the transistor 62 is coupled to the node N1, and the gate of the transistor 63 is coupled to the node N2.

FIGS. 41, 42A, 42B, 43A, and 43B each illustrate an operation state of the memory cell 30P. FIG. 41 illustrates a state in the normal operation OP1. FIGS. 42A and 42B each illustrate a state in a case where the voltage VN1 at the node N1 is the high level voltage VH (VN1=VH). FIG. 42A illustrates a state in the store operation OP2, and FIG. 42B illustrates a state in the reset operation OP5. FIGS. 43A and 43B each illustrate a state in a case where the voltage VN1 at the node N1 is the low level voltage VL (VN1=VL). FIG. 43A illustrates a state in the store operation OP2, and FIG. 43B illustrates a state in the reset operation OP5.

In the normal operation OP1, as illustrated in FIG. 32, the controller 11 sets the voltage of the power supply control signal SPG to the low level. This turns on the power supply transistor 12 (FIG. 1), and the power supply voltage VDD is supplied to the memory circuit 20P. The driver 22M then sets the voltage of the signal SRSTRL to the low level as illustrated in FIG. 32. This turns off each of the transistors 31 and 32 as illustrated in FIG. 41. In addition, as illustrated in FIG. 32, the driver 22M sets the voltage of the signal SSTRL to the low level and sets the voltage of the signal SRSBL to the high level. This turns off each of the transistors 61 and 64 as illustrated in FIG. 41. In addition, the driver 22M sets the voltage of the signal SCTRL to the low level voltage VL (ground level) as illustrated in FIG. 32.

In this normal operation OP1, the semiconductor circuit 1P writes information to the SRAM circuit 40 of the memory cell 30P or reads information from the SRAM circuit 40. The resistance state of the memory element 33N is maintained in a predetermined resistance state (the low resistance state RL in this example).

In the store operation OP2, the driver 22M sets the voltage of the signal SSTRL to the high level as illustrated in FIG. 32. This turns on the transistor 61 as illustrated in FIGS. 42A and 43A. The driver 22M then sets the voltage of the signal SCTRL to the high level voltage VH (the power supply voltage level) as illustrated in FIG. 32. Thus, the resistance state of the memory element 33N is set in accordance with information stored in the SRAM circuit 40.

Specifically, for example, as illustrated in FIG. 42A, in a case where the voltage VN1 at the node N1 is the high level voltage VH (VN1=VH), the voltage VN2 at the node N2 is the low level voltage VL (VN2=VL); therefore, the transistors 62 and 63 are on. Accordingly, in the memory cell 30P, as illustrated in FIG. 42A, the store current Istr flows in order of the transistor 24, the memory element 33N, the transistor 62, and the transistor 61. At this time, in the memory element 33N, the store current Istr flows from the pinned layer P to the free layer F, which causes the resistance state of the memory element 33N to be set to the high resistance state RH.

In addition, for example, as illustrated in FIG. 43A, in a case where the voltage VN1 at the node N1 is the low level voltage VL (VN1=VL), the voltage VN2 at the node N2 is the high level voltage VH (VN2=VH); therefore, the transistors 62 and 63 are on. Accordingly, in the memory cell 30P, the store current does not flow as illustrated in FIG. 43A. This causes the resistance state of the memory element 33N to be maintained in the low resistance state RL.

The standby operation OP3 and the restore operation OP4 are similar to those in the above-described embodiment (FIGS. 6B, 6C, 7B, and 7C).

In the reset operation OP5, the driver 22M sets the voltage of the signal SRSBL to the low level as illustrated in FIG. 32. This turns on the transistor 64 as illustrated in FIGS. 42B and 43B. In addition, the driver 22M sets the voltage of the signal SCTRL to the low level voltage VL (ground level) as illustrated in FIG. 32. This causes the resistance state of the memory element 33N to be set (reset) to a predetermined resistance state (the low resistance state RL in this example).

Specifically, for example, as illustrated in FIG. 42B, in a case where the voltage VN1 at the node N1 is the high level voltage VH and the voltage VN2 at the node N2 is the low level voltage VL immediately after the restore operation OP4, the transistors 62 and 63 are on. Accordingly, in the memory cell 30P, as illustrated in FIG. 42B, the reset current Irs flows in order of the transistor 64, the transistor 63, the memory element 33N, and the transistor 25. At this time, in the memory element 33N, the reset current Irs flows from the free layer F to the pinned layer P, which causes the resistance state of the memory element 33N to be set to the low resistance state RL.

In addition, for example, as illustrated in FIG. 43B, in a case where the voltage VN1 at the node N1 is the low level voltage VL and the voltage VN2 at the node N2 is the high level voltage VH immediately after the restore operation OP4, the transistors 62 and 63 are off. Accordingly, in the memory cell 30P, the reset current does not flow as illustrated in FIG. 43B. This causes the resistance state of the memory element 33N to be maintained in the low resistance state RL.

As described above, the resistance state of the memory element 33N is set to the high resistance state RH by the reset operation OP5. Thereafter, the semiconductor circuit 1P performs the normal operation OP1 (FIG. 41).

Modification Example 8

In the above-described embodiment, the memory element 33 is configured using the magnetic tunneling junction element, but this is not limitative, and as in a memory cell 30Q illustrated in FIG. 44, it is possible to use any of various memory elements 33Q of which a resistance state is reversibly changed. For example, the memory element 33Q may have a resistance state changed in accordance with the direction of a current flowing between two terminals, or a resistance state changed in accordance with polarity of a voltage applied between the two terminals. The memory element 33Q may be a unipolar element or a bipolar element. Specifically, it is possible to use, for example, any of a variable resistance memory element, a phase-change memory element, a ferroelectric memory element, a carbon nanotube memory element, and the like for the memory element 33Q.

Modification Example 9

In the above-described embodiment, the power supply transistor 12 is configured using the P-type MOS transistor, but this is not limitative. Alternatively, for example, as in a semiconductor circuit 1S illustrated in FIG. 45, a power supply transistor may be configured using an N-type MOS transistor. The semiconductor circuit 1S includes a controller 11S, a power supply transistor 12S, and a memory circuit 20S. The power supply transistor 12S is an N-type MOS transistor in this example, and has a gate to be supplied with a power supply control signal, a drain coupled to the memory circuit 20S, and a source to be supplied with a ground voltage VSS1. With this configuration, in the semiconductor circuit 1S, in a case where the memory circuit 20S is used, the power supply transistor 12S is turned on, and the ground voltage VSS1 is supplied as the ground voltage VSS to the memory circuit 20S. In addition, in the semiconductor circuit 1S, in a case where the memory circuit 20S is not used, the power supply transistor 12S is turned off.

Modification Example 10

In the above-described embodiment, the present technology is applied to the SRAM circuit, but this is not limitative. For example, the present technology may be applied to a flip-flop circuit, for example. The present modification example is described in detail with some examples.

FIG. 46 illustrates a configuration example of a flip-flop circuit 101 according to the present application example. The flip-flop circuit 101 includes a master latch circuit 101M and a slave latch circuit 101S. A technology similar to that in the memory cell 30 (FIG. 2) according to the above-described embodiment is applied to the slave latch circuit 101S. The slave latch circuit 101S includes inverters IV13 and IV14, a transmission gate TG2, a transistor TR2, the transistors 31, 32, and 51 to 54, and the memory element 33. The inverter IV13 corresponds to the inverter IV1 in the above-described embodiment, has an input terminal coupled to a node N14 and an output terminal coupled to a node N15. The inverter IV14 corresponds to the inverter IV2 in the above-described embodiment, and has an input terminal coupled to the node N15 and an output terminal coupled to a node N16. The transmission gate TG2 has one end coupled to the node N16, and another end coupled to the node N14. The transistor TR2 is an N-type MOS transistor in this example, and has a gate to be supplied with the signal SRSTRL, a source coupled to the node N16, and a drain coupled to the node N14. The node N16 corresponds to the node N1 in the above-described embodiment, and the node N15 corresponds to the node N2 in the above-described embodiment. The drain of the transistor 31 is coupled to the node N16, and the drain of the transistor 32 is coupled to the node N15.

It is to be noted that, in the flip-flop circuit 101, the drain of the transistor 31 and the gate of the transistor 53 are coupled to the node N16, but this is not limitative. Alternatively, for example, as in a slave latch circuit 102S of a flip-flop circuit 102 illustrated in FIG. 47, the drain of the transistor 31 and the gate of the transistor 53 may be coupled to the node N14.

FIG. 48 illustrates a configuration example of a flip-flop circuit 103 according to the present application example. The flip-flop circuit 103 includes the master latch circuit 101M and a slave latch circuit 103S. The technology similar to that in the memory cell 30 according to the above-described embodiment is applied to the slave latch circuit 103S. The inverter IV14 corresponds to the inverter IV1 in the above-described embodiment, and has an input terminal coupled to the node N15 and an output terminal coupled to the node N16. The inverter IV13 corresponds to the inverter IV2 in the above-described embodiment, and has an input terminal coupled to the node N14 and an output terminal coupled to the node N15. The node N15 corresponds to the node N1 in the above-described embodiment, and the node N16 corresponds to the node N2 in the above-described embodiment. The drain of the transistor 31 is coupled to the node N15, and the drain of the transistor 32 is coupled to the node N16.

It is to be noted that, in the flip-flop circuit 103, the drain of the transistor 32 and the gate of the transistor 52 are coupled to the node N16, but this is not limitative. Alternatively, for example, as in a slave latch circuit 104S of a flip-flop circuit 104 illustrated in FIG. 49, the drain of the transistor 32 and the gate of the transistor 52 may be coupled to the node N14.

FIG. 50 illustrates a configuration example of a flip-flop circuit 105 according to the present application example. The flip-flop circuit 105 includes a master latch circuit 105M and a slave latch circuit 105S. The technology similar to that in the memory cell 30 according to the above-described embodiment is applied to the master latch circuit 105M. The master latch circuit 105M includes inverters IV11 and IV12, a transmission gate TG1, the transistor TR1, the transistors 31, 32, and 51 to 54, and the memory element 33. The inverter IV11 corresponds to the inverter IV1 in the above-described embodiment, and has an input terminal coupled to a node N11 and an output terminal coupled to a node N12. The inverter IV12 corresponds to the inverter IV2 in the above-described embodiment, and has an input terminal coupled to the node N12 and an output terminal coupled to a node N13. The transmission gate TG1 has one end coupled to the node N13 and another end coupled to the node N11. The transistor TR1 is an N-type MOS transistor in this example, and has the gate to be supplied with the signal SRSTRL, the source coupled to the node N13, and the drain coupled to the node N11. The node N13 corresponds to the node N1 in the above-described embodiment, and the node N12 corresponds to the node N2 in the above-described embodiment. The drain of the transistor 31 is coupled to the node N13, and the drain of the transistor 32 is coupled to the node N12.

It is to be noted that, in the flip-flop circuit 105, the drain of the transistor 31 and the gate of the transistor 53 are coupled to the node N13, but this is not limitative. Alternatively, for example, as in a master latch circuit 106M of a flip-flop circuit 106 illustrated in FIG. 51, the drain of the transistor 31 and the gate of the transistor 53 may be coupled to the node N11.

FIG. 52 illustrates a configuration example of a flip-flop circuit 107 according to the present application example. The flip-flop circuit 107 includes a master latch circuit 107M and the slave latch circuit 105S. The technology similar to that in the memory cell 30 according to the above-described embodiment is applied to the master latch circuit 107M. The inverter IV12 corresponds to the inverter IV1 in the above-described embodiment, and has the input terminal coupled to the node N12 and the output terminal coupled to the node N13. The inverter IV11 corresponds to the inverter IV2 in the above-described embodiment, and has the input terminal coupled to the node N11 and the output terminal coupled to the node N12. The node N12 corresponds to the node N1 in the above-described embodiment, and the node N13 corresponds to the node N2 in the above-described embodiment. The drain of the transistor 31 is coupled to the node N12, and the drain of the transistor 32 is coupled to the node N13.

It is to be noted that, in the flip-flop circuit 107, the drain of the transistor 32 and the gate of the transistor 52 are coupled to the node N13, but this is not limitative. Alternatively, for example, as in a master latch circuit 108M of a flip-flop circuit 108 illustrated in FIG. 53, the drain of the transistor 32 and the gate of the transistor 52 may be coupled to the node N11.

It is to be noted that the technology similar to that in the memory cell 30 (FIG. 2) according to the above-described embodiment is applied to these flip-flop circuits 101 to 108, but this is not limitative, and a technology similar to that in any of various memory cells according to the above-described modification examples is applicable.

Another Modification Example

In addition, two or more of these modification examples may be combined together.

2. Application Example

Next, description is given of an application example of the technology described in the embodiment and the modification examples described above.

FIG. 54 illustrates an example of an information processor 300 according to the present application example. The information processor 300 is a so-called multi-core processor, and includes two processor core sections 310 and 320, a secondary cache memory section 330, and a power supply controller 301. It is to be noted that, in this example, the two processor core sections 310 and 320 are provided, but this is not limitative, and three or more processor core sections may be provided. The information processor 300 may be implemented with a single semiconductor chip, or may be implemented with use of a plurality of semiconductor chips.

The processor core section 310 includes a power supply transistor 311 and a processor core 312. The power supply transistor 311 is a P-type MOS transistor in this example, and has a gate to be supplied with a power supply control signal, a source to be supplied with the power supply voltage VDD1, and a drain coupled to the processor core 312. The processor core 312 includes a flip-flop circuit 313 and a primary cache memory 314. It is possible to use, for example, any of flip-flop circuits 101 to 104 (FIGS. 37, 38A, 38B, 39A, 39B, and 40) for the flip-flop circuit 313. It is possible to use various memory cells described in the above-described embodiment for the primary cache memory 314. The processor core 312 is configured to perform the normal operation OP1, the store operation OP2, the standby operation OP3, the restore operation OP4, and the reset operation OP5 on the basis of a control signal supplied from the power supply controller 301.

The processor core section 320 has a configuration similar to that of the processor core section 310. A power supply transistor 321, a processor core 322, a flip-flop circuit 323, and a primary cache memory 324 of the processor core section 320 respectively correspond to the power supply transistor 311, the processor core 312, the flip-flop circuit 313, and the primary cache memory 314 of the processor core section 310.

The secondary cache memory section 330 includes a power supply transistor 331 and a secondary cache memory 332. The power supply transistor 331 is a P-type MOS transistor in this example, and has a gate to be supplied with the power supply control signal, a source to be supplied with the power supply voltage VDD1, and a drain coupled to the secondary cache memory 332. It is possible to use various memory cells described in the above-described embodiment for the secondary cache memory 332. The secondary cache memory 332 is configured to perform the normal operation OP1, the store operation OP2, the standby operation OP3, the restore operation OP4, and the reset operation OP5 on the basis of a control signal supplied from the power supply controller 301.

The power supply controller 301 determines a processor core section to be operated of the processor core sections 310 and 320 on the basis of a load of processing to be performed by the information processor 300, a method of supplying power to the information processor 300 (for example, whether or not power is supplied from a battery), and the like, and controls operations of the processor core sections 310 and 320 and the secondary cache memory section 330 on the basis of a result of such determination.

Specifically, in a case where the power supply controller 301 operates the processor core section 310 and does not operate the processor core section 320, the power supply controller 301 turns on the power supply transistor 311 of the processor core section 310 and the power supply transistor 331 of the secondary cache memory section 330, and turns off the power supply transistor 321 of the processor core section 320, for example. In addition, for example, in a case where the power supply controller 301 operates the processor core sections 310 and 320, the power supply controller 301 turns on the power supply transistor 311 of the processor core section 310, the power supply transistor 321 of the processor core section 320, and the power supply transistor 331 of the secondary cache memory section 330. In addition, for example, in a case where the power supply controller 301 does not operate the processor core sections 310 and 320, the power supply controller 301 turns off the power supply transistor 311 of the processor core section 310, the power supply transistor 321 of the processor core section 320, and the power supply transistor 331 of the secondary cache memory section 330.

In addition, in a case where it is desired to stop the operation of the processor core section 310, the power supply controller 301 instructs the processor core section 310 to perform the store operation OP2 immediately before turning off the power supply transistor 311 of the processor core section 310, for example. In addition, in a case where it is desired to start the operation of the processor core section 310, the power supply controller 301 instructs the processor core section 310 to perform the restore operation OP4 immediately after turning on the power supply transistor 311 of the processor core section 310, for example. The same applies to the processor core section 320 and the secondary cache memory section 330.

In this information processor 300, each of the processor core sections 310 and 320 and the secondary cache memory section 330 includes the power supply transistor, but this is not limitative. Alternatively, for example, as in an information processor 300A illustrated in FIG. 55, a power supply transistor may be provided in a power supply controller. The information processor 300A includes processor cores 312 and 322, a secondary cache memory 332, and a power supply controller 340. The power supply controller 340 includes power supply transistors 341 to 343. The power supply transistors 341 to 343 are P-type MOS transistors in this example. The power supply transistor 341 has a source to be supplied with the power supply voltage VDD1 and a drain coupled to the processor core 312. The power supply transistor 342 has a source to be supplied with the power supply voltage VDD1 and a drain coupled to the processor core 322. The power supply transistor 343 has a source to be supplied with the power supply voltage VDD1 and a drain coupled to the secondary cache memory 332.

Although the present technology has been described above with reference to the embodiment, some modification examples, and application examples thereof, the present technology is not limited to the embodiment and the like, and may be modified in a variety of ways.

For example, in the embodiment and the like described above, the present technology is applied to the SRAM circuit and a D-type flip-flop circuit, but is not limited thereto. Specifically, for example, the present technology may be applied to another flip-flop circuit, or may be applied to a latch circuit.

It is to be noted that the effects described herein are merely illustrative and are not limitative, and other effects may be included.

It is to be noted that the present technology may have any of the following configurations.

(1)
A semiconductor circuit including:
a first circuit that is configured to generate an inverted voltage of a voltage at a first node and apply the inverted voltage to a second node;
a second circuit that is configured to generate an inverted voltage of a voltage at the second node and apply the inverted voltage to the first node;
a first transistor that is configured to couple the first node to a third node by being turned on;
a first memory element that has a first terminal coupled to the third node and a second terminal to which a control voltage is to be applied, and is allowed to take a first resistance state or a second resistance state;
a second transistor having a source to which a first voltage is to be applied, a drain coupled to the third node, and a gate coupled to a first predetermined node, the first predetermined node being one of the first node and the second node;
a third transistor having a source to which a second voltage is to be applied, a drain coupled to the third node, and a gate coupled to a second predetermined node, the second predetermined node being the other of the first node and the second node; and
a driver that is configured to control an operation of the first transistor and set the control voltage.

(2)
The semiconductor circuit according to (1), further including:
a fourth transistor having a source to which the first voltage is to be applied and a drain coupled to the source of the second transistor; and
a fifth transistor having a source to which the second voltage is to be applied and a drain coupled to the source of the third transistor, in which
the driver is configured to further control operations of the fourth transistor and the fifth transistor.

(3)
The semiconductor circuit according to (2), in which, in a first period, in a first period, the driver is configured to turn off the first transistor and the fifth transistor, turn on the fourth transistor, and set the control voltage to a third voltage.

(4)
The semiconductor circuit according to (3), in which, in a second period after the first period, the driver is configured to turn on the first transistor and turn off the fourth transistor and the fifth transistor.

(5)
The semiconductor circuit according to (4), in which, in a third period before a voltage at the first node is changed after the second period, the driver is configured to turn off the first transistor and the fourth transistor, turn on the fifth transistor, and set the control voltage to a fourth voltage.

(6)
The semiconductor circuit according to (4) or (5), further including a controller that is configured to control power supply to the first circuit and the second circuit and is configured to stop the power supply to the first circuit and the second circuit in a fourth period between the first period and the second period.

(7)
The semiconductor circuit according to any one of (1) to (6), further including a sixth transistor that is configured to couple the second node to a fourth node by being turned on.

(8)
The semiconductor circuit according to (7), in which at least one of a gate length, a gate width, or a threshold voltage differs between the first transistor and the sixth transistor.

(9)
The semiconductor circuit according to (7) or (8), in which the control voltage is applied to the fourth node.

(10)
The semiconductor circuit according to (7) or (8), in which the fourth node is grounded.

The semiconductor circuit according to any one of (7) to (10), in which
the first transistor has a gate to which a first control signal including a fifth voltage is to be applied, the first control signal causing the first transistor to be turned on, and
the sixth transistor has a gate to which a second control signal including a sixth voltage is to be applied, the second control signal causing the sixth transistor to be turned on.

(12)
The semiconductor circuit according to any one of (7) to (11), in which
the driver is configured to turn on the first transistor and the sixth transistor in a second period, and
in the second period, a current flowing from the first circuit to the sixth transistor via the second node after power is turned on falls between a first current value and a second current value, the first current value being for a current flowing from the second circuit to the first transistor via the first node in a case where a resistance state of the first memory element is the first resistance state and the second current value being for a current flowing from the second circuit to the first transistor via the first node in a case where the resistance state of the first memory element is the second resistance state.

(13)
The semiconductor circuit according to any one of (1) to (6), in which the first circuit and the second circuit are configured to easily change the voltage at the first node to a predetermined voltage after power is turned on.

(14)
The semiconductor circuit according to (13), in which the first circuit includes a seventh transistor that is configured to couple a first power supply corresponding to the predetermined voltage and the second node to each other by being turned on, the second circuit includes an eighth transistor that is configured to couple the first power supply and the first node to each other by being turned on, and at least one of a gate length, a gate width, or a threshold voltage differs between the seventh transistor and the eighth transistor.

(15)

The semiconductor circuit according to (13) or (14), in which the second circuit includes a ninth transistor that is configured to couple a second power supply and the first node to each other by being turned on, the second power supply corresponding to a voltage different from the predetermined voltage, the first circuit includes a tenth transistor that is configured to the second power supply and the second node to each other by being turned on, and at least one of a gate length, a gate width, or a threshold voltage differs between the ninth transistor and the tenth transistor.

(16)

The semiconductor circuit according to any one of (13) to (15), in which the second circuit includes an eighth transistor that is configured to couple a first power supply corresponding to the predetermined voltage and the first node to each other by being turned on, the driver is configured to turn on the first transistor in a second period, and in the second period, a current value of a current flowing from the first power supply to the first node via the eighth transistor after power is turned on falls between a first current value and a second current value, the first current value being for a current flowing from the first node to the first memory element via the first transistor in a case where a resistance state of the first memory element is the first resistance state and the second current value being for a current flowing from the first node to the first memory element via the first transistor in a case where the resistance state of the first memory element is the second resistance state.

(17)

The semiconductor circuit according to (1), further including:

a first control line coupled to the source of the second transistor; and a second control line coupled to the source of the third transistor, in which the driver is configured to further drive the first control line and the second control line.

(18)

The semiconductor circuit according to (17), further including:

a third circuit that is configured to generate an inverted voltage of a voltage at a fifth node and apply the inverted voltage to a sixth node;

a fourth circuit that is configured to generate an inverted voltage of a voltage at the sixth node and apply the inverted voltage to the fifth node;

an eleventh transistor that is configured to couple the fifth node to a seventh node by being turned on;

a second memory element that has a first terminal coupled to the seventh node and a second terminal to which the control voltage is to be applied, and is allowed to take the first resistance state or the second resistance state;

a twelfth transistor having a source coupled to the first control line, a drain coupled to the seventh node, and a gate coupled to a third predetermined node, the third predetermined node being one of the fifth node and the sixth node; and a thirteenth transistor having a source coupled to the second control line, a drain coupled to the seventh node, and a gate coupled to a fourth predetermined node, the fourth predetermined node being the other of the fifth node and the sixth node.

(19)

The semiconductor circuit according to any one of (1) to (18), in which the driver is configured to generate the control voltage.

(20)

The semiconductor circuit according to any one of (1) to (18), further including:

a fourteenth transistor having a source to which the first voltage is to be applied and a drain coupled to the second terminal of the first memory element; and a fifteenth transistor having a source to which the second voltage is to be applied and a drain coupled to the second terminal of the first memory element, in which the driver is configured to set the control voltage by controlling operations of the fourteenth transistor and the fifteenth transistor.

(21)

The semiconductor circuit according to any one of (1) to (20), further including a power supply transistor that is configured to supply power to the first circuit and the second circuit by being turned on.

(22)

The semiconductor circuit according to any one of (1) to (21), in which the first memory element is configured to store information with use of a resistance state reversibly changed in accordance with a direction of a current flowing between the first terminal and the second terminal.

(23)

The semiconductor circuit according to any one of (1) to (22), in which the first memory element includes a unipolar or bipolar element.

(24)

The semiconductor circuit according to any one of (1) to (23), in which the first memory element includes one of a magnetic tunneling junction memory element, a variable resistance memory element, a phase-change memory element, a ferroelectric memory element, and a nanotube memory element.

(25)

The semiconductor circuit according to any one of (1) to (21), in which the first memory element is configured to store information with use of a resistance state reversibly changed in accordance with polarity of a voltage applied between the first terminal and the second terminal.

(26)

The semiconductor circuit according to any one of (1) to (25), in which the first circuit and the second circuit are included in an SRAM circuit.

(27)

The semiconductor circuit according to any one of (1) to (25), in which the first circuit and the second circuit are included in a latch circuit.

(28)

A semiconductor circuit system including:

a memory section; and a controller that control power supply to the memory section, the memory section including a first circuit that is configured to generate an inverted voltage of a voltage at a first node and apply the inverted voltage to a second node, a second circuit that is configured to generate an inverted voltage of a voltage at the second node and apply the inverted voltage to the first node, a first transistor that is configured to couple the first node to a third node by being turned on, a first memory element that has a first terminal coupled to the third node and a second terminal to which a control voltage is to be applied, and is allowed to take a first resistance state or a second resistance state, a second transistor having a source to which a first voltage is to be applied, a drain coupled to the third node, and a gate coupled to a first predetermined node, the first predetermined node being one of the first node and the second node, a third transistor having a source to which a second voltage is to be applied, a drain coupled to the third node, and a gate coupled to a second predetermined node, the second predetermined node being the other of the first node and the second node, and a driver that is configured to control an operation of the first transistor and set the control voltage.

This application claims the benefit of Japanese Priority Patent Application JP2017-237980 filed with the Japan Patent Office on Dec. 12, 2017, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A semiconductor circuit, comprising:
a first circuit configured to:
generate a first inverted voltage of a first voltage at a first node; and
apply the first inverted voltage to a second node;
a second circuit configured to:
generate a second inverted voltage of a second voltage at the second node; and
apply the second inverted voltage to the first node;
a first transistor configured to couple the first node to a third node by turn on of the first transistor;
a first memory element that includes a pinned layer and a free layer, wherein
a first terminal of the first memory element corresponds to the pinned layer,
the pinned layer includes a first ferromagnetic material having a magnetization direction fixed to a specific direction,
the free layer includes a second ferromagnetic material having a changeable magnetization direction,
the pinned layer of the first memory element has a first end and a second end opposite to the first end,
the first end of the pinned layer is coupled to a source of the first transistor,
the second end of the pinned layer is electrically connected to the free layer,
a control voltage is applied to a second terminal of the first memory element, and
the first memory element is in one of a first resistance state or a second resistance state;
a second transistor, wherein a third voltage is applied to a source of the second transistor,
a drain of the second transistor is coupled to the third node,
a gate of the second transistor is coupled to a first specific node, and
the first specific node is one of the first node or the second node;
a third transistor, wherein
a fourth voltage is applied to a source of the third transistor,
a drain of the third transistor is coupled to the third node,
a gate of the third transistor is coupled to a second specific node, and
the second specific node is other of the one of the first node or the second node; and
a driver configured to control an operation of the first transistor and set the control voltage.

2. The semiconductor circuit according to claim 1, further comprising:
a fourth transistor, wherein
the third voltage is applied to a source of the fourth transistor, and
a drain of the fourth transistor is coupled to the source of the second transistor; and
a fifth transistor, wherein
the fourth voltage is applied to a source of the fifth transistor,
a drain of the fifth transistor is coupled to the source of the third transistor, and
the driver is further configured to control operations of the fourth transistor and the fifth transistor.

3. The semiconductor circuit according to claim 2, wherein, in a first period, the driver is further configured to:
turn off the first transistor and the fifth transistor;
turn on the fourth transistor; and
set the control voltage to a fifth voltage.

4. The semiconductor circuit according to claim 3, wherein, in a second period after the first period, the driver is further configured to:
turn on the first transistor; and
turn off the fourth transistor and the fifth transistor.

5. The semiconductor circuit according to claim 4, wherein,
in a third period, the driver is further configured to:
turn off the first transistor and the fourth transistor;
turn on the fifth transistor; and
set the control voltage to a sixth voltage, and
the third period is after the second period and before a change of the first voltage at the first node.

6. The semiconductor circuit according to claim 4, further comprising a controller configured to:
control a power supply to the first circuit and the second circuit; and
stop the power supply to the first circuit and the second circuit in a fourth period between the first period and the second period.

7. The semiconductor circuit according to claim 1, further comprising a sixth transistor configured to couple the second node to a fourth node by turn on of the sixth transistor.

8. The semiconductor circuit according to claim 7, wherein at least one of a gate length, a gate width, or a threshold voltage differs between the first transistor and the sixth transistor.

9. The semiconductor circuit according to claim 7, wherein the control voltage is further applied to the fourth node.

10. The semiconductor circuit according to claim 7, wherein the fourth node is grounded.

11. The semiconductor circuit according to claim 7, wherein
a first control signal is applied to a gate of the first transistor,
the first control signal includes a fifth voltage,
the first transistor is configured to be turned on based on the first control signal,
a second control signal is applied to a gate of the sixth transistor,
the second control signal includes a sixth voltage, and
the sixth transistor is configured to be turned on based on the second control signal.

12. The semiconductor circuit according to claim 7, wherein
the driver is further configured to turn on the first transistor and the sixth transistor in a specific period,
in the specific period, a first current flows from the first circuit to the sixth transistor via the second node after a power supply to the semiconductor circuit is turned on,
a value of the first current falls between a first current value and a second current value in the specific period,
in a case where the first memory element is in the first resistance state, a second current having the first current value flows from the second circuit to the first transistor via the first node, and
in a case where the first memory element is in the second resistance state, a third current having the second current value flows from the second circuit to the first transistor via the first node.

13. The semiconductor circuit according to claim 1, wherein the first circuit and the second circuit are further configured to change the first voltage at the first node to a first specific voltage after a first power supply to the semiconductor circuit is turned on.

14. The semiconductor circuit according to claim 13, wherein
the first circuit includes a seventh transistor configured to couple the second node to a second power supply, corresponding to the first specific voltage, by turn on of the seventh transistor,
the second circuit includes an eighth transistor configured to couple the second power supply to the first node by turn on of the eighth transistor, and
at least one of a gate length, a gate width, or a threshold voltage differs between the seventh transistor and the eighth transistor.

15. The semiconductor circuit according to claim 13, wherein
the second circuit includes a ninth transistor configured to couple a second power supply to the first node by turn on of the ninth transistor,
the second power supply corresponds to a second specific voltage different from the first specific voltage,
the first circuit includes a tenth transistor configured to couple the second power supply to the second node by turn on of the tenth transistor, and
at least one of a gate length, a gate width, or a threshold voltage differs between the ninth transistor and the tenth transistor.

16. The semiconductor circuit according to claim 13, wherein
the second circuit includes an eighth transistor configured to couple a second power supply to the first node by turn on of the eighth transistor,
the second power supply corresponds to the first specific voltage,
the driver is further configured to turn on the first transistor in a specific period,
in the specific period, a first current flows from the second power supply to the first node via the eighth transistor after the first power supply to the semiconductor circuit is turned on,
a value of the first current falls between a first current value and a second current value in the specific period,
in a case where the first memory element is in the first resistance state, a second current having the first current value flows from the first node to the first memory element via the first transistor, and
in a case where the first memory element is in the second resistance state, a second current having the second current value flows from the first node to the first memory element via the first transistor.

17. The semiconductor circuit according to claim 1, further comprising:
a first control line coupled to the source of the second transistor; and
a second control line coupled to the source of the third transistor,
wherein the driver is further configured to drive the first control line and the second control line.

18. The semiconductor circuit according to claim 17, further comprising:
a third circuit configured to generate a third inverted voltage of a fifth voltage at a fifth node and apply the third inverted voltage to a sixth node;
a fourth circuit configured to generate a fourth inverted voltage of a sixth voltage at the sixth node and apply the fourth inverted voltage to the fifth node;
an eleventh transistor configured to couple the fifth node to a seventh node by turn on of the eleventh transistor;
a second memory element, wherein
a first terminal of the second memory element is coupled to the seventh node,
the control voltage is applied to a second terminal of the second memory element, and
the second memory element is in one of the first resistance state or the second resistance state;
a twelfth transistor, wherein
a source of the twelfth transistor is coupled to the first control line,
a drain of the twelfth transistor is coupled to the seventh node,
a gate of the twelfth transistor is coupled to a third specific node, and
the third specific node is one of the fifth node or the sixth node; and
a thirteenth transistor, wherein
a source of the thirteenth transistor is coupled to the second control line,
a drain of the thirteenth transistor is coupled to the seventh node,
a gate of the thirteenth transistor is coupled to a fourth specific node, and
the fourth specific node is other of the one of the fifth node or the sixth node.

19. The semiconductor circuit according to claim 1, wherein the driver is further configured to generate the control voltage.

20. The semiconductor circuit according to claim 1, further comprising:
a fourteenth transistor, wherein
a fifth voltage is applied to a source of the fourteenth transistor, and
a drain of the fourteenth transistor is coupled to the second terminal of the first memory element; and
a fifteenth transistor, wherein
a sixth voltage is applied to a source of the fifteenth transistor,
a drain of the fifteenth transistor is coupled to the second terminal of the first memory element, and
the driver is further configured to:
control operations of the fourteenth transistor and the fifteenth transistor; and
set the control voltage based on the control of the operations of the fourteenth transistor and the fifteenth transistor.

21. The semiconductor circuit according to claim 1, further comprising a power supply transistor configured to supply a power to the first circuit and the second circuit by turn on of the power supply transistor.

22. The semiconductor circuit according to claim 1, wherein
the first memory element is configured to store information based on a specific resistance state of the first memory element,
the specific resistance state is one of the first resistance state or the second resistance state, and
the specific resistance state is reversibly changed based on a direction of a current that flows between the first terminal and the second terminal.

23. The semiconductor circuit according to claim 1, wherein the first memory element further includes one of a unipolar element or a bipolar element.

24. The semiconductor circuit according to claim 1, wherein the first memory element further includes one of a magnetic tunneling junction memory element, a variable resistance memory element, a phase-change memory element, a ferroelectric memory element, or a nanotube memory element.

25. The semiconductor circuit according to claim 1, wherein
the first memory element is configured to store information based on a specific resistance state of the first memory element,
the specific resistance state is one of the first resistance state or the second resistance state, and
the specific resistance state is reversibly changed based on a polarity of a specific voltage applied between the first terminal and the second terminal.

26. The semiconductor circuit according to claim 1, wherein the first circuit and the second circuit are included in a static random access memory (SRAM) circuit.

27. The semiconductor circuit according to claim 1, wherein the first circuit and the second circuit are included in a latch circuit.

28. The semiconductor circuit according to claim 1, wherein
a plurality of polarized electrons with a spin moment are injected from the pinned layer to the free layer, based on current flow from the free layer to the pinned layer,
the spin moment is in a direction same as the magnetization direction of the pinner layer, and
the spin moment changes the changeable magnetization direction of the free layer to the magnetization direction of the pinned layer.

29. A semiconductor circuit system, comprising:
a memory section; and
a controller configured to control a power supply to the memory section, wherein
the memory section includes:
a first circuit configured to:
generate a first inverted voltage of a first voltage at a first node; and
apply the first inverted voltage to a second node;
a second circuit configured to:
generate a second inverted voltage of a second voltage at the second node; and
apply the second inverted voltage to the first node;
a first transistor configured to couple the first node to a third node by turn on of the first transistor;
a first memory element that includes a pinned layer and a free layer, wherein
a first terminal of the first memory element corresponds to the pinned layer,
the pinned layer includes a first ferromagnetic material having a magnetization direction fixed to a specific direction,
the free layer includes a second ferromagnetic material having a changeable magnetization direction,
the pinned layer of the first memory element has a first end and a second end opposite to the first end,
the first end of the pinned layer is coupled to a source of the first transistor,
the second end of the pinned layer is electrically connected to the free layer, and
a control voltage is applied to a second terminal of the first memory element, and
the first memory element is in one of a first resistance state or a second resistance state;
a second transistor, wherein
a third voltage is applied to a source of the second transistor,
a drain of the second transistor is coupled to the third node,
a gate of the second transistor is coupled to a first specific node, and
the first specific node is one of the first node or the second node;
a third transistor, wherein
a fourth voltage is applied to a source of the third transistor,
a drain of the third transistor is coupled to the third node,
a gate of the third transistor is coupled to a second specific node, and
the second specific node is other of the one of the first node or the second node; and
a driver configured to control an operation of the first transistor and set the control voltage.

30. A semiconductor circuit, comprising:
a first circuit configured to:
generate a first inverted voltage of a first voltage at a first node; and
apply the first inverted voltage to a second node;
a second circuit configured to:
generate a second inverted voltage of a second voltage at the second node; and
apply the second inverted voltage to the first node;
a first transistor configured to couple the first node to a third node by turn on of the first transistor;
a first memory element, wherein a first terminal of the first memory element is coupled to the third node,
a control voltage is applied to a second terminal of the first memory element, and
the first memory element is in one of a first resistance state or a second resistance state;
a second transistor, wherein
a third voltage is applied to a source of the second transistor,
a drain of the second transistor is coupled to the third node,
a gate of the second transistor is coupled to a first specific node, and
the first specific node is one of the first node or the second node;
a third transistor, wherein
a fourth voltage is applied to a source of the third transistor,
a drain of the third transistor is coupled to the third node,
a gate of the third transistor is coupled to a second specific node, and
the second specific node is other of the first node or the second node;
a fourth transistor, wherein
the third voltage is applied to a source of the fourth transistor, and
a drain of the fourth transistor is coupled to the source of the second transistor;
a fifth transistor, wherein
the fourth voltage is applied to a source of the fifth transistor, and
a drain of the fifth transistor is coupled to the source of the third transistor;
a driver, wherein
in a first period, the driver is configured to:
turn off the first transistor and the fifth transistor;
turn on the fourth transistor; and
set the control voltage to a fifth voltage, and
in a second period after the first period, the driver is further configured to:
turn on the first transistor; and
turn off the fourth transistor and the fifth transistor; and
a controller configured to:
control a power supply to the first circuit and the second circuit; and
stop the power supply to the first circuit and the second circuit in a third period between the first period and the second period.

* * * * *